US012283546B2

(12) United States Patent
Peng et al.

(10) Patent No.: US 12,283,546 B2
(45) Date of Patent: *Apr. 22, 2025

(54) INTEGRATED CIRCUIT AND METHOD FOR FORMING THE SAME

(71) Applicant: TAIWAN SEMICONDUCTOR MANUFACTURING COMPANY, LTD., Hsinchu (TW)

(72) Inventors: Shih-Wei Peng, Hsinchu (TW); Wei-Cheng Lin, Hsinchu (TW); Cheng-Chi Chuang, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/304,304

(22) Filed: Apr. 20, 2023

(65) Prior Publication Data

US 2023/0253325 A1    Aug. 10, 2023

Related U.S. Application Data

(63) Continuation of application No. 17/142,016, filed on Jan. 5, 2021, now Pat. No. 11,637,066.
(Continued)

(51) Int. Cl.
*H01L 23/528* (2006.01)
*H01L 21/768* (2006.01)
(Continued)

(52) U.S. Cl.
CPC .... *H01L 23/5286* (2013.01); *H01L 21/76895* (2013.01); *H01L 23/5226* (2013.01);
(Continued)

(58) Field of Classification Search
CPC .......... H01L 23/5286; H01L 21/76895; H01L 23/5226; H01L 29/42392; H01L 29/66742;
(Continued)

(56) References Cited

U.S. PATENT DOCUMENTS 11,637,066 B2 * 4/2023 Peng ..................... H01L 23/481
257/401
2018/0286869 A1 10/2018 Zhang
(Continued)

FOREIGN PATENT DOCUMENTS

DE    102019121697    3/2020
KR    20190015269     2/2019
(Continued)

OTHER PUBLICATIONS

Office Action dated Mar. 2, 2022, for corresponding case No. DE 10 2021 100 118.8 (pp. 1-10).
(Continued)

*Primary Examiner* — Tong-Ho Kim
(74) *Attorney, Agent, or Firm* — Hauptman Ham, LLP

(57) ABSTRACT

An integrated circuit includes a strip structure having a front side and a back side. The integrated circuit includes a gate structure on the front side of the strip structure. The integrated circuit includes an isolation structure surrounding the strip structure. The integrated circuit includes a backside via in the isolation structure. The integrated circuit includes a contact over the strip structure, wherein a first portion of the contact extends into the isolation structure and contacts the backside via. The integrated circuit includes a backside power rail on the back side of the strip structure and in contact with the backside via.

20 Claims, 81 Drawing Sheets

Related U.S. Application Data

(60) Provisional application No. 63/018,091, filed on Apr. 30, 2020.

(51) Int. Cl.
  *H01L 23/522* (2006.01)
  *H01L 29/423* (2006.01)
  *H01L 29/66* (2006.01)
  *H01L 29/786* (2006.01)

(52) U.S. Cl.
  CPC .. *H01L 29/42392* (2013.01); *H01L 29/66742* (2013.01); *H01L 29/78696* (2013.01)

(58) Field of Classification Search
  CPC ......... H01L 29/78696; H01L 21/76897; H01L 21/76898; H01L 23/481; H01L 27/088; H01L 21/823475; H01L 27/0886; H01L 21/823431; H01L 21/823821; H01L 21/823871; H01L 27/0924
  USPC ........................................................ 257/401
  See application file for complete search history.

(56) References Cited

U.S. PATENT DOCUMENTS

| | | | |
|---|---|---|---|
| 2018/0315667 A1* | 11/2018 | Kwon | H01L 29/401 |
| 2020/0091348 A1 | 3/2020 | Guha et al. | |
| 2020/0294860 A1* | 9/2020 | Chang | H01L 21/823468 |
| 2021/0028112 A1* | 1/2021 | Kim | H01L 29/41791 |
| 2021/0098306 A1 | 4/2021 | Smith et al. | |

FOREIGN PATENT DOCUMENTS

| | | |
|---|---|---|
| KR | 20200014235 | 2/2020 |
| TW | 201937606 | 9/2019 |

OTHER PUBLICATIONS

Notice of Allowance dated Dec. 20, 2022 from corresponding application No. KR 10-2021-0028849.

Office Action dated Oct. 20, 2021 from corresponding application No. TW 11021019260 (pp. 1-4).

\* cited by examiner

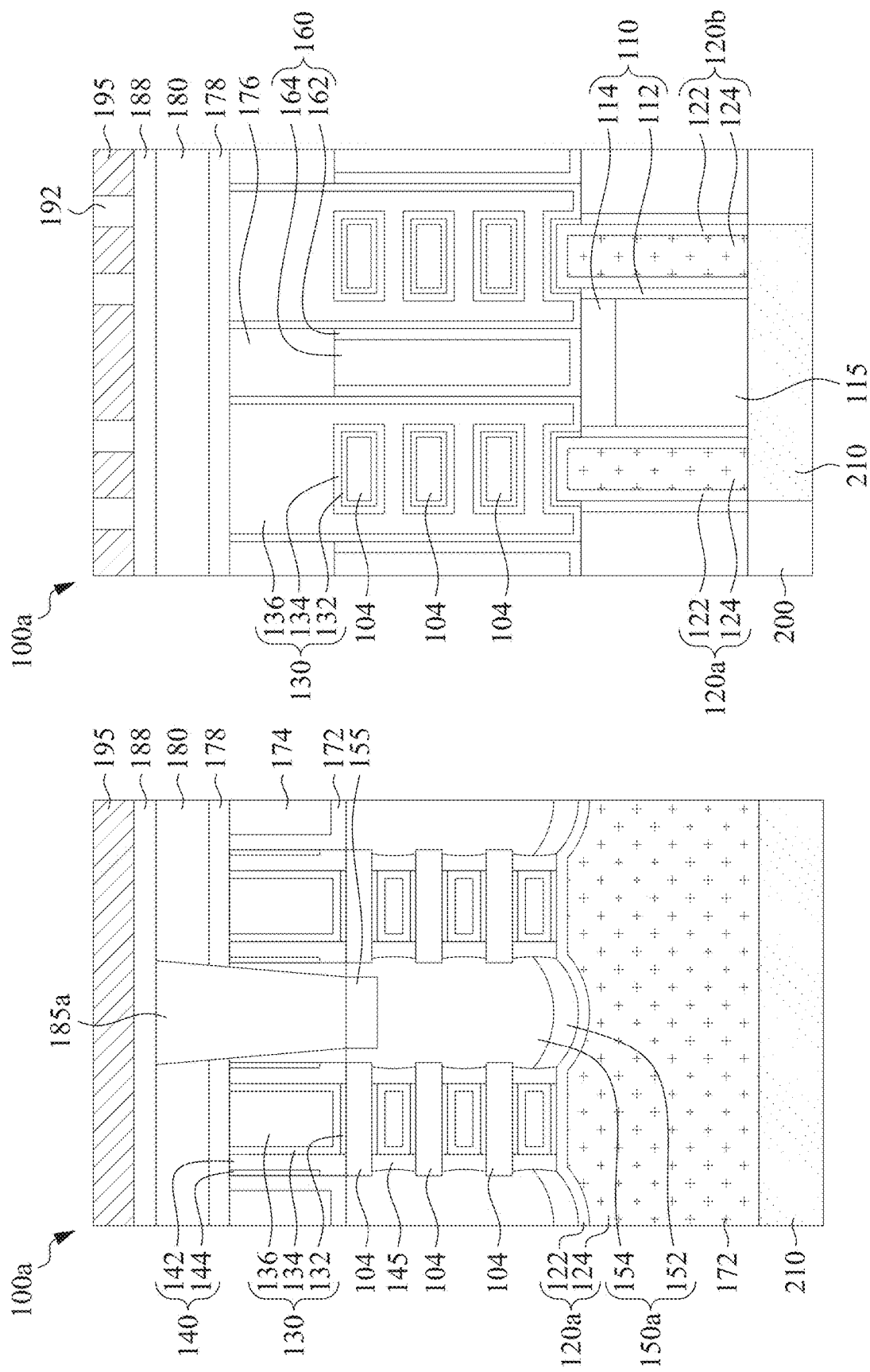

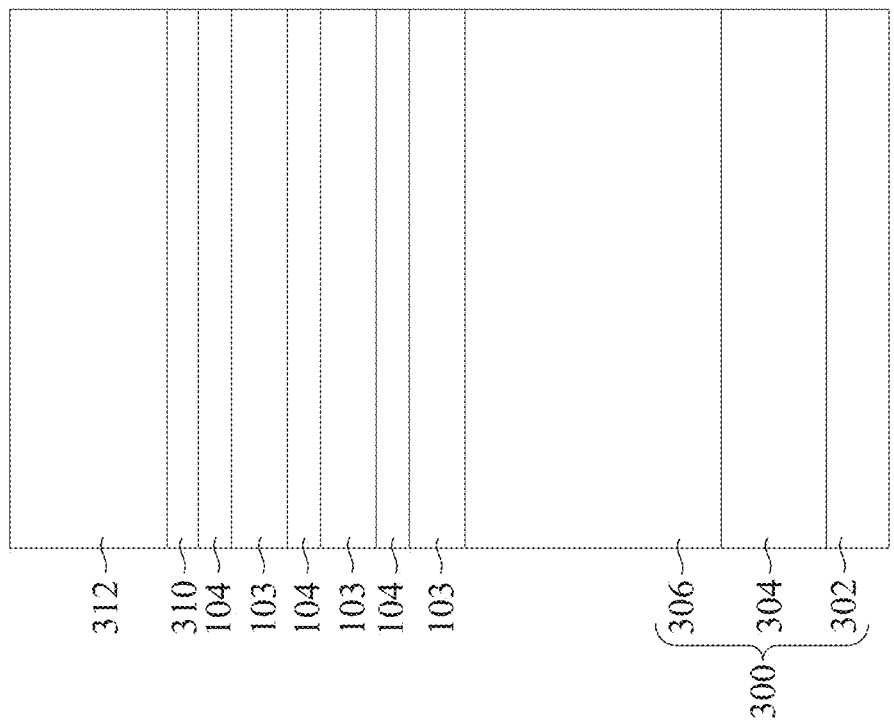

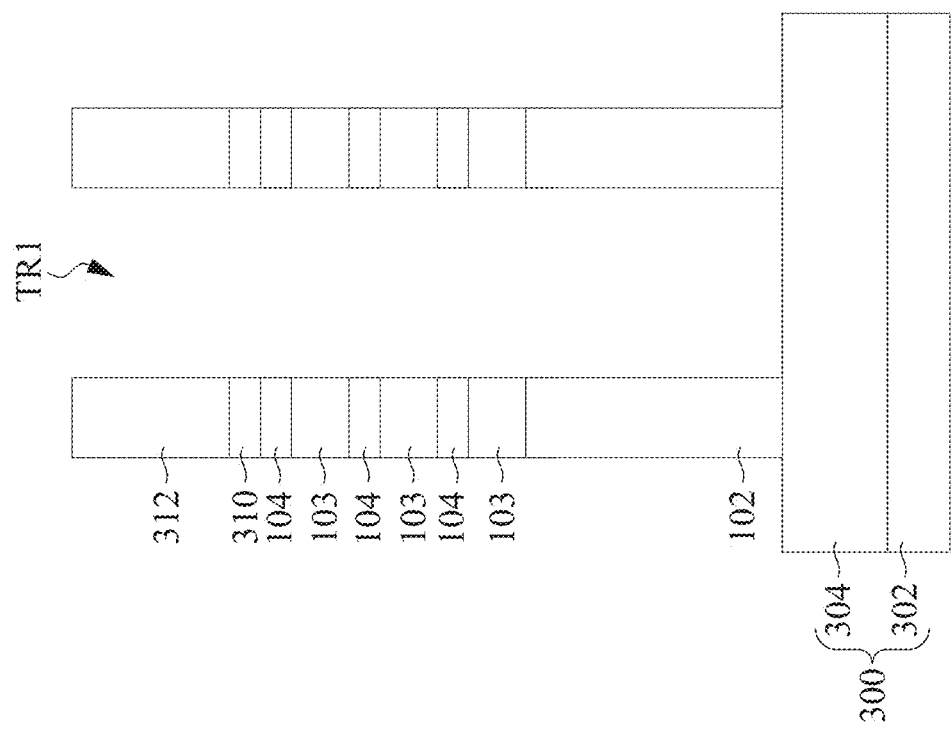

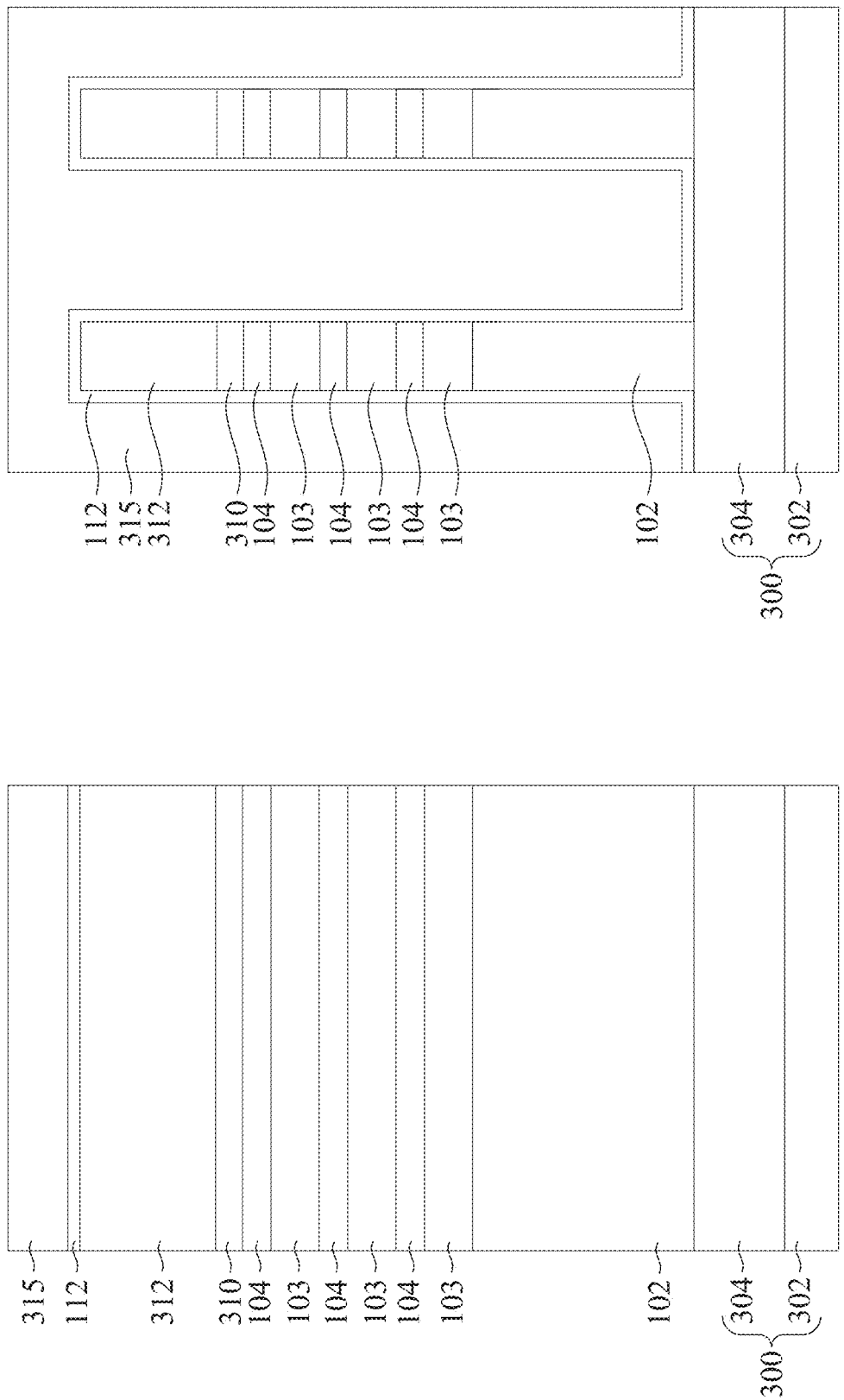

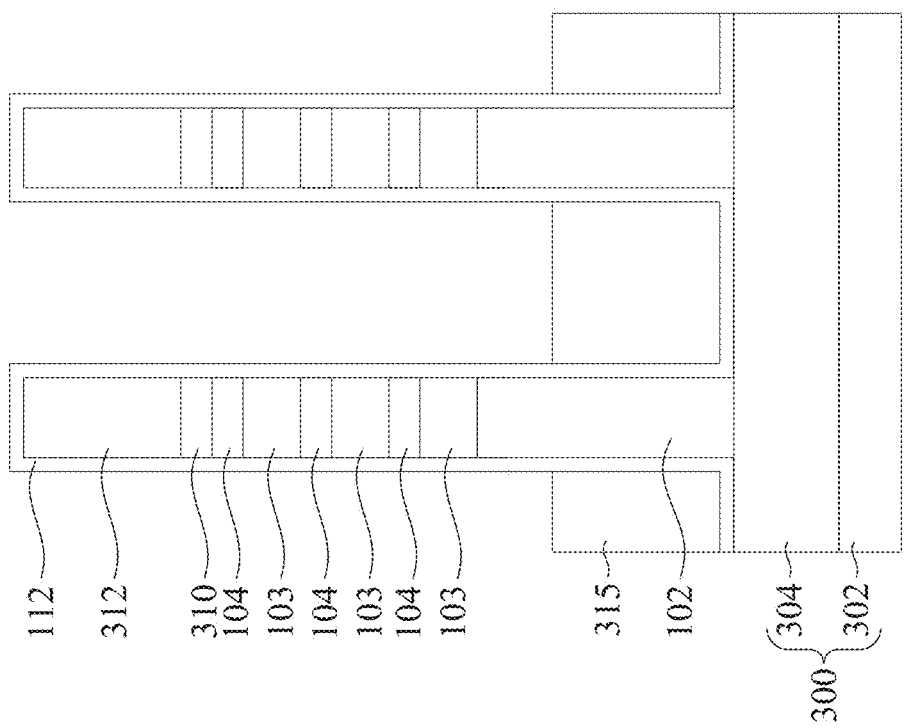

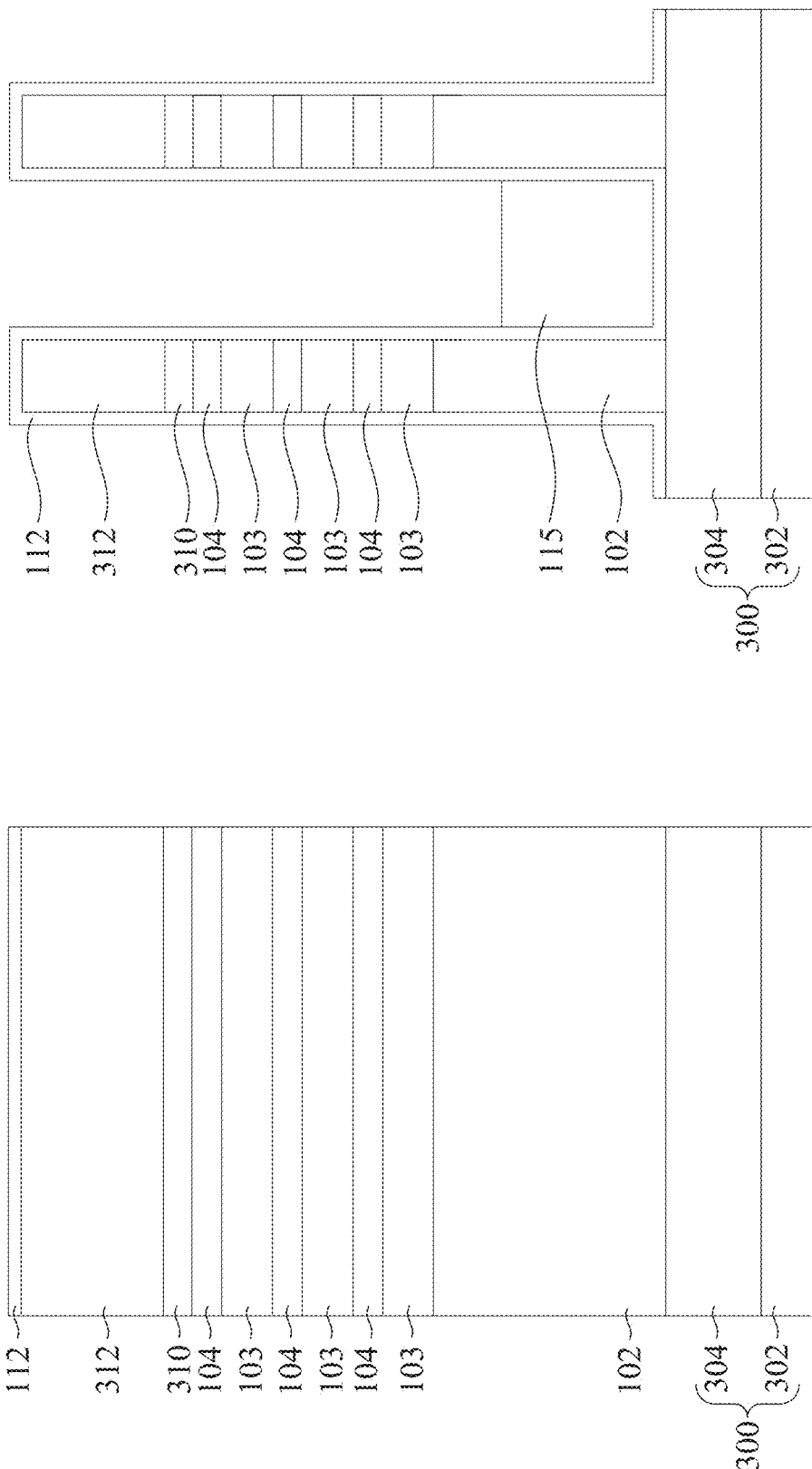

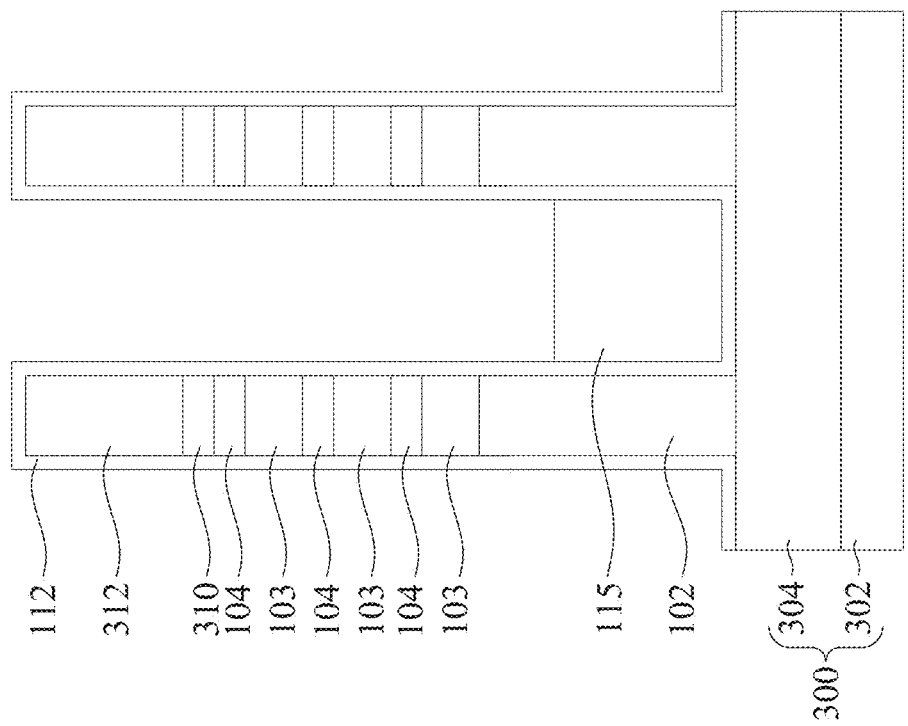

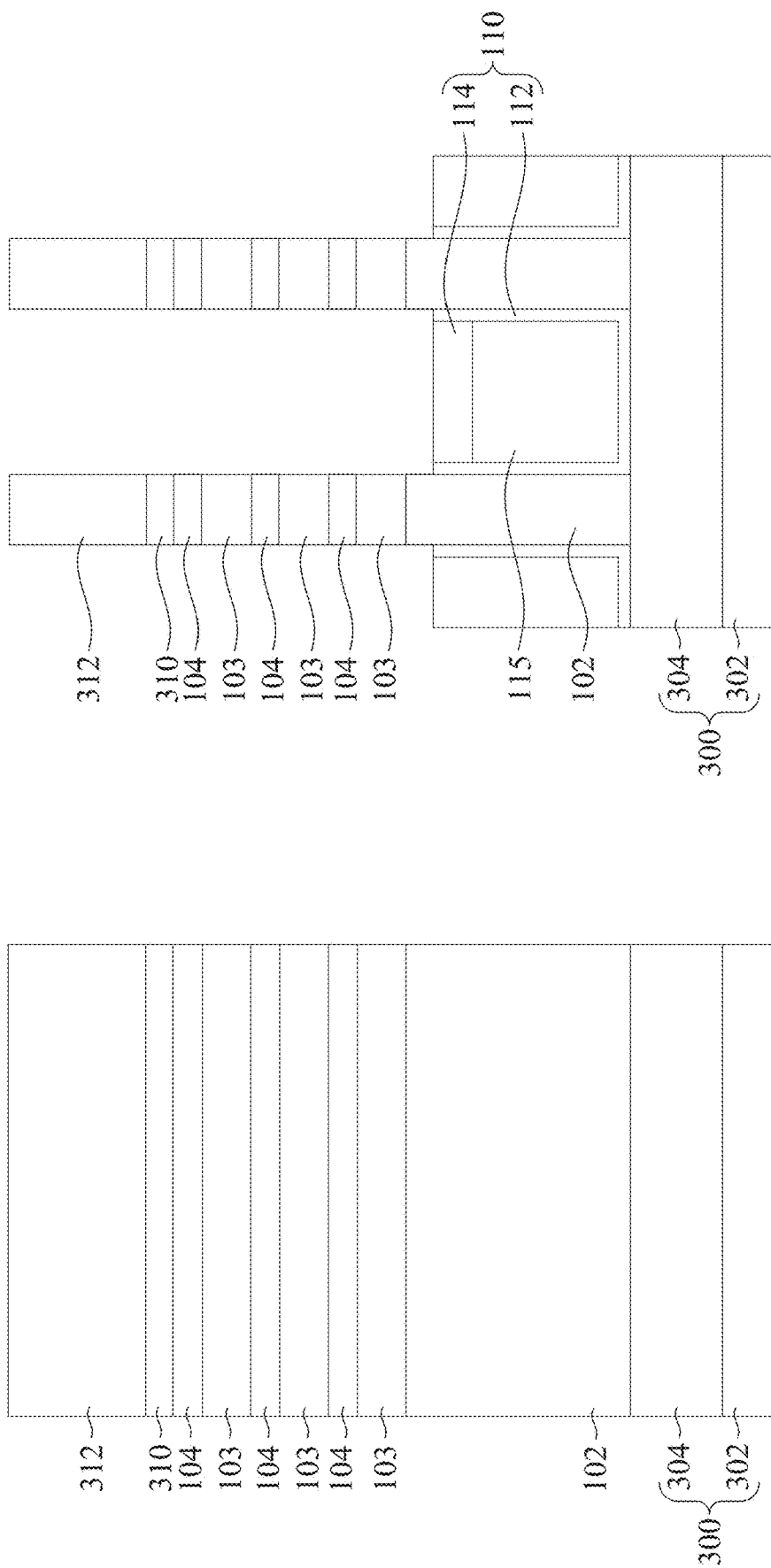

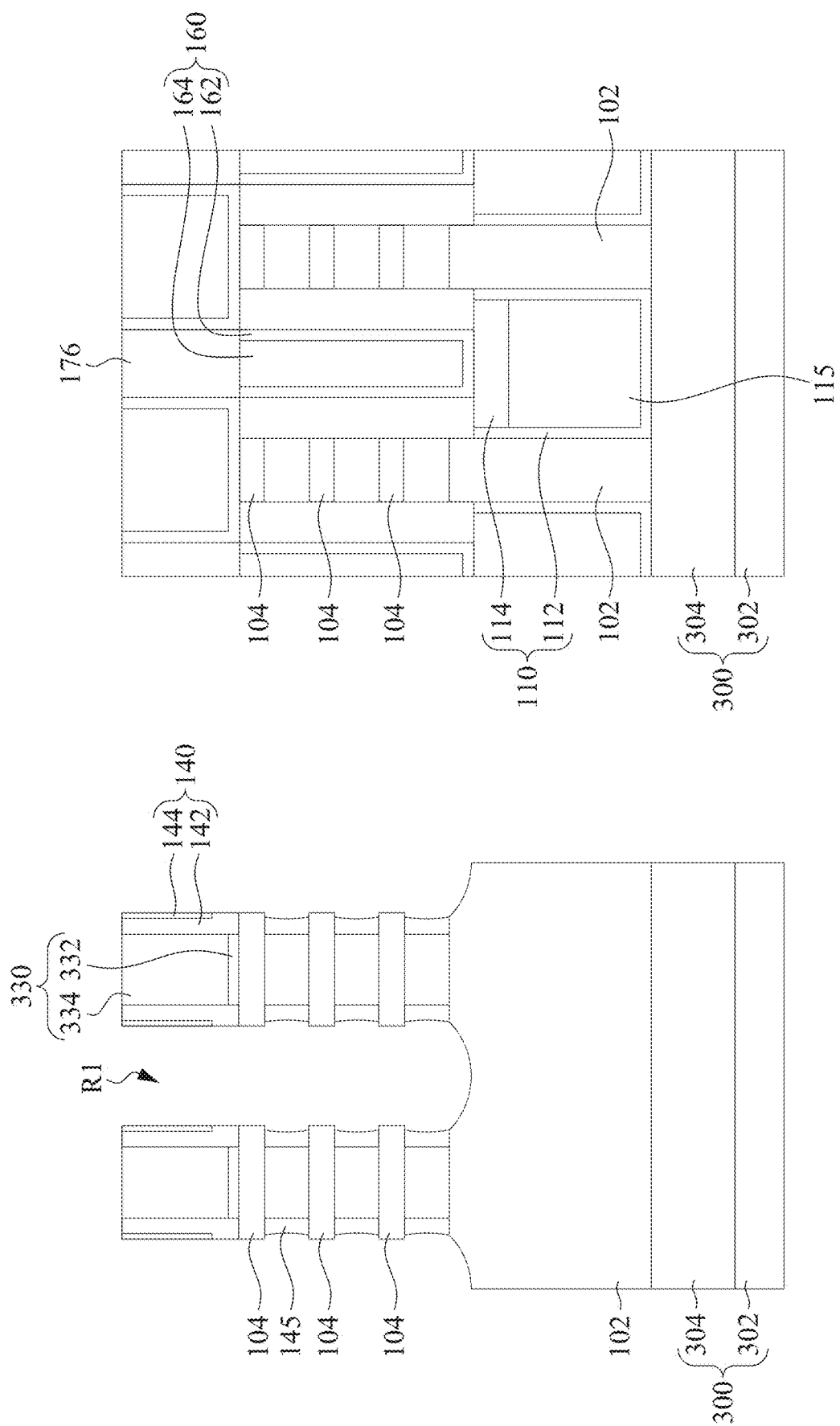

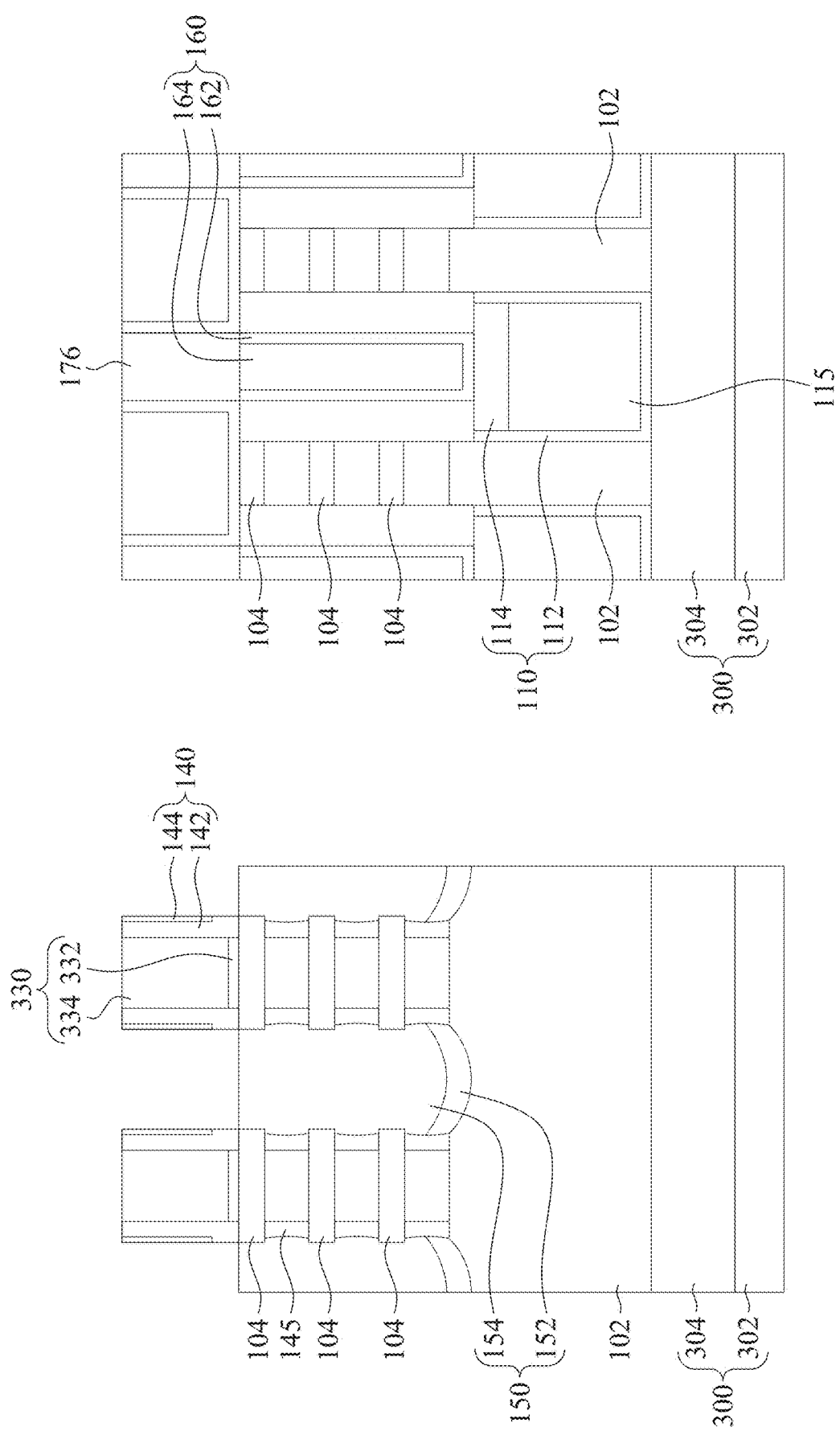

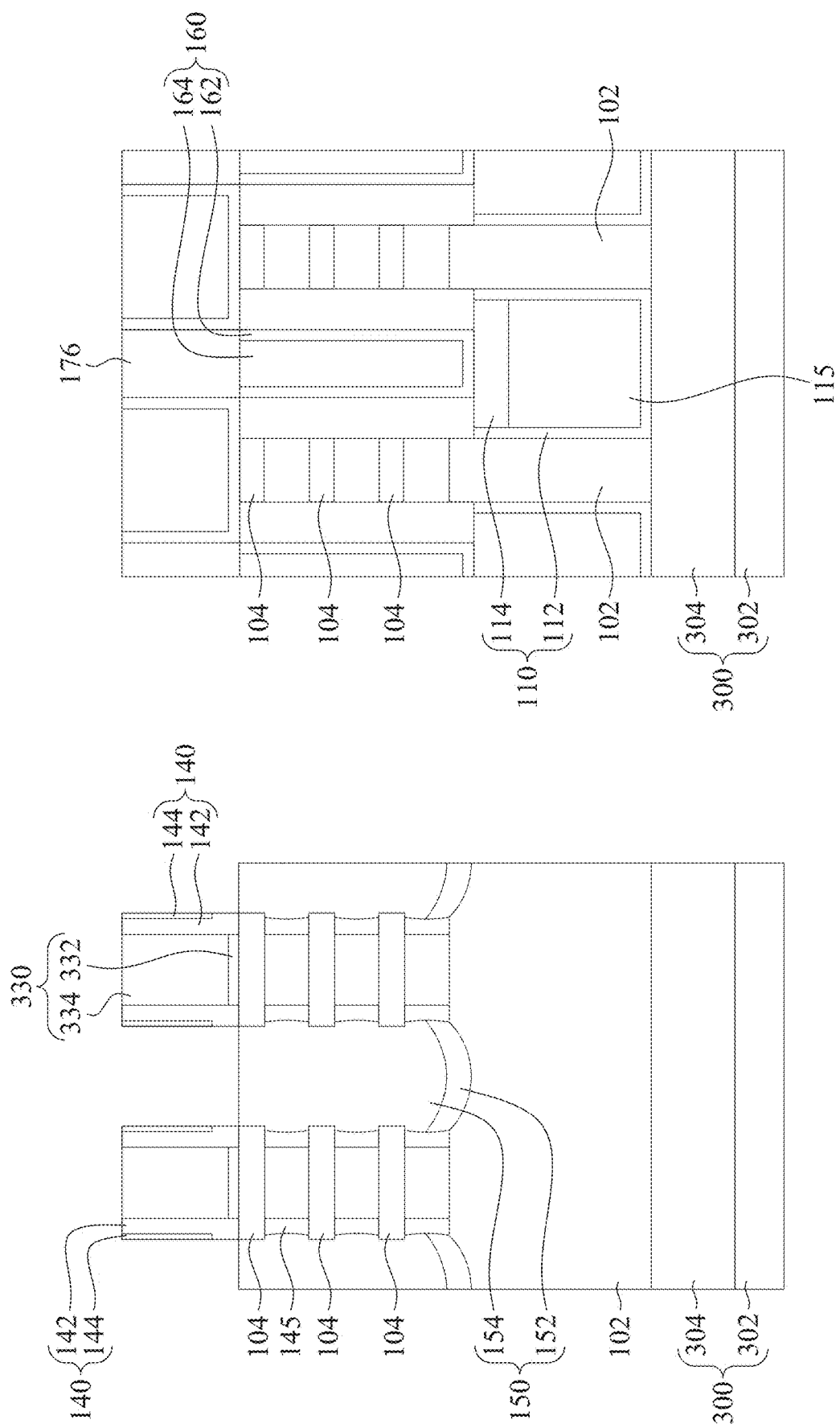

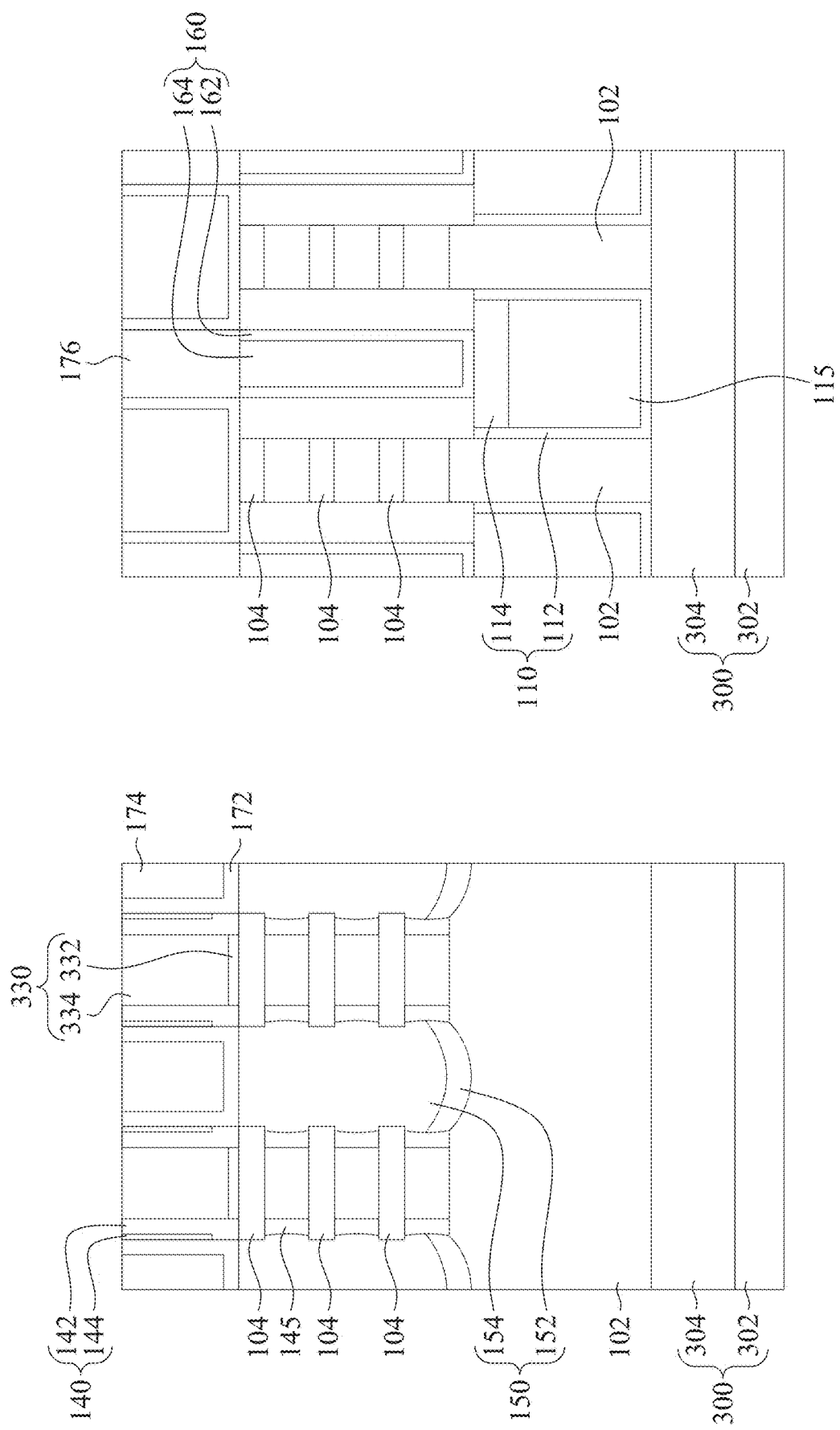

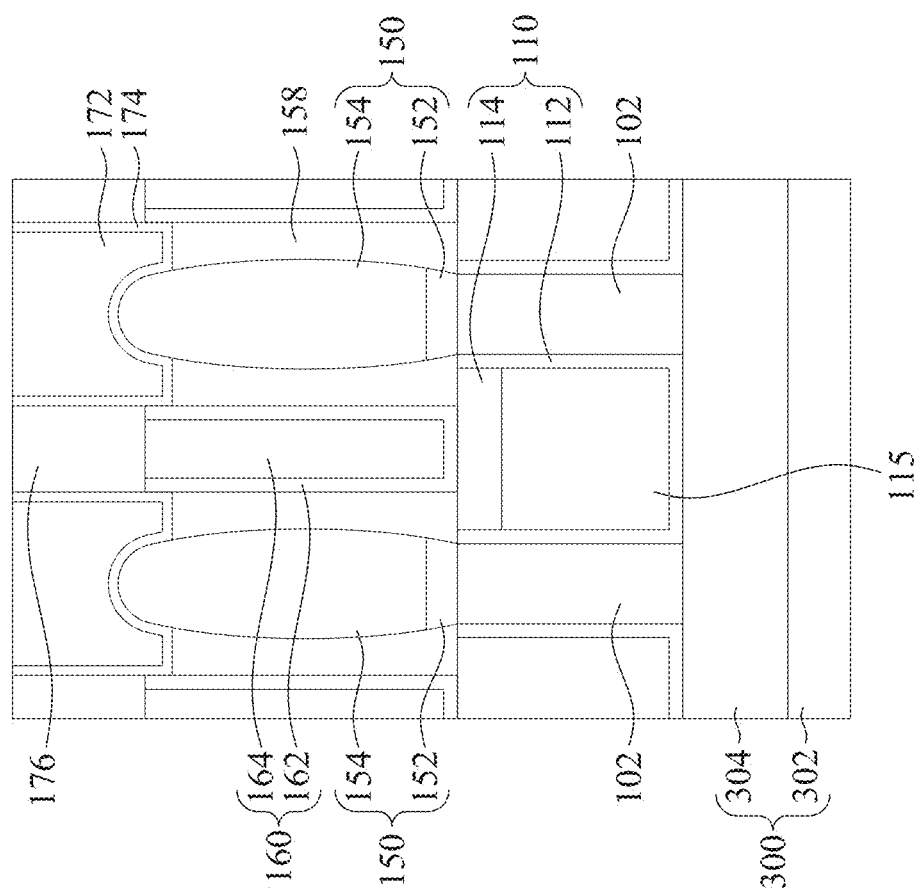

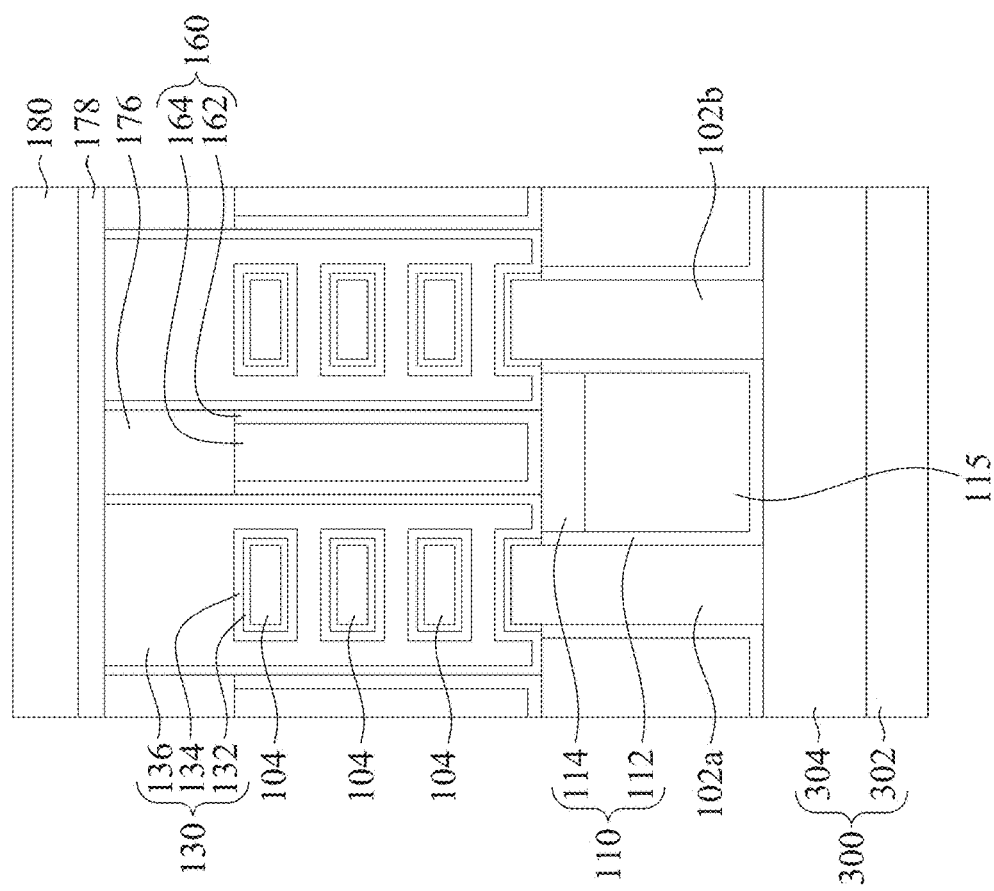
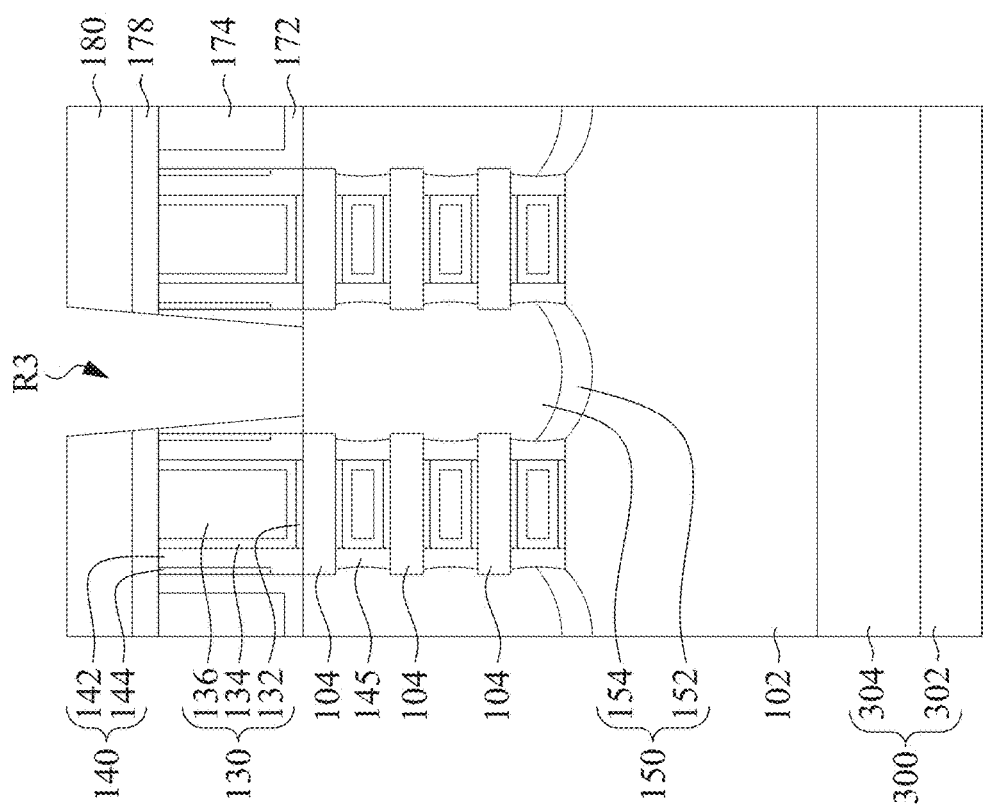
Fig. 19A
Fig. 19B

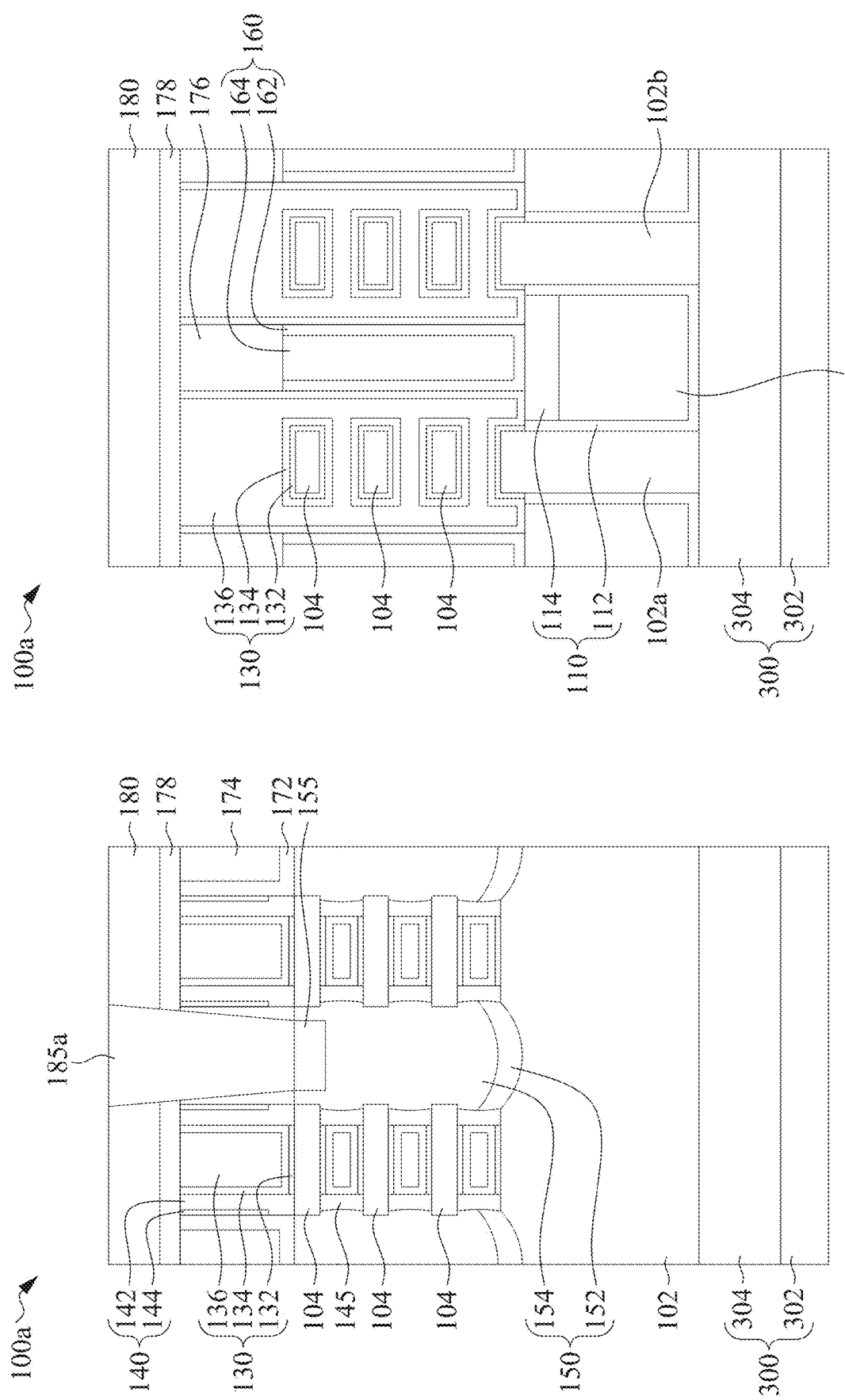

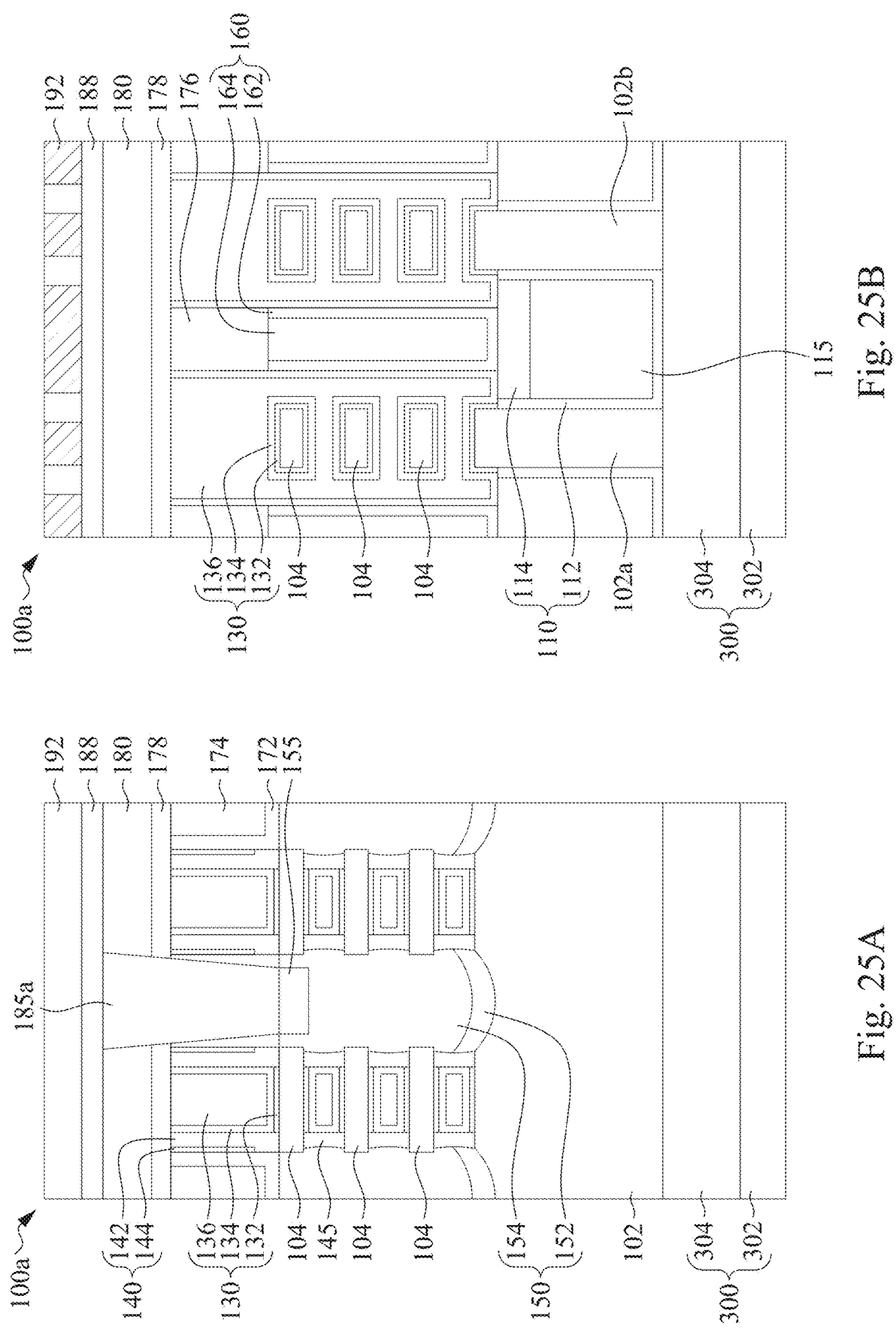

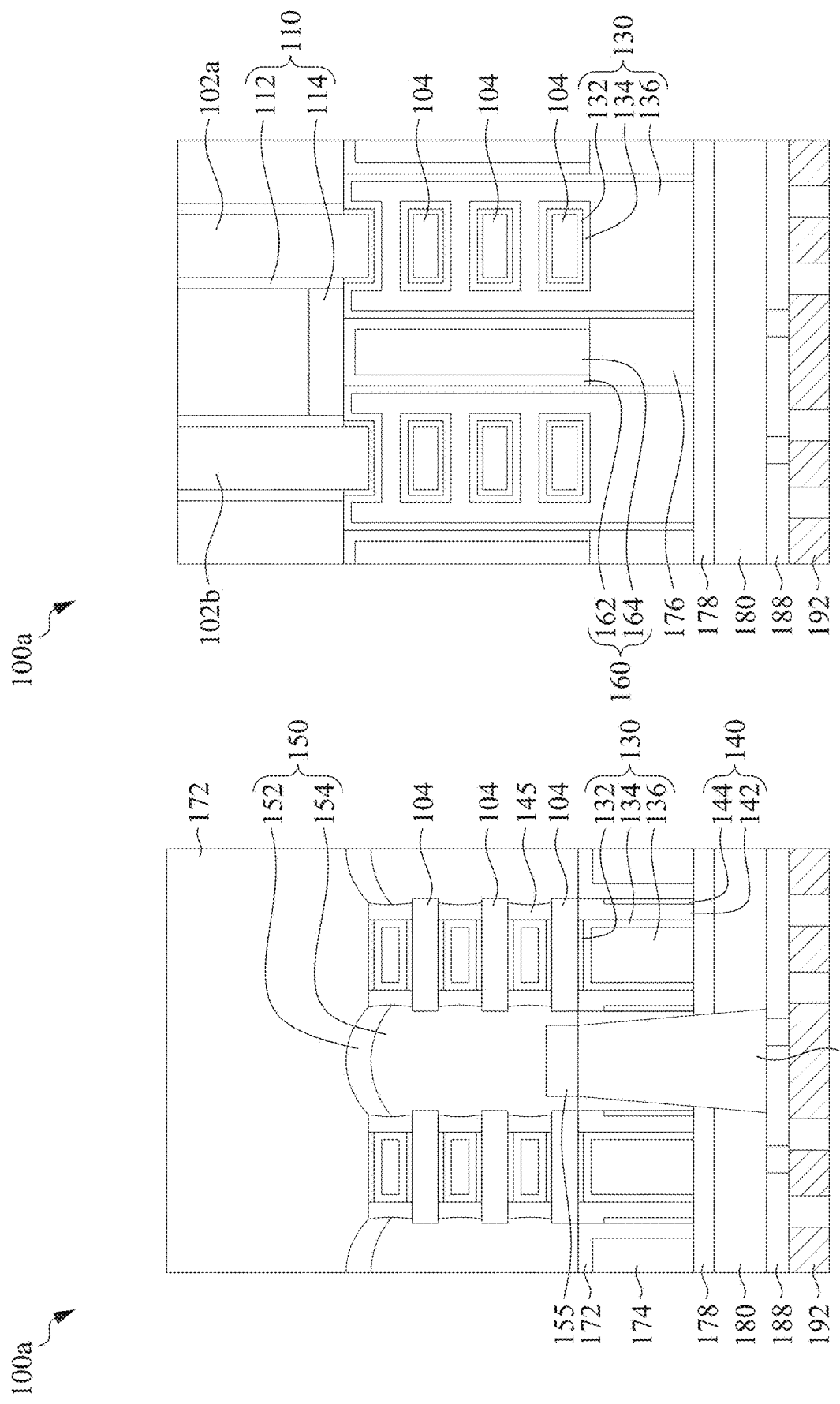

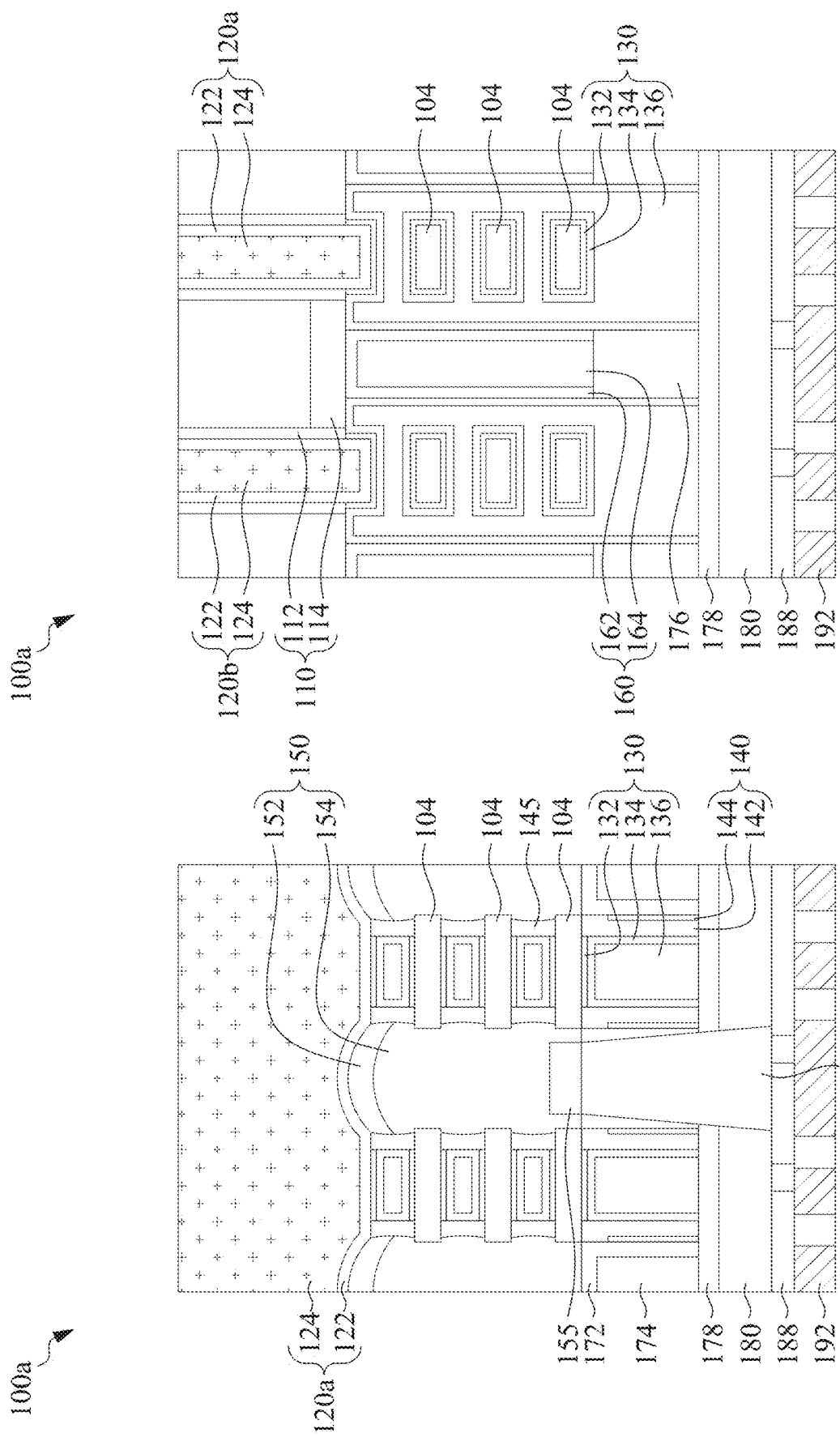

(A)

↓

| the dummy structures, the first semiconductor layers, and the third semiconductor layers are removed to form gate trenches | S115 |

↓

| metal gate structures are formed in the gate trenches | S116 |

↓

| an ESL and a second ILD layer are formed over the substrate | S117 |

↓

| first recesses are formed extending through the second ILD layer, the ESL, and the first ILD layer | S118 |

↓

| a patterned mask having an opening is formed over the substrate | S119 |

↓

| portions of the second dielectric layer and the isolation structures are etched through the opening of the patterned mask to expose the first conductive via | S120 |

↓

| the patterned mask is removed, and portions of the second dielectric layer exposed by the first recesses are etched | S121 |

↓

| silicide layers are formed over the epitaxy structures | S122 |

↓

| source/drain contacts are formed in the first recesses | S123 |

↓

| a third dielectric layer is formed over the second ILD layer, conductive vias are formed in the third dielectric layer, a fourth dielectric layer is formed over the third dielectric layer, and first metal lines are formed in the fourth dielectric layer | S124 |

↓

| a CMP process is performed to a backside of the substrate until the semiconductor strips and the first conductive via are exposed | S125 |

↓

| the semiconductor strips are removed to form second recesses | S126 |

↓

| dielectric strips are formed in the second recesses | S127 |

↓

| a fifth dielectric layer is formed over the isolation structures and the dielectric strips, and a second metal line is formed in the fifth dielectric layer | S128 |

Fig. 30B

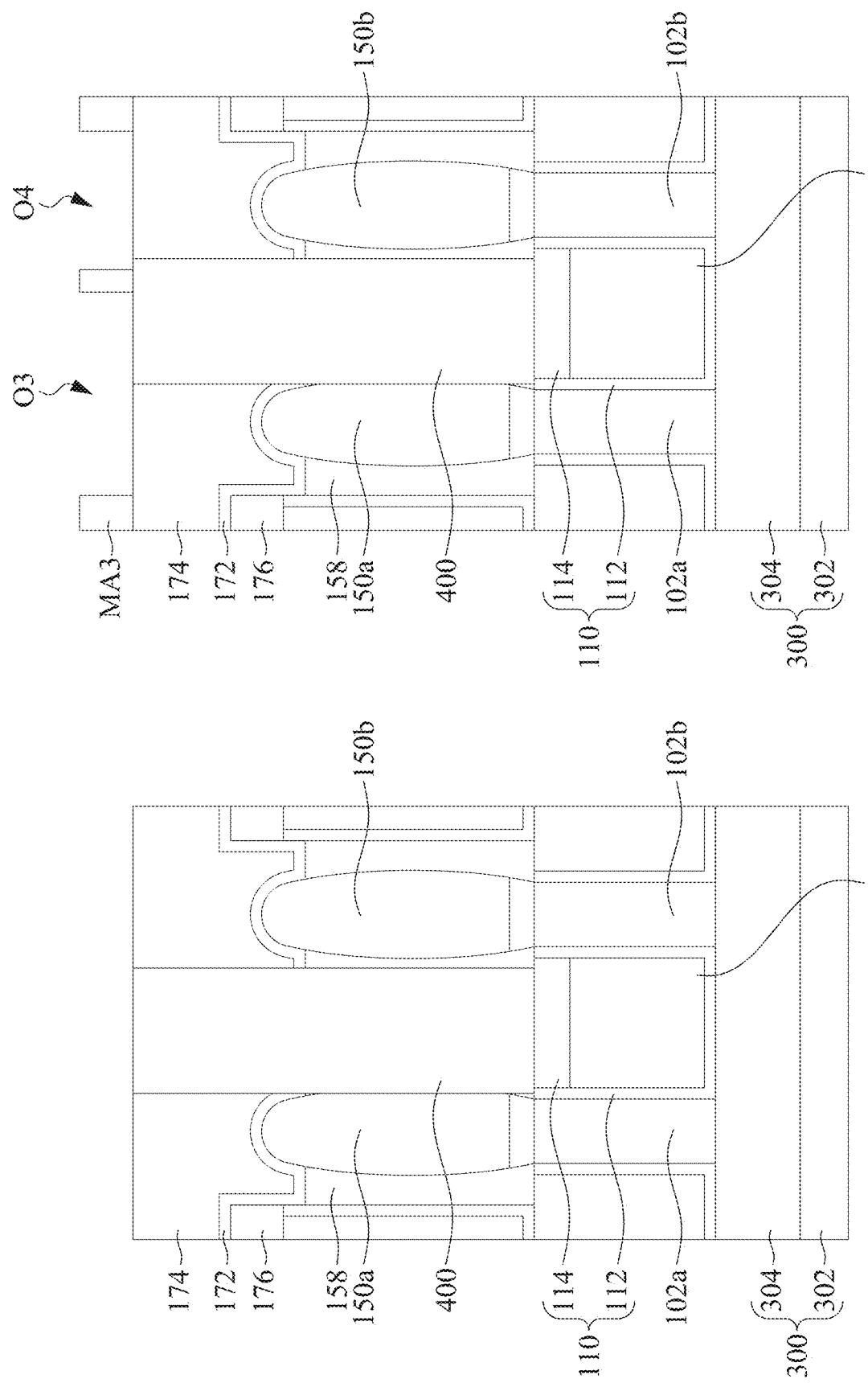

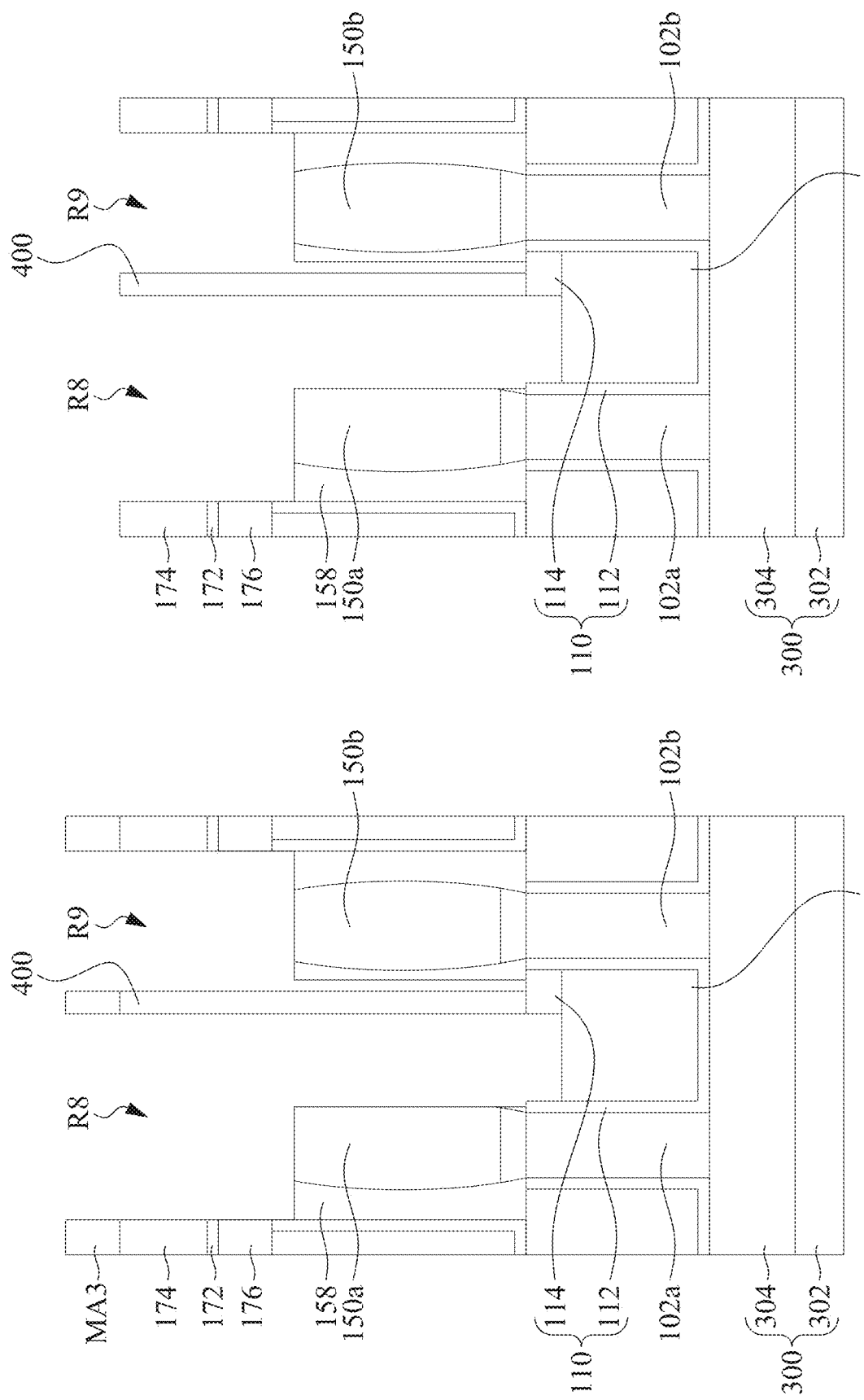

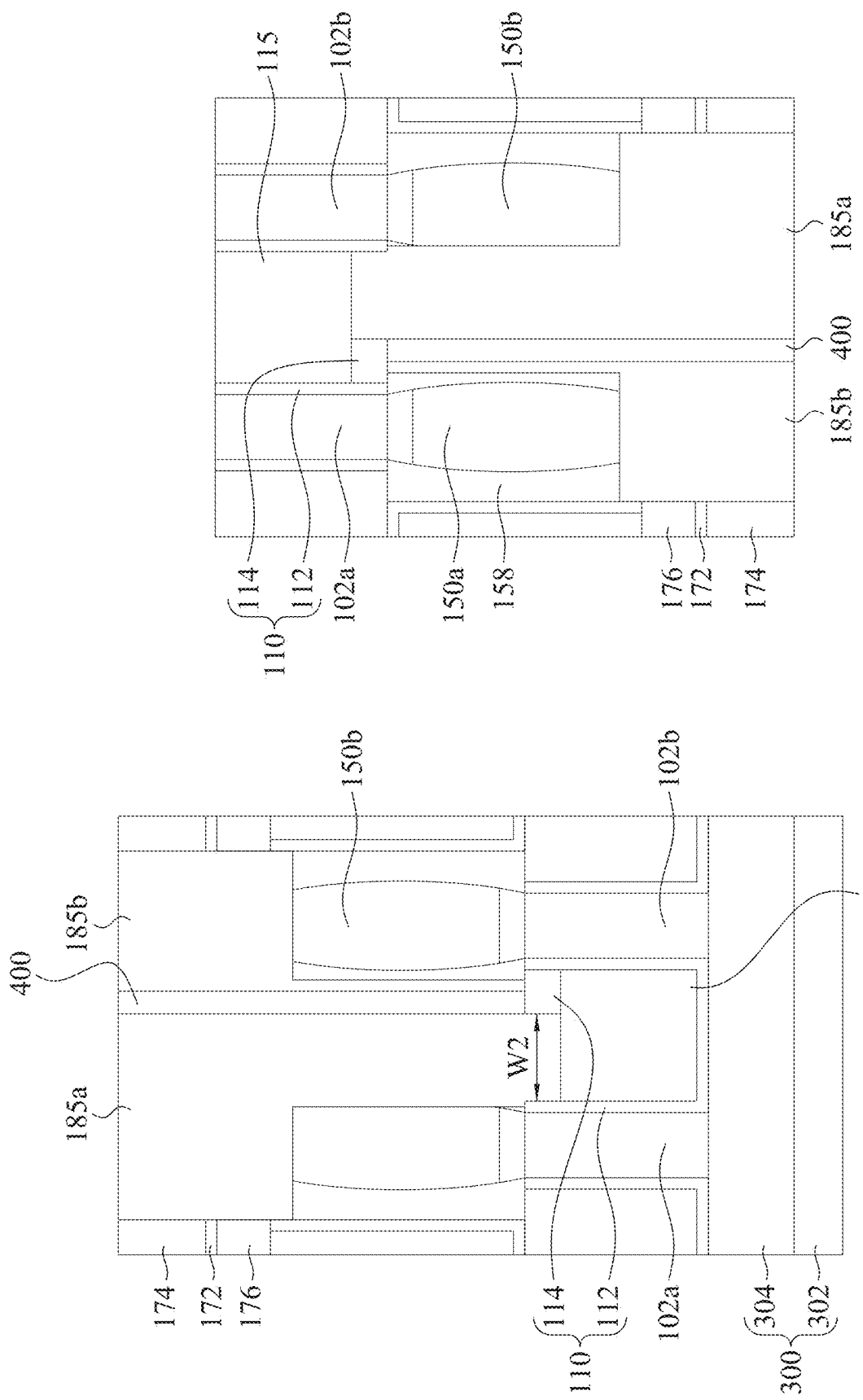

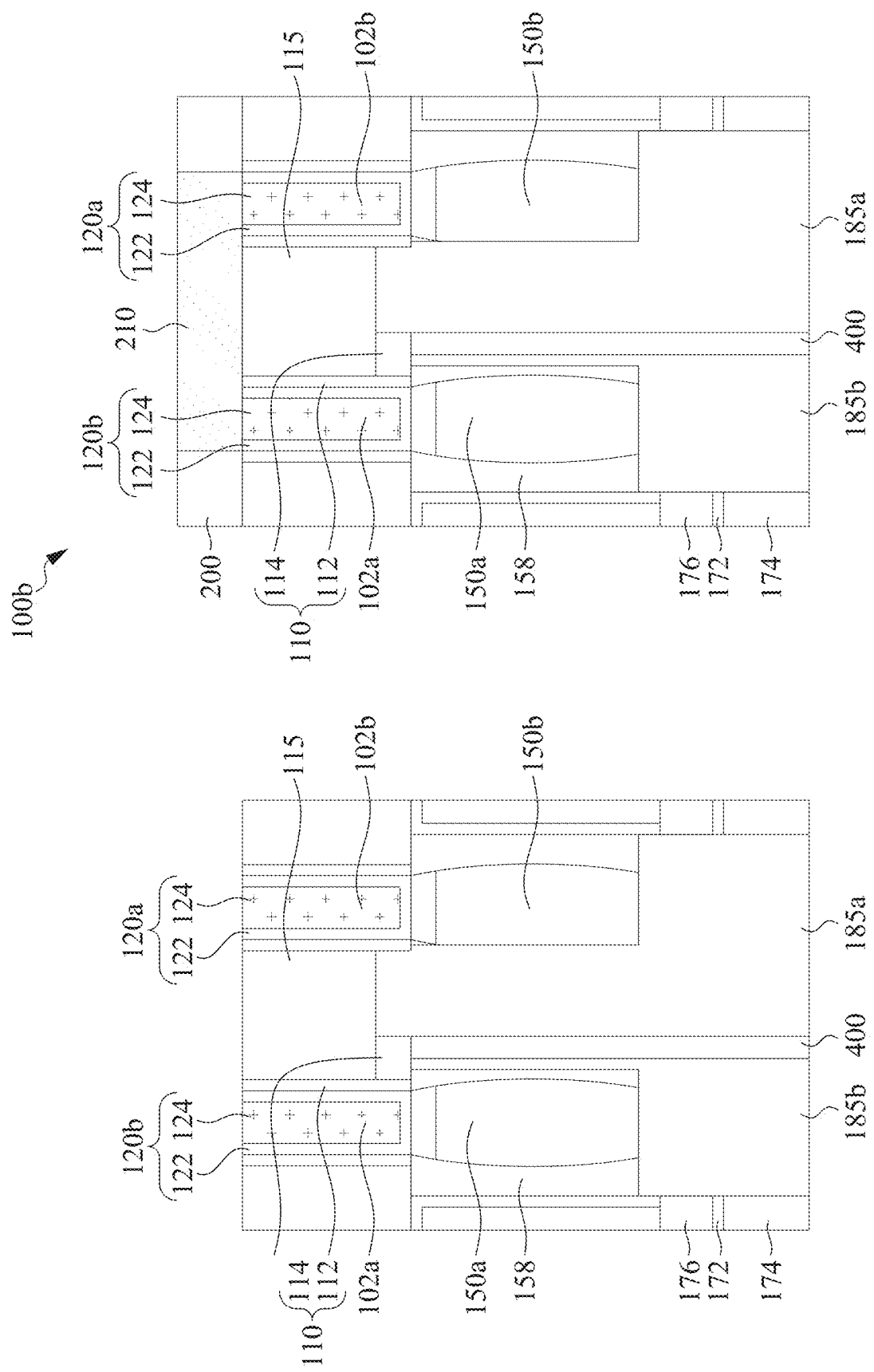

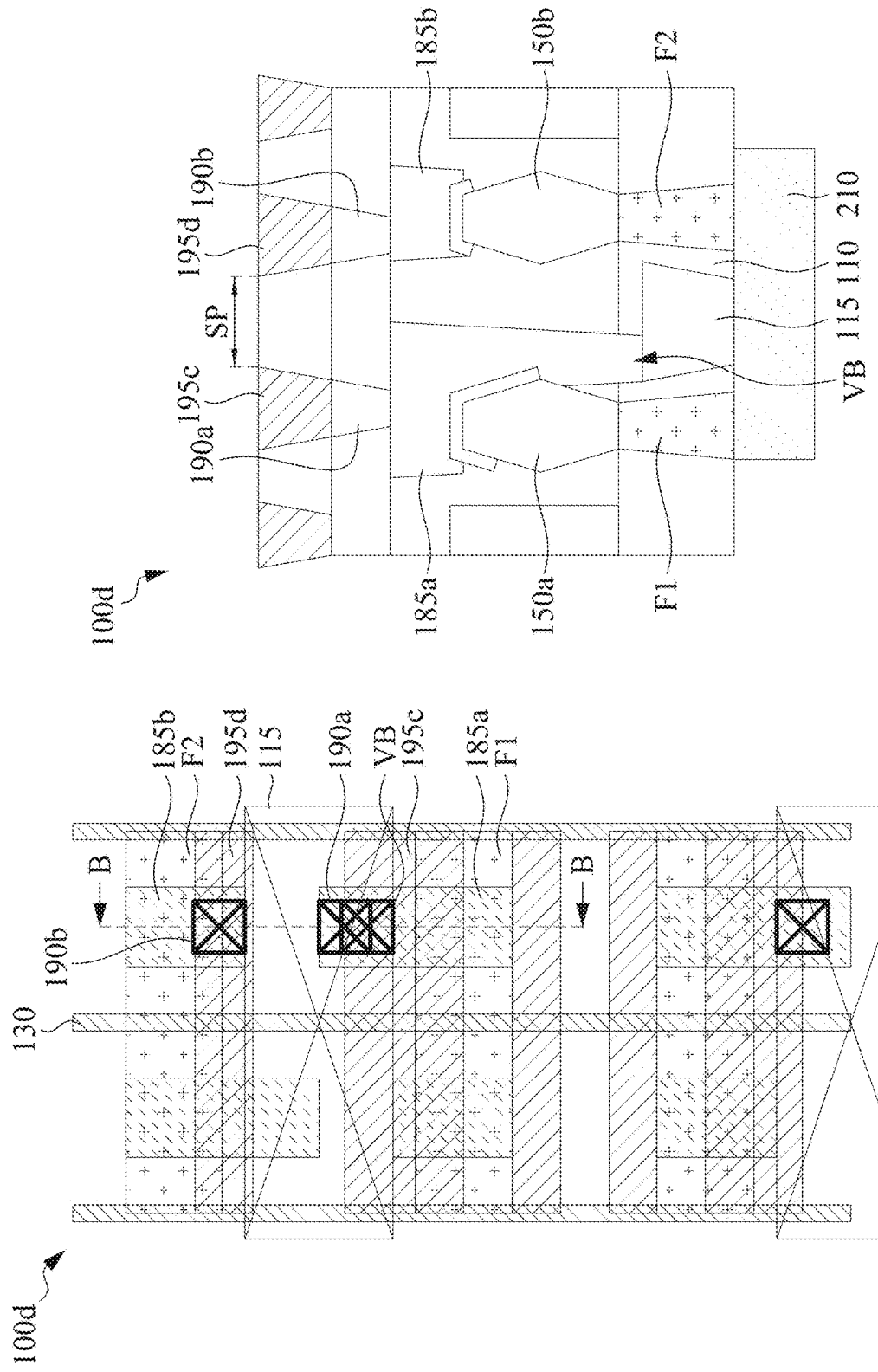

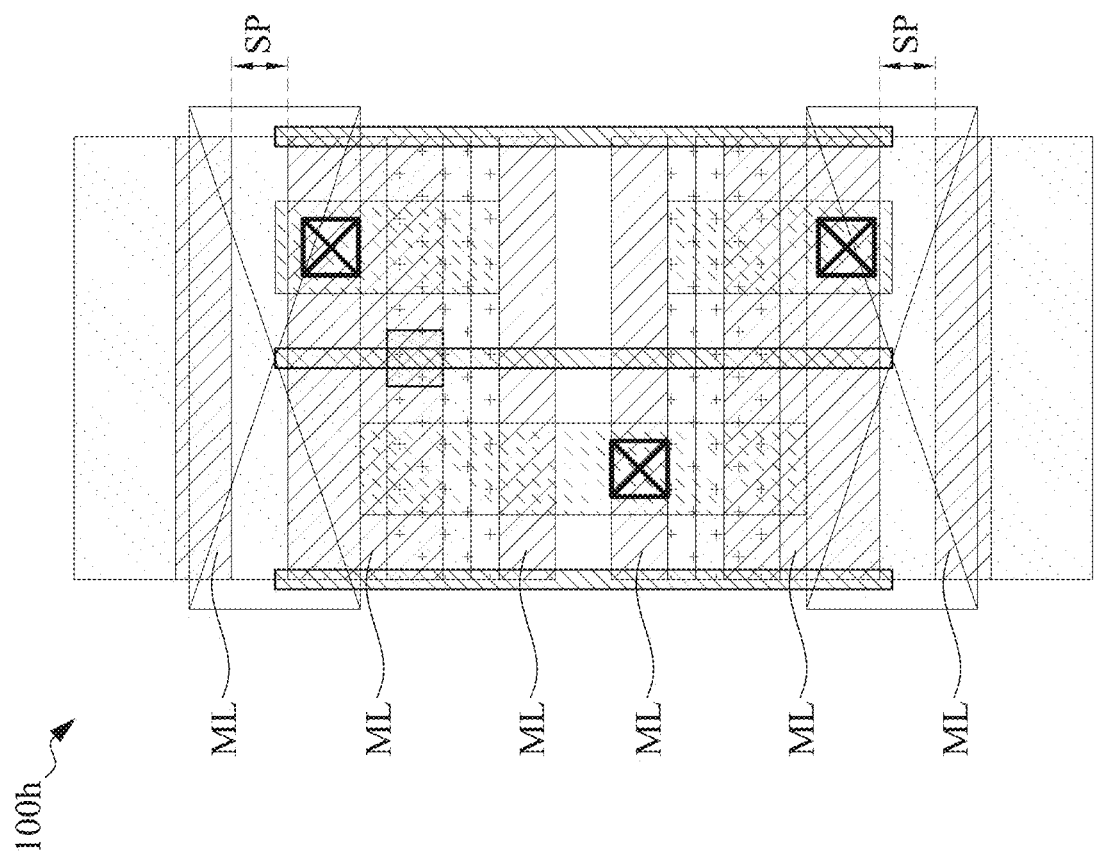

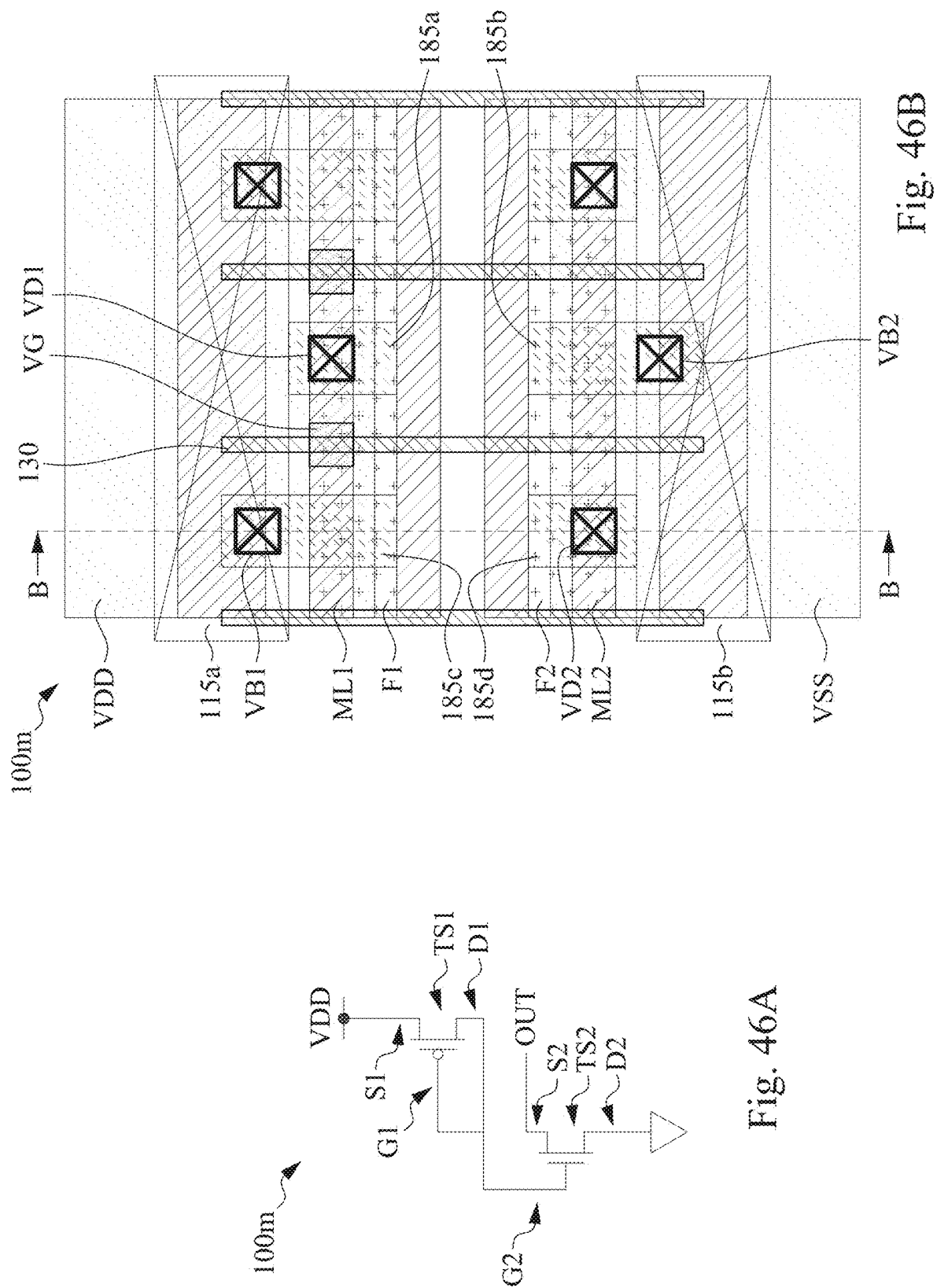

US 12,283,546 B2

INTEGRATED CIRCUIT AND METHOD FOR FORMING THE SAME

PRIORITY CLAIM

The present application is a continuation of U.S. patent application Ser. No. 17/142,016, filed Jan. 5, 2021, which claims the priority of U.S. Provisional Application No. 63/018,091, filed Apr. 30, 2020, which are incorporated herein by reference in their entireties.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, forming reliable semiconductor devices at smaller and smaller sizes becomes more challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top view and FIGS. 1B to 1D are cross-sectional views of an integrated circuit in accordance with some embodiments of the present disclosure.

FIGS. 2A to 29C are cross-sectional views of an integrated circuit at various stages of fabricating the integrated circuit in accordance with some embodiments of the present disclosure.

FIGS. 30A and 30B are flow charts of a method of manufacturing an integrated circuit in accordance with some embodiments of the present disclosure.

FIGS. 31 to 40 are cross-sectional view of an integrated circuit at various stages of fabricating an integrated circuit in accordance with some embodiments of the present disclosure.

FIG. 42A is a top view and FIG. 42B is a cross-sectional view of an integrated circuit in accordance with some embodiments of the present disclosure.

FIGS. 44A to 44C are top views of integrated circuits in accordance with some embodiments of the present disclosure

FIG. 46A is a schematic view, FIG. 46B is a top view and FIG. 46C is a cross-sectional view of an integrated circuit in accordance with some embodiments of the present disclosure.

DETAILED DESCRIPTION

Figure 1A:
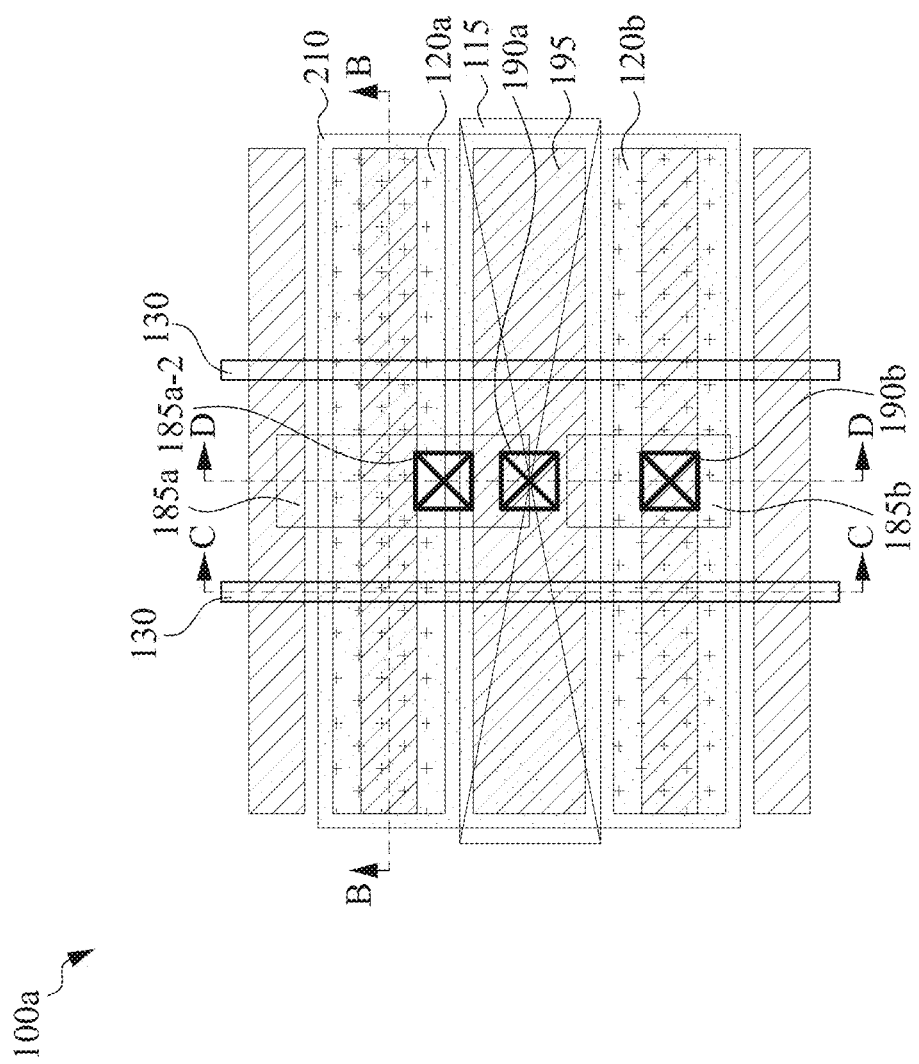

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1D:
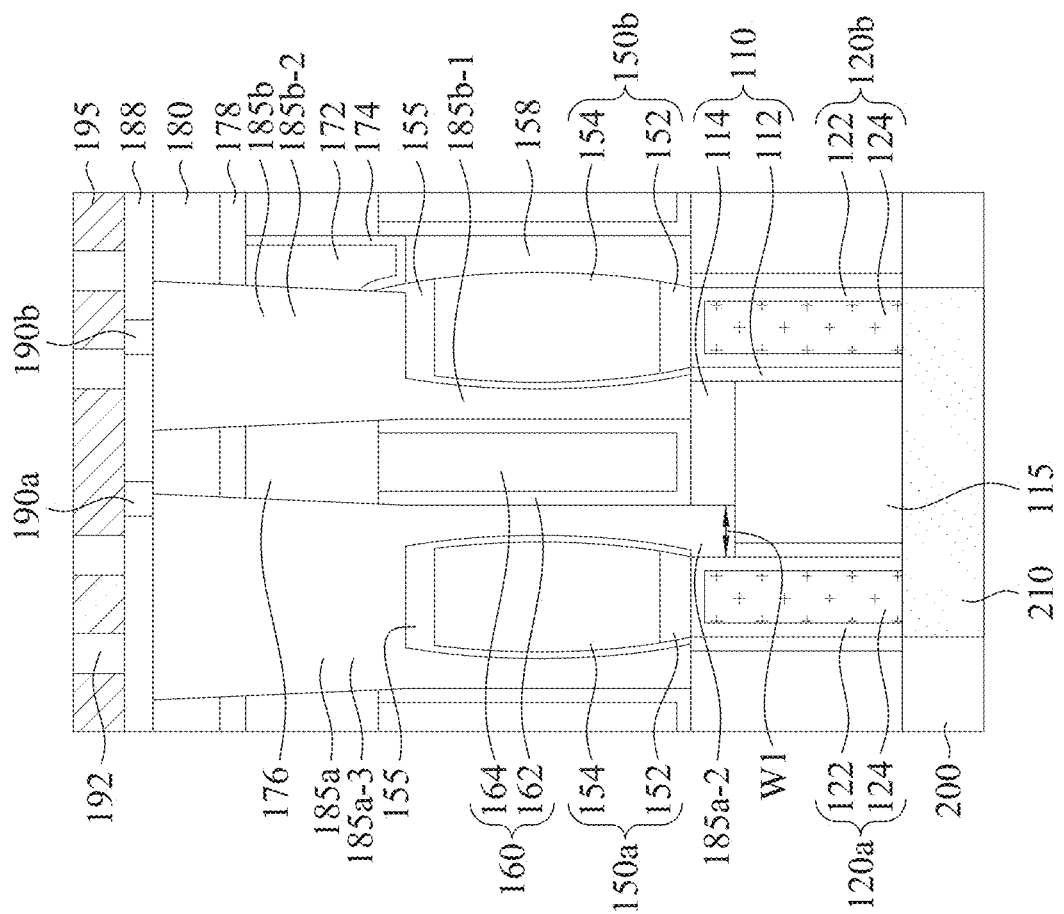

FIGS. 1A to 1D are schematic views of an integrated circuit in accordance with some embodiments of the present disclosure, in which FIG. 1A is a top view of the integrated circuit, FIG. 1B is a cross-sectional view along line B-B of FIG. 1A, FIG. 1C is a cross-sectional view along line C-C of FIG. 1A, and FIG. 1D is a cross-sectional view along line D-D of FIG. 1A. Some elements in FIGS. 1B to 1D are not illustrated in FIG. 1A to simplify the drawing.

An integrated circuit 100a is shown. The integrated circuit 100a includes a plurality of strip structures 120a, 120b. In some embodiments, the strip structures 120a, 120b are referred to as fin structures. In some embodiments of FIGS. 1A to 1D, the strip structures 120a, 120b include a dielectric material, and thus are referred to as dielectric strips 120a, 120b below. The integrated circuit 100a further includes a plurality of semiconductor layers 104 disposed over the dielectric strips 120a, 120b. In some embodiments, the semiconductor layers 104 or portions thereof form channel layers (or channel regions) of semiconductor devices in the integrated circuit 100a. In some embodiments, the semiconductor layers 104 are referred to as "nanosheets" or "nanowires" used to form a channel region of a semiconductor device, such as a gate-all-around (GAA) transistor.

In some embodiments, each of the dielectric strips 120a, 120b includes a dielectric material 124 and a dielectric liner 122. In the cross-section of FIG. 1B, the dielectric liner 122 at least covers the top surface of the dielectric material 124. That is, the dielectric liner 122 is at least between the dielectric material 124 and the semiconductor layers 104. In the cross-sections of FIGS. 1C and 1D, the dielectric liner 122 at least covers the top surface of the dielectric material 124 and the opposite sidewalls of the dielectric material 124. In some embodiments, the dielectric material 124 and the dielectric liner 122 include suitable dielectric material, such as oxide (e.g., silicon oxide) or nitride (e.g., silicon nitride). In some embodiments, the dielectric material 124 and the dielectric liner 122 include different materials. For example, the dielectric material 124 includes silicon oxide, while the dielectric liner 122 includes silicon nitride.

In FIGS. 1C and 1D, the integrated circuit 100a includes a plurality of isolation structures 110 disposed on opposite sidewalls of the dielectric strips 120a, 120b. At least one of the isolation structures 110 is disposed between the dielectric strips 120a, 120b. In some embodiments, the isolation structures 110 are shallow trench isolation (STI) structures, suitable isolation structures, combinations of the foregoing, or the like. In some embodiments, each of the isolation structures 110 includes a dielectric liner 112 and a dielectric layer 114. In some embodiments, the dielectric liner 112 and the dielectric layer 114 include oxide (e.g., silicon oxide) or nitride (e.g., silicon nitride). In some embodiments, the dielectric liner 112 and the dielectric layer 114 include same material, such as silicon oxide. In some other embodiments, the dielectric liner 112 and the dielectric layer 114 include different materials, for example, the dielectric liner 112 includes silicon nitride, and the dielectric layer 114 includes silicon oxide. In some embodiments, the dielectric liner 112, the dielectric layer 114, and the dielectric material 124 of the dielectric strips 120a, 120b include the same material, such as silicon oxide. In some embodiments, the dielectric layer 114 and the isolation structure 110 include the same material, while the dielectric layer 114 and the dielectric liner 112 include different materials.

In FIGS. 1C and 1D, the integrated circuit 100a further includes a backside via 115 disposed in the isolation structure 110 between the dielectric strips 120a, 120b. In some embodiments, at least three surfaces of the backside via 115 are covered by the isolation structure 110. For example, the top surface of the backside via 115 is covered by and in contact with the dielectric layer 114 of the isolation structure 110, and the opposite sidewalls of the backside via 115 are covered by and in contact with the dielectric liner 112 of the isolation structure 110. Accordingly, the backside via 115 is separated from the dielectric strips 120a, 120b by the dielectric liner 112 of the isolation structure 110. In some embodiments, the top surface of the backside via 115 is lower than the top surfaces of the dielectric strips 120a, 120b and is lower than the top surfaces of the isolation structures 110.

In FIGS. 1B and 1C, the integrated circuit 100a further includes a plurality of gate structures 130 wrapping around the semiconductor layers 104. In some embodiments, each of the gate structures 130 covers at least four sides of each of the semiconductor layers 104. In some embodiments, each of the gate structures 130 includes an interfacial layer 132, a gate dielectric layer 134 over the interfacial layer 132, and a gate conductive layer 136 over the gate dielectric layer 134.

In some embodiments, the interfacial layer 132 includes oxide, such as silicon oxide ($SiO_2$). In some embodiments, the gate dielectric layers 134 includes high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$–$Al_2O_3$) alloy, or other applicable dielectric materials. In some embodiments, the gate dielectric layer 134 includes oxide layers. In some embodiments, the gate conductive layer 136 includes a work function metal layer and a filling metal. The work function metal layer includes an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. In some embodiments, the work function layer includes a plurality of layers. In some embodiments, the filling metal includes tungsten (W), aluminum (Al), copper (Cu), or another suitable conductive material(s).

In FIG. 1B, a plurality of gate spacers 140 are disposed on opposite sidewalls of the gate structures 130. In some embodiments, the gate spacers 140 include $SiO_2$, $Si_3N_4$, $SiO_xN_y$, SiC, SiCN films, SiOC, SiOCN films, and/or combinations thereof. For example, each of the gate spacers 140 includes a first layer 142 and a second layer 144 over the first layer 142, in which the first layer 142 and the second layer 144 include different materials. In some embodiments, the integrated circuit 100a further includes a plurality of spacer layers 145 disposed on opposite sidewalls of the gate structures 130 and between the semiconductor layers 104. In some embodiments, the spacer layers 145 include $SiO_2$, $Si_3N_4$, $SiO_xN_y$, SiC, SiCN films, SiOC, SiOCN films, and/or combinations thereof.

The integrated circuit 100a further includes a plurality of epitaxy structures 150a, 150b. In FIG. 1B, the epitaxy structures 150a are disposed on opposite sides of the gate structures 130 and in contact with sidewalls of the semiconductor layers 104, and are capable of functioning as source/drain regions of semiconductor devices in the integrated circuit 100a. Thus, the epitaxy structures 150a, 150b are interchangeably referred to as source/drain structures. In the cross-sections of FIGS. 1C and 1D, the epitaxy structure 150a is disposed over and in contact with the dielectric strip 120a, and the epitaxy structure 150b is disposed over and in contact with the dielectric strip 120b. In various embodiments, the epitaxy structures 150a, 150b independently include Ge, Si, GaAs, AlGaAs, SiGe, GaAsP, SiP, or other suitable material. In some embodiments, each of the epitaxy structures 150a, 150b includes a first epitaxial layer 152 and a second epitaxial layer 154 over the first epitaxial layer 152. In various embodiments, the epitaxy structures 150a, 150b include Ge, Si, GaAs, AlGaAs, SiGe, GaAsP, SiP, or other suitable material.

The integrated circuit 100a further includes a plurality of silicide layers 155 disposed over the epitaxy structures 150a, 150b. In some embodiments, the silicide layers 155 include $CoSi_2$, $TiSi_2$, $WSi_2$, $NiSi_2$, $MoSi_2$, $TaSi_2$, PtSi, or the like. In the cross-sectional view of FIG. 1B, at least one of the silicide layers 155 is embedded in the epitaxy structure 150a. For example, in FIG. 1B, the epitaxy structure 150a covers bottom surface and sidewalls of the silicide layer 155.

On the other hand, in the cross-sectional view of FIG. 1D, the silicide layer 155 over the epitaxy structure 150a substantially covers opposite sidewalls and the top surface of the epitaxy structure 150. The silicide layer 155 over the epitaxy structure 150b covers only one sidewall of the epitaxy structure 150b and the top surface of the epitaxy structure 150b. For example, the sidewall of the epitaxy structure 150b close to the epitaxy structure 150a is covered by the silicide layer 155, and another sidewall of the epitaxy structure 150b distal to the epitaxy structure 150a is free from coverage of the silicide layer 155.

In FIGS. 1C and 1D, the integrated circuit 100a further includes a plurality of dummy fins 160 disposed on and in contact with the top surfaces of the isolation structures 110. In FIG. 1C, at least one of the dummy fins 160 is disposed between two adjacent gate structures 130 to provide electrical isolation. In some embodiments, each of the dummy fins 160 includes a dielectric liner 162 and a dielectric material 164, in which the dielectric liner 162 wraps around the dielectric material 164.

In some embodiments, the dummy fins 160 serve as portions of insulating gate-cut structures as shown in FIG. 1C, and are made of a nitride-based material, such as silicon nitride, silicon oxynitride, silicon carbon nitride, or the like. In some embodiments, the dummy fins 160 are made of a high-k dielectric material, such as metal oxide. Examples of high-k dielectric materials include hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the dielectric liner 162 includes a low-k material, such as SiCN, SiN, SiC, or the like. In some embodiments, the dielectric material 164 includes oxide, such as $SiO_2$, or the like. In some embodiments, the dielectric liner 162 and the dielectric material 164 include different materials.

In FIG. 1D, the integrated circuit 100a further includes a dielectric layer 158 disposed between the epitaxy structure 150b and one of the dummy fins 160 (the rightmost dummy fin in FIG. 1D). In some embodiments, the dielectric layer 158 is in contact with the sidewall of the epitaxy structure 150b distal to the epitaxy structure 150a. In some embodiments, the silicide layer 155 over the epitaxy structure 150b is also in contact with the sidewall of the dielectric layer 158. In some embodiments, the dielectric layer 158 includes oxide, such as $SiO_2$, or the like. In some other embodiments, the dielectric layer 158 includes SiCN, SiN, SiC, or the like.

In FIGS. 1B and 1D, a contact etch stop layer (CESL) 172 is disposed over the epitaxy structures 150a, 150b and extending along sidewalls of the gate spacers 140. An interlayer dielectric (ILD) layer 174 is disposed over the CESL 172 and adjacent to the gate spacers 140. In FIG. 1D, the CESL 172 is at least disposed over the dielectric layer 158 between the epitaxy structure 150b and the dummy fin 160. In some embodiments, the ILD layer 174 includes silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The CESL 172 includes material different from the ILD layer 172. In some embodiments, the CESL 172 includes silicon nitride, silicon oxynitride or other suitable materials.

In the cross-sectional views of FIGS. 1C and 1D, a dielectric layer 176 is disposed over the dummy fins 160. In some embodiments, the dielectric layer 176 includes $SiO_2$, $Si_3N_4$, $SiO_xN_y$, SiC, SiCN films, SiOC, SiOCN films, and/or combinations thereof. In some embodiments, the dielectric layer 176 and underlying dummy fins 160 are capable of functioning as insulating gate-cut structures.

The integrated circuit 100a further includes an etch stop layer (ESL) 178 and an interlayer dielectric (ILD) layer 180 over the ESL 178. In the cross-sectional view of FIG. 1B, the ESL 178 extends along the top surfaces of the gate structures 130, gate spacers 140, and the ILD layer 174. On the other hand, in the cross-sectional views of FIGS. 1C and 1D, the ESL 178 extends along the top surface of the dielectric layer 176. In some embodiments, the material of the ESL 178 is similar to the CESL 172, and the material of the ILD layer 180 is similar to the ILD layer 174.

The integrated circuit 100a further includes a plurality of source/drain contacts 185a, 185b disposed over the epitaxy structures 150a, 150b, respectively. In the cross-sectional view of FIG. 1B, the source/drain contact 185a extends through the ILD layer 180, the ESL 178, the ILD layer 174, and the CESL 172 to the top surface of the silicide layer 155.

With respect to the source/drain contact 185a of FIG. 1D, the source/drain contact 185a at least covers the opposite sidewalls and the top surface of the epitaxy structure 150a. For example, the source/drain contact 185a at least includes a first portion 185a-1 at the first side of the epitaxy structure 150a distal to the epitaxy structure 150b, a second portion 185a-2 at the second side of the epitaxy structure 150a close to the epitaxy structure 150b, and a third portion 185a-3 disposed over the epitaxy structure 150a, in which the third portion 185a-3 is connected to the first portion 185a-1 and the second portion 185a-2. In greater detail, the first portion 185a-1 extends between the epitaxy structure 150a and the dummy fin 160, the second portion 185a-2 extends between the epitaxy structure 150a and the dummy fin 160, and the third portion 185a-3 extends through the ILD layer 180, the ESL 178, and the dielectric layer 176.

The second portion 185a-2 of the source/drain contact 185a embedded in the isolation structure 110 has a width W1. In some embodiments, the width W1 is in a range from about 10 nm to about 15 nm. If the width W1 is too small (e.g., much lower than 10 nm), the second portion 185a-2 is too thin to provide sufficient electrical connection, in some instances. If the width W1 is too large (e.g., much greater than 15 nm), the second portion 185a-2 is too large and affects the sizes of the adjacent elements (e.g., the dummy fin 160 or the dielectric strip 120a), in some instances.

With respect to the first portion 185a-1 of the source/drain contact 185a, the bottom surface of the first portion 185a-1 is in contact with the dielectric liner 112 and the dielectric layer 114 of the isolation structure 110. On the other hand, with respect to the second portion 185a-2 of the source/drain contact 185a, the second portion 185a-2 extends to the top surface of the backside via 115 and forms an electrical connection therebetween. The bottom surface of the second portion 185a-2 is in contact with the dielectric liner 112 of the isolation structure 110, and a sidewall of the second portion 185a-2 is in contact with the dielectric layer of the isolation structure 110. The sidewall of the dielectric strip 120a and the bottom surface of the silicide layer 155 are in contact with the second portion 185a-2. In some embodiments, the bottom surface of the second portion 185a-2 is lower than the topmost surfaces of the isolation structures 110 and the top surface of the dielectric strip 120a, and is lower than the bottom surface of the first portion 185a-1.

With respect to the source/drain contact 185b of FIG. 1D, the source/drain contact 185b at least includes a first portion 185b-1 at the first side of the epitaxy structure 150b close to the epitaxy structure 150a, and a second portion 185b-2 disposed over the epitaxy structure 150b, in which the second portion 185b-2 is connected to the first portion 185b-1. That is, in the cross-sectional view of FIG. 1D, the source/drain contact 185b only covers two sides of the epitaxy structure 150b (e.g., one sidewall and the top surface of epitaxy structure 150b). In greater detail, the first portion 185b-1 extends between the epitaxy structure 150b and the dummy fin 160, the second portion 185b-2 extends between through the ILD layer 180, the ESL 178, and the dielectric layer 176.

With respect to the first portion 185b-1 of the source/drain contact 185b, the bottom surface of the first portion 185b-1 is in contact with the dielectric liner 112 and the dielectric layer 114 of the isolation structure 110. With respect to the second portion 185b-2 of the source/drain contact 185b, the sidewall of the second portion 185b-2 close to the source/drain contact 185a is in contact with the dielectric layer 176, while the sidewall of the second portion 185b-2 distal to the source/drain contact 185a is in contact with the CESL 172 and the ILD layer 174. In some embodiments, the CESL 172 and the ILD layer 174 are between the source/drain contact 185b and the dielectric layer 176. In some embodiments, the bottom surface of the first portion 185b-1 of the source/drain contact 185b is higher than the bottom surface of the second portion 185a-2 of the source/drain contact 185a.

In some embodiments, the source/drain contacts 185a, 185b include a liner and a filling metal. The liner is between the filling metal and the underlying source/drain structures 150a, 150b. In some embodiments, the liner assists with the deposition of a filling metal and helps to reduce diffusion of a material of the filling metal through the gate spacers 140. In some embodiments, the liner includes titanium (Ti), titanium nitride (TiN), tantalum (Ta), tantalum nitride (TaN), or another suitable material. The filling metal includes a conductive material, such as tungsten (W), copper (Cu), aluminum (Al), ruthenium (Ru), cobalt (Co), molybdenum (Mo), nickel (Ni), or another suitable conductive material(s).

The integrated circuit 100a further includes a dielectric layer 188 disposed over the ILD layer 180 and over the source/drain contacts 185a, 185b, and a dielectric layer 192 disposed over the dielectric layer 188. In some embodiments, the materials of the dielectric layers 188 and 192 are similar to the ILD layer 174.

In FIG. 1D, a plurality of conductive vias 190a and 190b extend through the dielectric layer 188. The conductive via 190a is in contact with the source/drain contact 185a, and the conductive via 190b is in contact with the source/drain contact 185b. In some embodiments, the conductive vias 190a and 190b include a conductive material, such as tungsten (W). Other conductive materials are usable for the conductive vias 190a and 190b, such as copper (Cu), aluminum (Al), ruthenium (Ru), cobalt (Co), molybdenum (Mo), nickel (Ni), or the like.

In FIGS. 1C and 1D, a plurality of metal lines 195 extend through the dielectric layer 192. The conductive via 190a is connected to one of the metal lines 195, and the conductive via 190b is connected to another one of the metal lines 195. In some embodiments, the metal lines 195 include copper (Cu), aluminum (Al), ruthenium (Ru), cobalt (Co), molybdenum (Mo), nickel (Ni), tungsten (W), or the like.

The integrated circuit 100a further includes a dielectric layer 200 disposed on the back side of the dielectric strips 120a, 120b. In greater detail, the dielectric layer 200 is in contact with bottom surfaces of the isolation structures 110. In some embodiments, the material of the dielectric layer 200 is similar to the ILD layer 174.

The integrated circuit 100a further includes a metal line 210 extending through the dielectric layer 200. In some embodiments, the metal line 210 extends along the bottom surfaces of the dielectric strips 120a, 120b, the bottom surfaces of the dielectric liner 112 of the isolation structures 110, and the bottom surface of the backside via 115. In some embodiments, the metal line 210 includes copper (Cu), aluminum (Al), ruthenium (Ru), cobalt (Co), molybdenum (Mo), nickel (Ni), tungsten (W), or the like. In some embodiments, the metal line 210 is capable of functioning as a power rail (e.g., VDD or VSS) at the backside of the integrated circuit 100a, and thus the metal line 210 is interchangeably referred to as a backside power line or a backside power rail. In some embodiments when the metal line 210 acts as a power rail, the source/drain contact 185a is referred to as source contact, and the epitaxy structure 150a is referred to as source epitaxy structure.

In some embodiments of the present disclosure, the backside via 115 is provided between the dielectric strips 120a, 120b, and the source/drain contact 185a has a portion extending to the backside via 115, such that the metal line 210 at the back side of the dielectric strips 120a, 120b is electrically connected to the metal lines 195 at the front side of the dielectric strips 120a, 120b. That is, a conductive path between the metal line 210 at the back side of the dielectric strips 120a, 120b and the metal lines 195 at the front side of the dielectric strips 120a, 120b is able to bypass the epitaxy structure 150a with higher resistance, and the resistance between the metal line 210 and the metal lines 195 are able to be reduced. This will further improve the device performance and provide routing flexibility.

FIGS. 2A to 29C illustrate a method in various stages of fabricating the integrated circuit 100a of FIGS. 1A to 1D in accordance with some embodiments of the present disclosure. FIGS. 2A-29A have the same cross-section as FIG. 1B; FIGS. 2B-29B have the same cross-section as FIG. 1C; and FIGS. 2C-29C have the same cross-section as FIG. 1D.

Figure 2B:
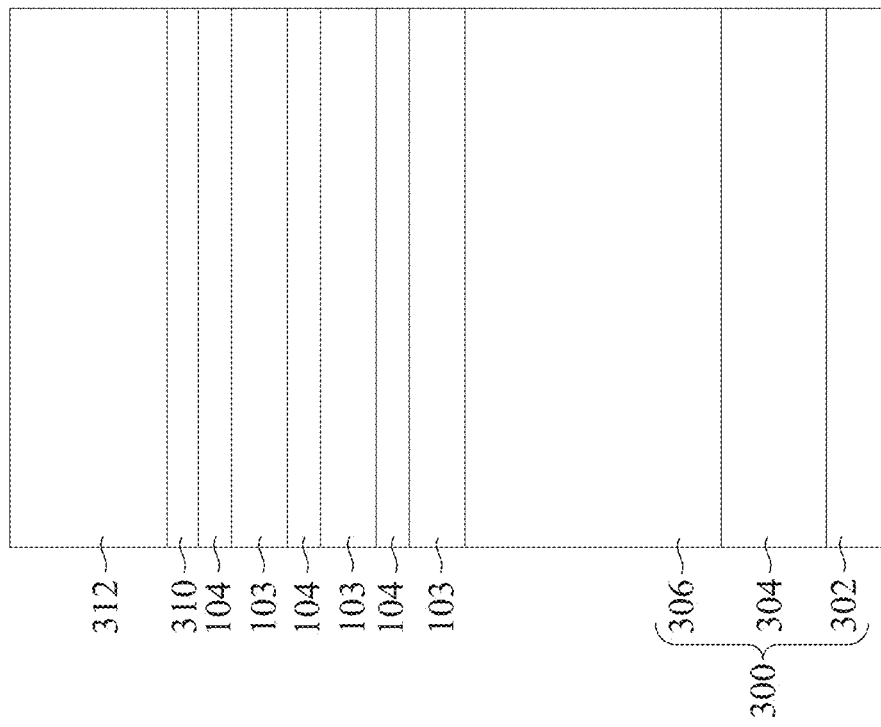
Figure 2A:
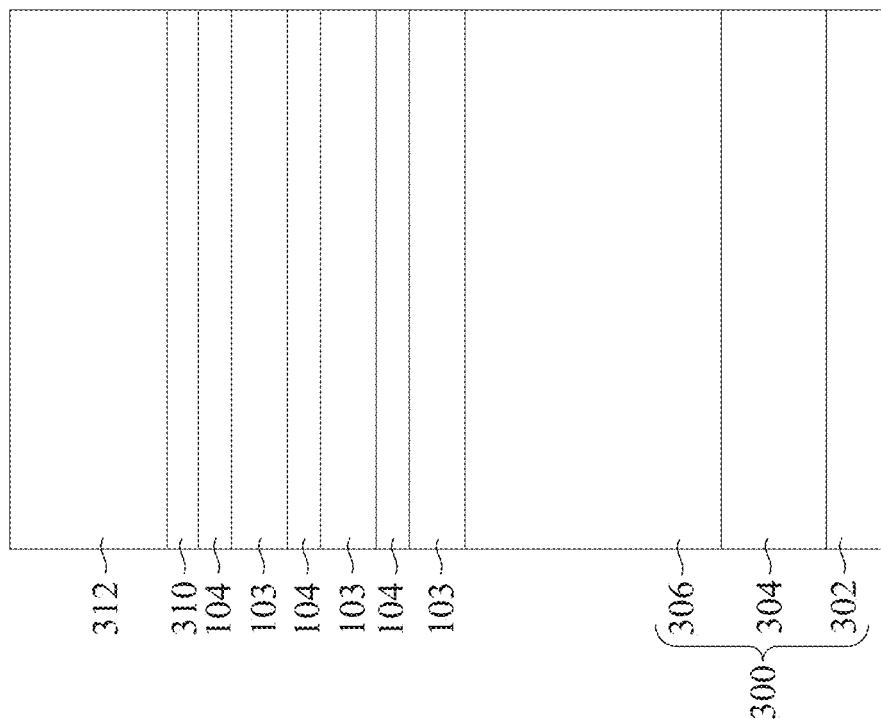

Reference is made to FIGS. 2A to 2C. A substrate 300 is shown. In some embodiments, the substrate 300 includes a semiconductor-on-insulator (SOI) substrate. In some embodiments, the SOI substrate includes a buried oxide (BOX) layer formed by a process such as separation by implanted oxygen (SIMOX), and/or other suitable processes. In the example of FIGS. 2A to 2C, the substrate 300 is an SOI substrate including a bulk silicon layer 302, an oxide layer 304, and a semiconductor layer 306. The oxide layer 304 is a buried oxide (BOX) layer. In some embodiments, the BOX layer is silicon dioxide ($SiO_2$). In some embodiments, the semiconductor layer 306 includes silicon. In some embodiments, the semiconductor layer 306 is suitably doped with n-type and/or p-type dopants.

A plurality of semiconductor layers 103 and semiconductor layers 104 are alternately deposited over the substrate 300. The semiconductor layers 103 and the semiconductor layers 104 have different materials and/or components, such that the semiconductor layers 103 and the semiconductor layers 104 have different etching rates. In some embodiments, the semiconductor layers 103 include SiGe. The germanium percentage (atomic percentage concentration) of the semiconductor layers 103 is in the range between about 10 percent and about 20 percent, while higher or lower germanium percentages are possible. One of ordinary skill in the art would understand, however, that the values recited throughout the description are examples, and are changeable to different values. For example, the semiconductor layers 103 includes $Si_{0.8}Ge_{0.2}$ or $Si_{0.9}Ge_{0.1}$, in which the proportion between Si and Ge vary from embodiments, and the disclosure is not limited thereto. In some embodiments, the semiconductor layers 104 is pure silicon layers that are free of germanium. In some embodiments, the semiconductor layers 104 include substantially pure silicon layers, for example, with a germanium percentage lower than about 1 percent. In some embodiments, the semiconductor layers 103 have a higher germanium atomic percentage concentration than the semiconductor layers 104. In some embodiments, the semiconductor layers 103 and 104 are formed by chemical vapor deposition (CVD), molecular beam epitaxy (MBE), or other suitable process(es). In some embodiments, the semiconductor layers 103 and 104 are formed by an epitaxy growth process, and thus the semiconductor layers 103 and 104 are also referred to as epitaxial layers in this content.

Subsequently, a pad layer 310 and a mask layer 312 are formed over the semiconductor layers 103 and 104. In greater detail, the pad layer 310 is deposited over the topmost semiconductor layer 104, and the mask layer 312 is deposited over the pad layer 310. The pad layer 310 is a thin film having silicon oxide formed, for example, using a thermal oxidation operation. The pad layer 310 acts as an adhesion layer between the semiconductor layer 104 and the mask layer 312. In some embodiments, the mask layer 312 includes silicon nitride, for example, using low-pressure chemical vapor deposition (LPCVD) or plasma enhanced chemical vapor deposition (PECVD). The mask layer 312 is used as a hard mask during subsequent patterning operations.

Figures 3A, 3B:
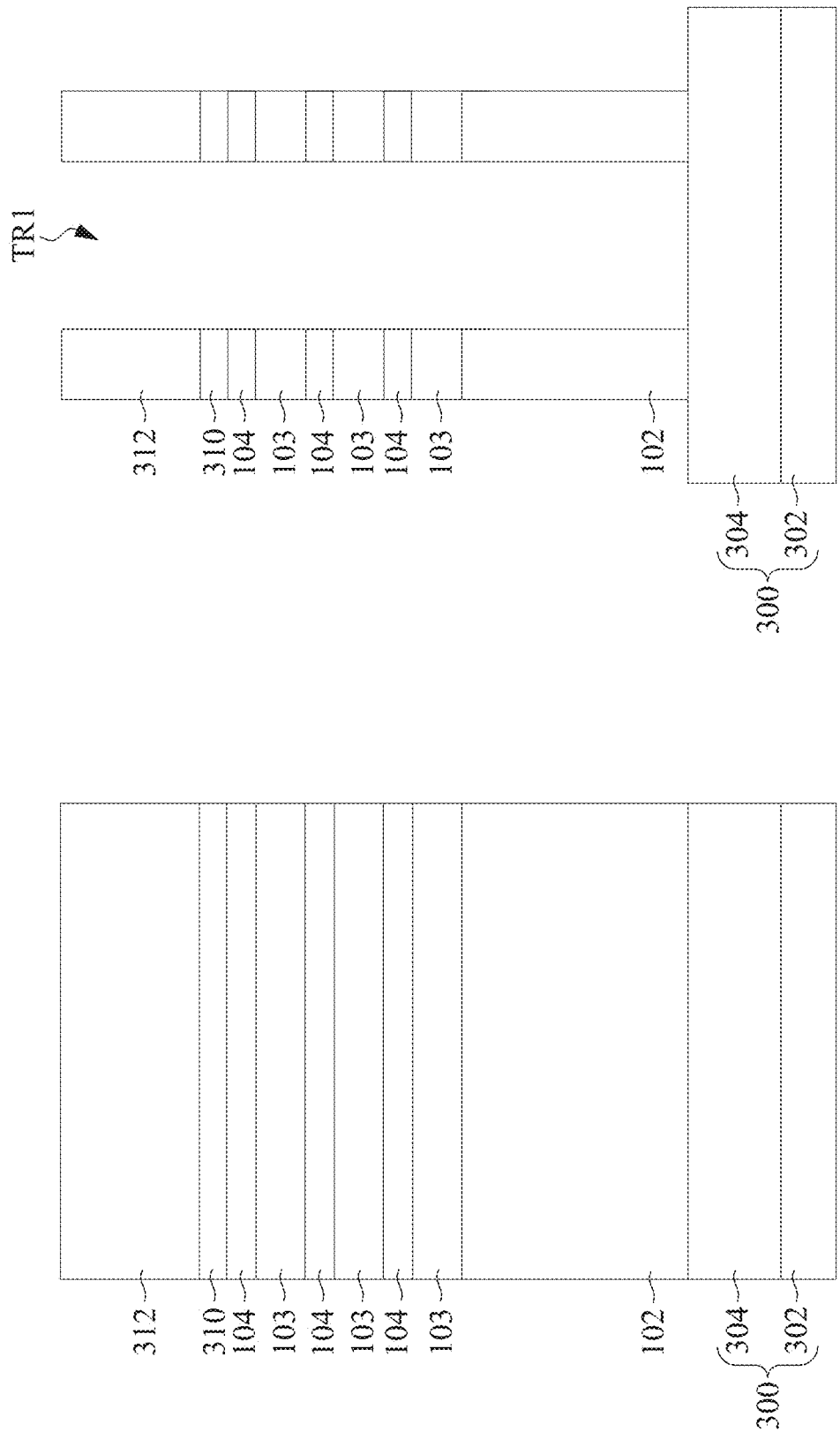

Reference is made to FIGS. 3A to 3C. The semiconductor layers 103, 104 and the semiconductor layer 306 are patterned to form trenches TR1. The trenches TR1 expose the top surface of the oxide layer 304. In some embodiments, the semiconductor layers 103, 104 and the semiconductor layer 306 are patterned using suitable processes including photolithography and etch processes. The remaining portions of semiconductor layer 306 are referred to as semiconductor strips 102 in the following discussion. In some embodiments, the semiconductor strips 102 are referred to as fin structures.

Figure 4C:
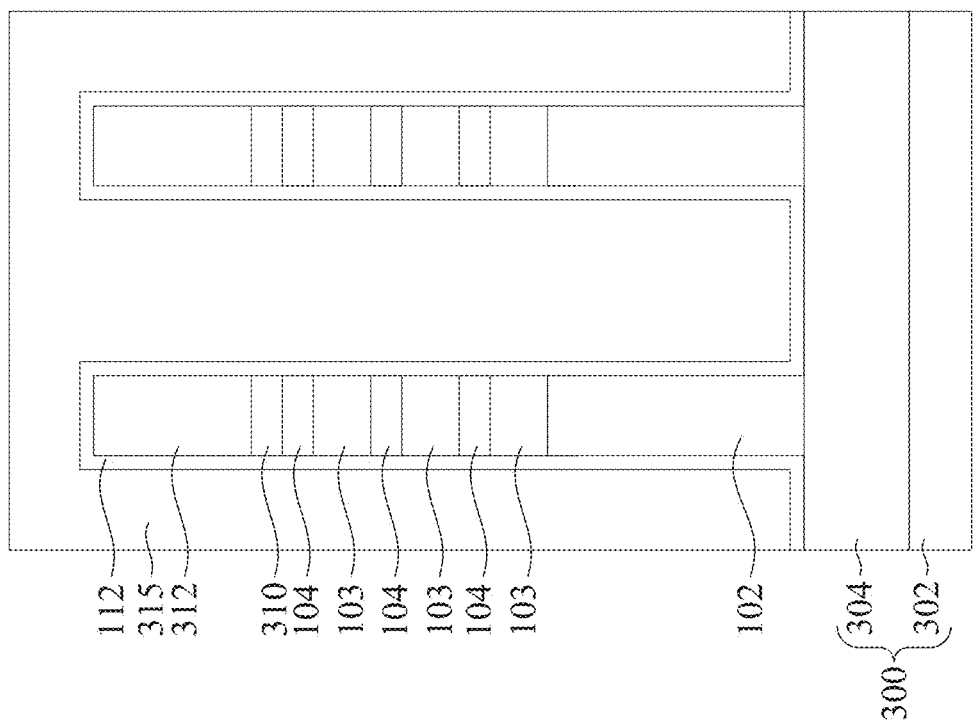

Reference is made to FIGS. 4A to 4C. A dielectric liner 112 is conformally deposited into the trenches TR1, and a conductive material 315 is deposited over the dielectric liner 112. In some embodiments, the dielectric liner 112 is formed to line the exposed surfaces of the mask layer 312, the oxide layer 310, the semiconductor layers 103, 104, the semiconductor strips 102, and the oxide layer 304. In some embodiments, the dielectric liner 112 is formed by a process such as CVD, PVD, ALD, or another suitable deposition process (es). In some embodiments, the conductive material 315 is formed by a process such as CVD, PVD, ALD, or another suitable deposition process(es).

Figures 5A, 5B:
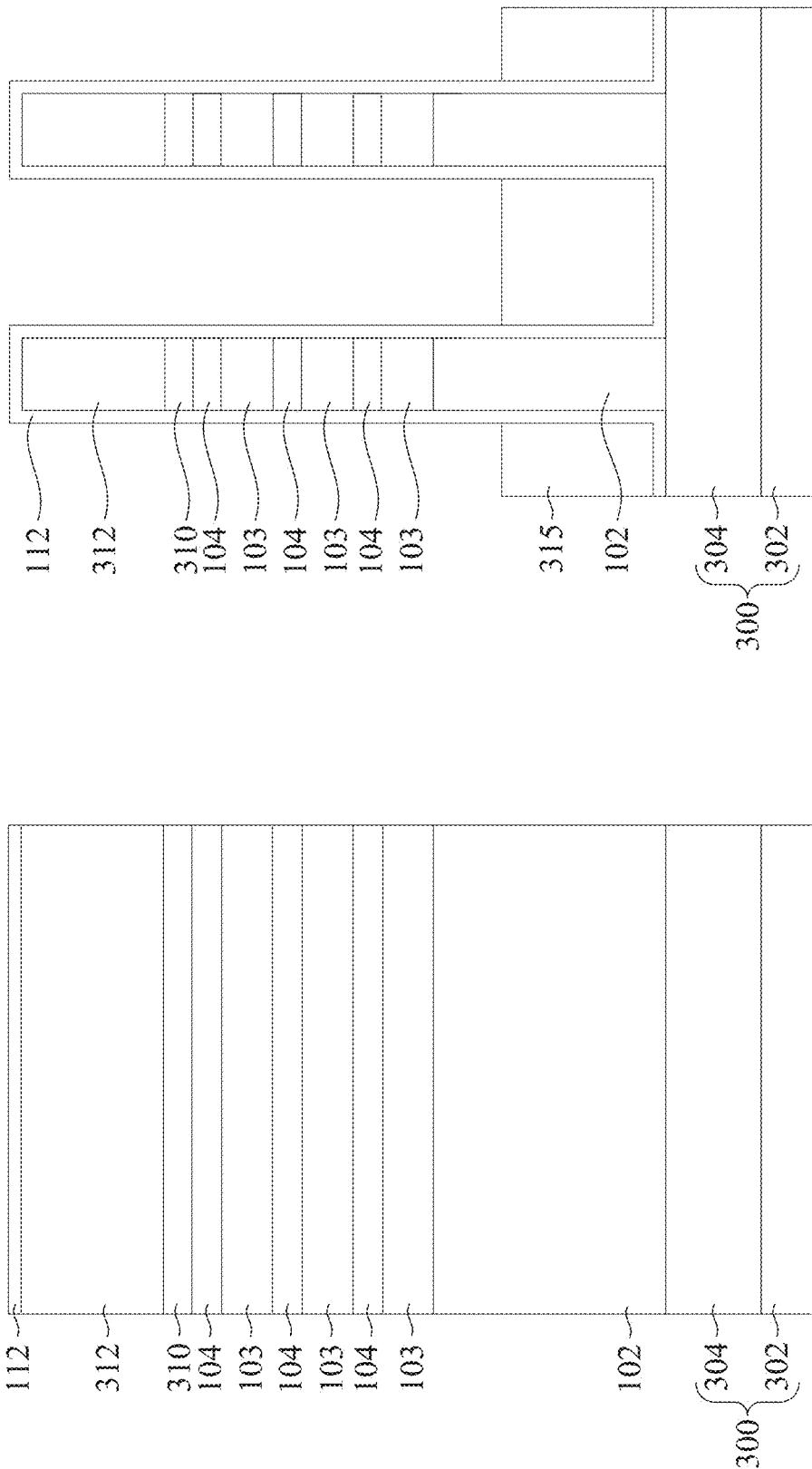

Reference is made to FIGS. 5A to 5C. The conductive material 315 is etched back. In some embodiments, an etching process, such as wet etch, dry etch, or combinations thereof, is employed to lower the top surface of the conductive material 315 to a desired position. For example, the conductive material 315 is etched such that the top surface of the conductive material 315 is lower than the top surfaces of the semiconductor strips 102. In some embodiments, the dielectric liner 112 has higher etching resistance to the etching process than the conductive material 315, such that the etching process removes portions of the conductive material 315 while keeping the dielectric liner 112 substantially intact.

Reference is made to FIGS. 6A to 6C. The conductive material 315 is patterned to form a backside via 115. In some embodiments, the conductive material 315 is patterned using suitable processes including photolithography and etch processes. In particular, the conductive material 315 is patterned such that the remaining portion of the conductive material 315 is between the semiconductor strips 102. The remaining portion of the conductive material 315 is referred to as a backside via 115 in the following discussion.

Figure 7B:
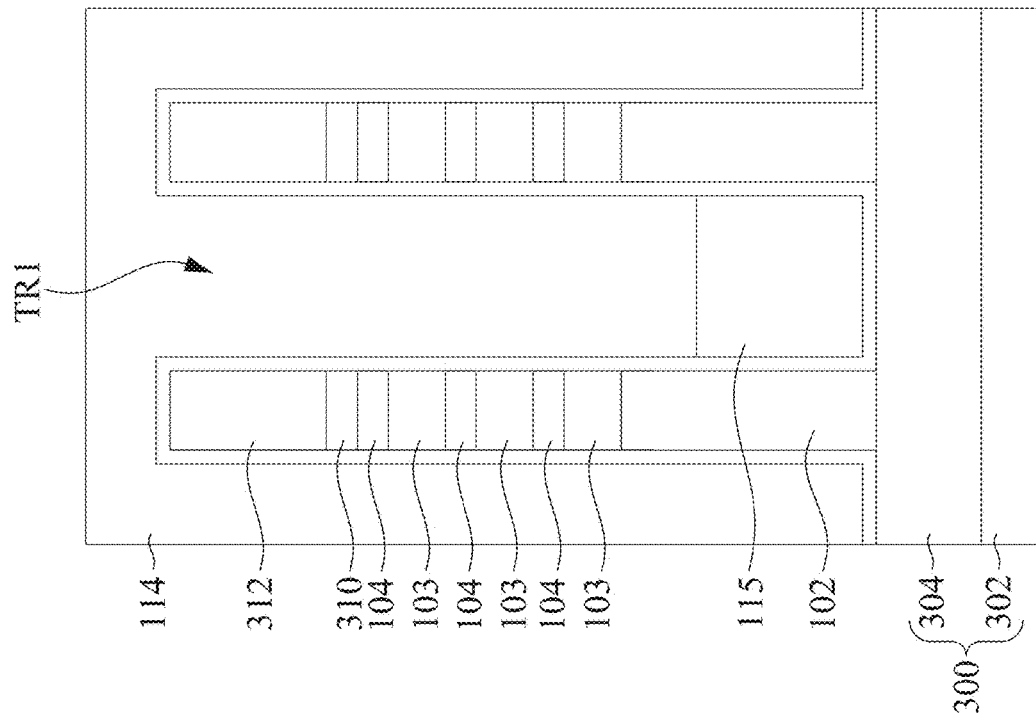
Figure 7A:
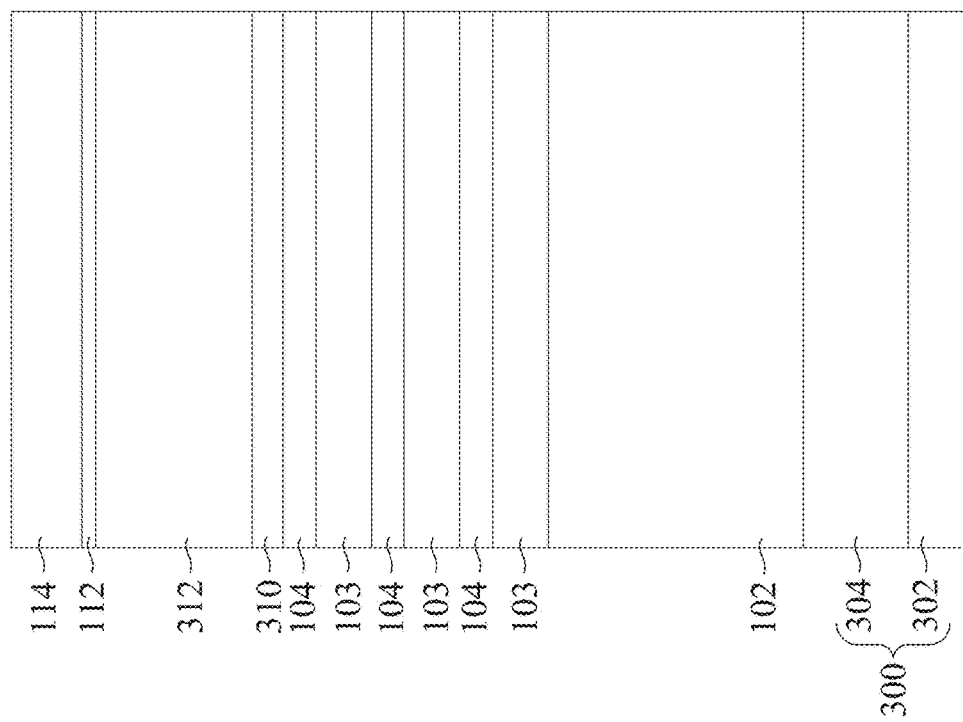
Figure 7C:
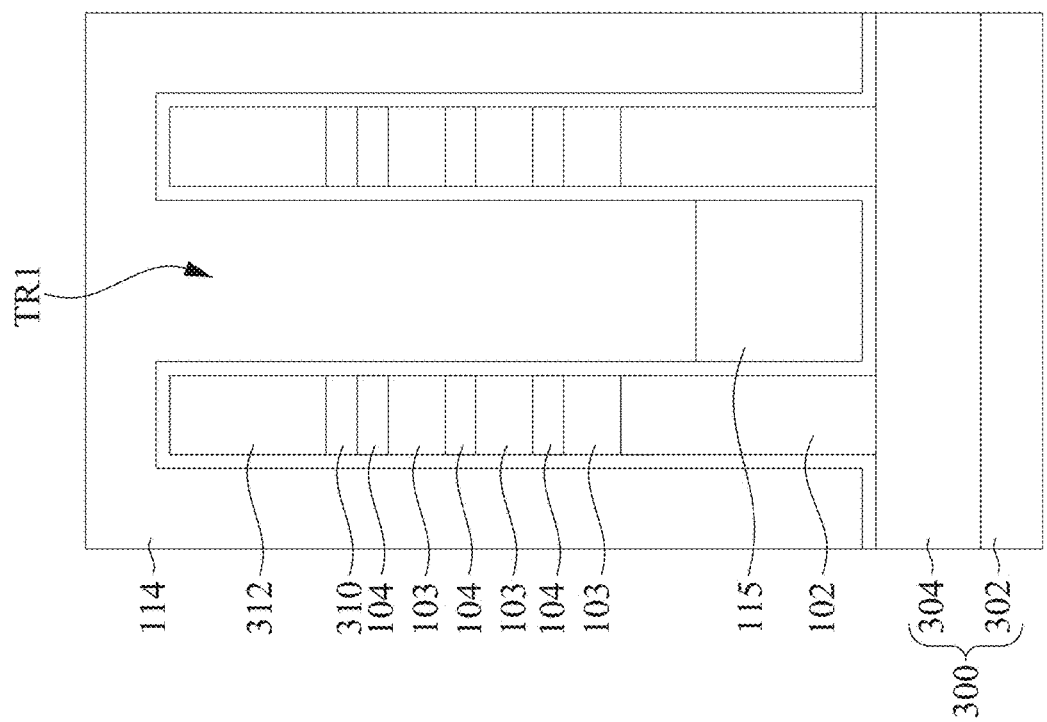

Reference is made to FIGS. 7A to 7C. A dielectric layer 114 is deposited over the backside via 115. In some embodiments, the dielectric layer 114 is deposited filling the trenches TR1 and covering the top surface of the backside via 115. In some embodiments, the dielectric layer 114 is formed by a process such as CVD, PVD, ALD, or another suitable deposition process(es).

Figure 8C:
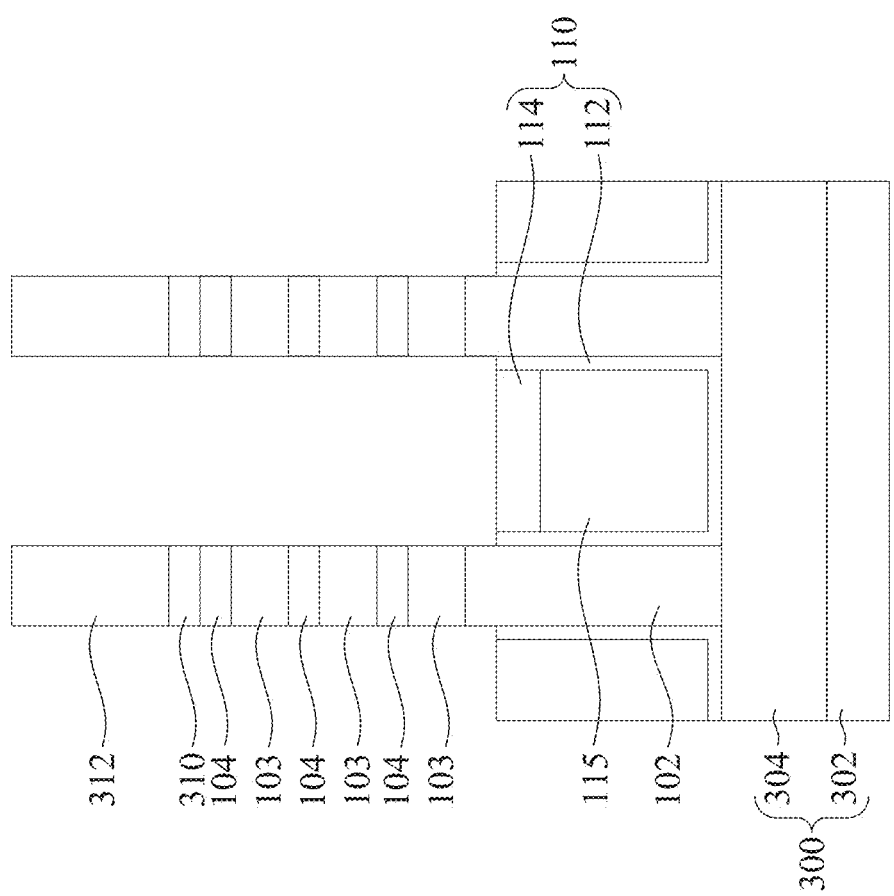

Reference is made to FIGS. 8A to 8C. The dielectric layer 114 and the dielectric liner 112 are etched back. In some embodiments, portions of the dielectric layer 114 and the dielectric liner 112 are removed to expose the mask layer 312, sidewalls of the oxide layer 310, sidewalls of the semiconductor layers 103, 104, and sidewalls of the semiconductor strips 102. The remaining portions of the dielectric layer 114 and the dielectric liner 112 are collectively referred to as isolation structures 110. In the cross-section of FIGS. 8B and 8C, the backside via 115 is embedded in the isolation structures 110. That is, at least four sides of the backside via 115 are covered by the isolation structures 110 at this stage. In some embodiments, the dielectric layer 114 and the dielectric liner 112 are etched back by wet etch, dry etch, or combinations thereof.

Figure 9B:
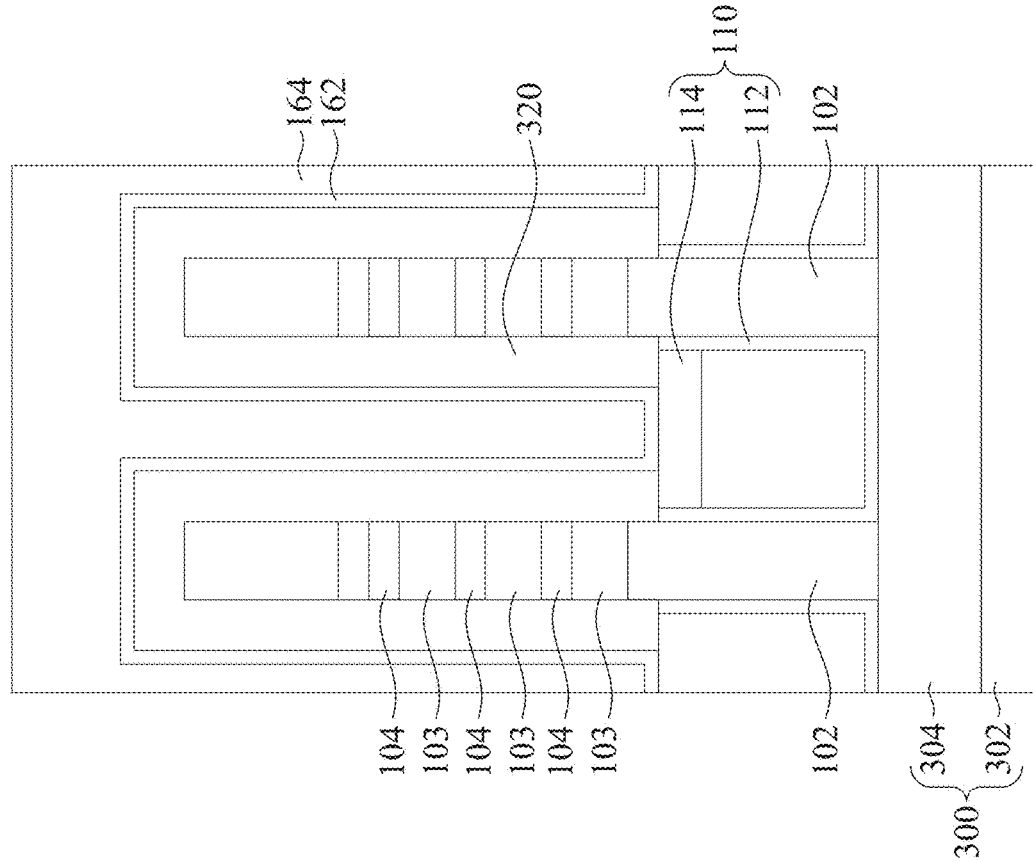
Figure 9A:
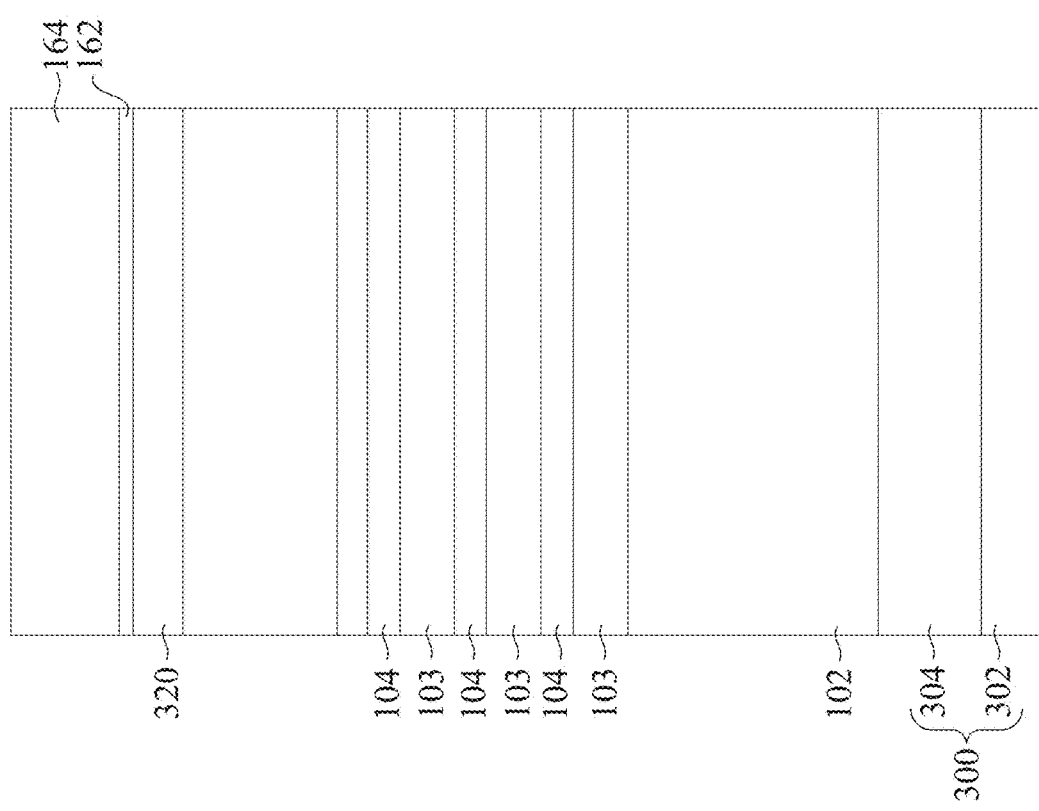
Figure 9C:
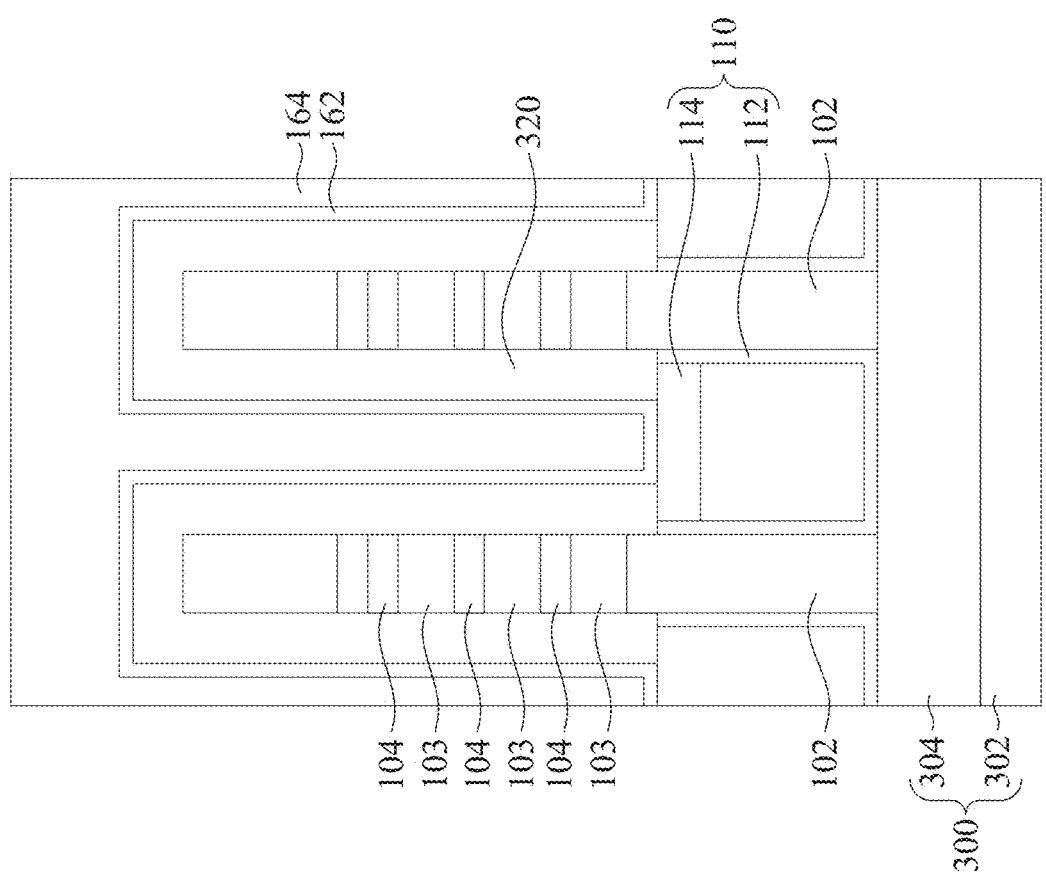

Reference is made to FIGS. 9A to 9C. A semiconductor layer 320 is formed over the semiconductor layers 103, 104, a dielectric liner 162 is formed over the semiconductor layer 320, and a dielectric material 164 is formed over the dielectric liner 162. In some embodiments, the semiconductor layer 320 is deposited over the substrate 300, followed by a patterning process to remove unwanted portions of the semiconductor layer 320. For example, portions of the semiconductor layer 320 are removed such that at least portions of the top surfaces of the isolation structure 110 are not uncovered by the semiconductor layer 320. Next, the dielectric liner 162 and the dielectric material 164 are sequentially deposited over the semiconductor layer 320. The dielectric liner 162 at least lines the exposed surfaces of the isolation structure 110. In some embodiments, the semiconductor layer 320 is formed by CVD, PVD, ALD, or other suitable deposition processes. The dielectric liner 162 and the dielectric material 164 are formed by CVD, PVD, ALD, or other suitable deposition processes.

Figure 10B:
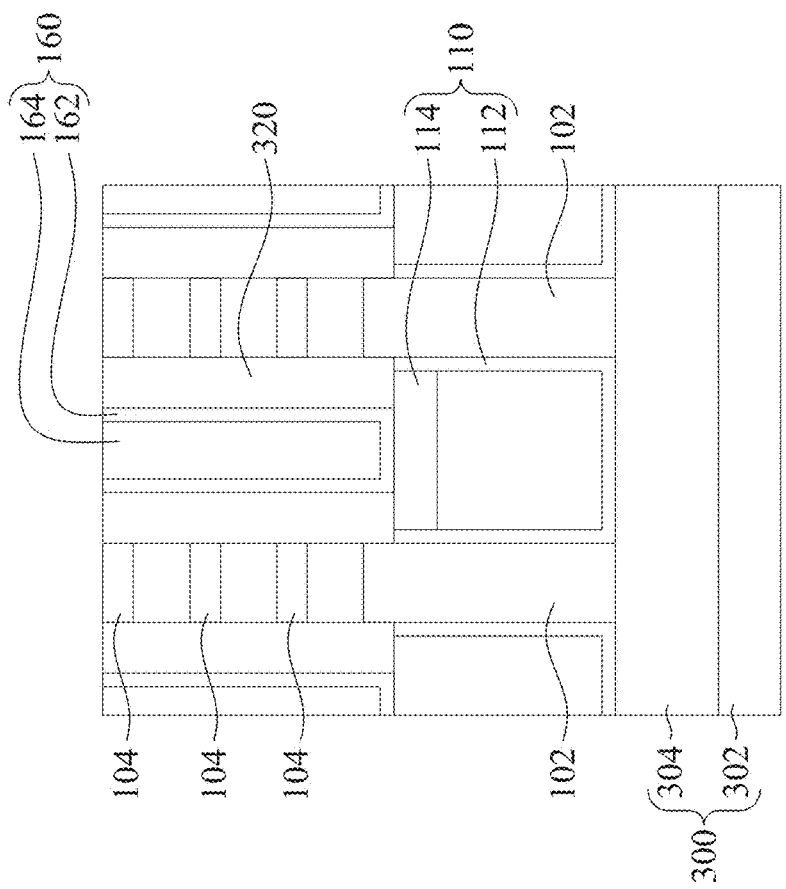
Figure 10A:
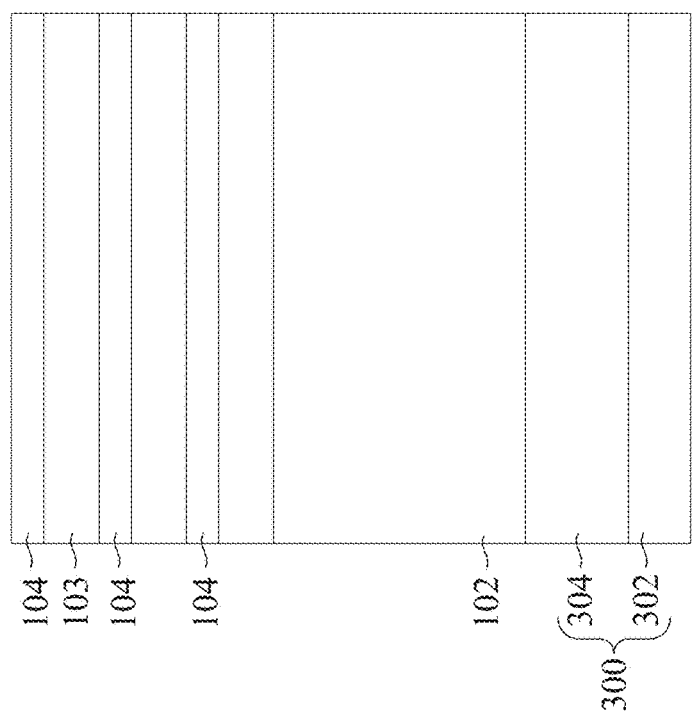
Figure 10C:
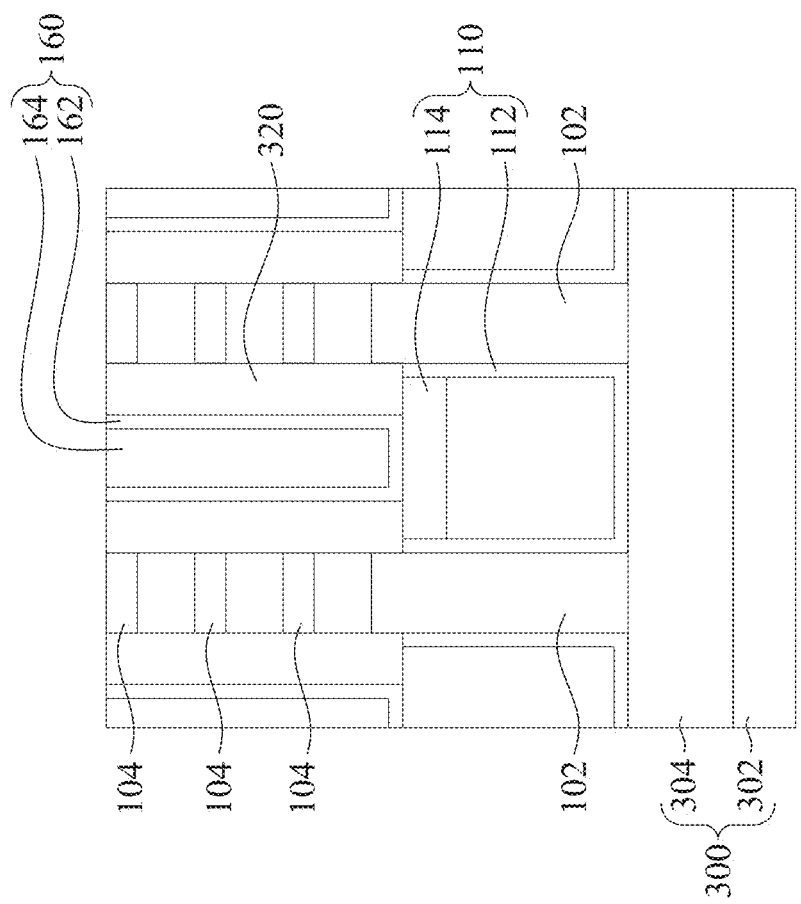

Reference is made to FIGS. 10A to 10C. A CMP process is performed until the top surfaces of the semiconductor layers 104 are exposed. In some embodiments, the CMP process is performed to remove the excess material of the semiconductor layer 320, the dielectric liner 162, and the dielectric material 164. After the CMP process, the remaining portions of the dielectric liner 162 and the dielectric material 164 form a plurality of dummy fins 160.

Figures 11A, 11B:
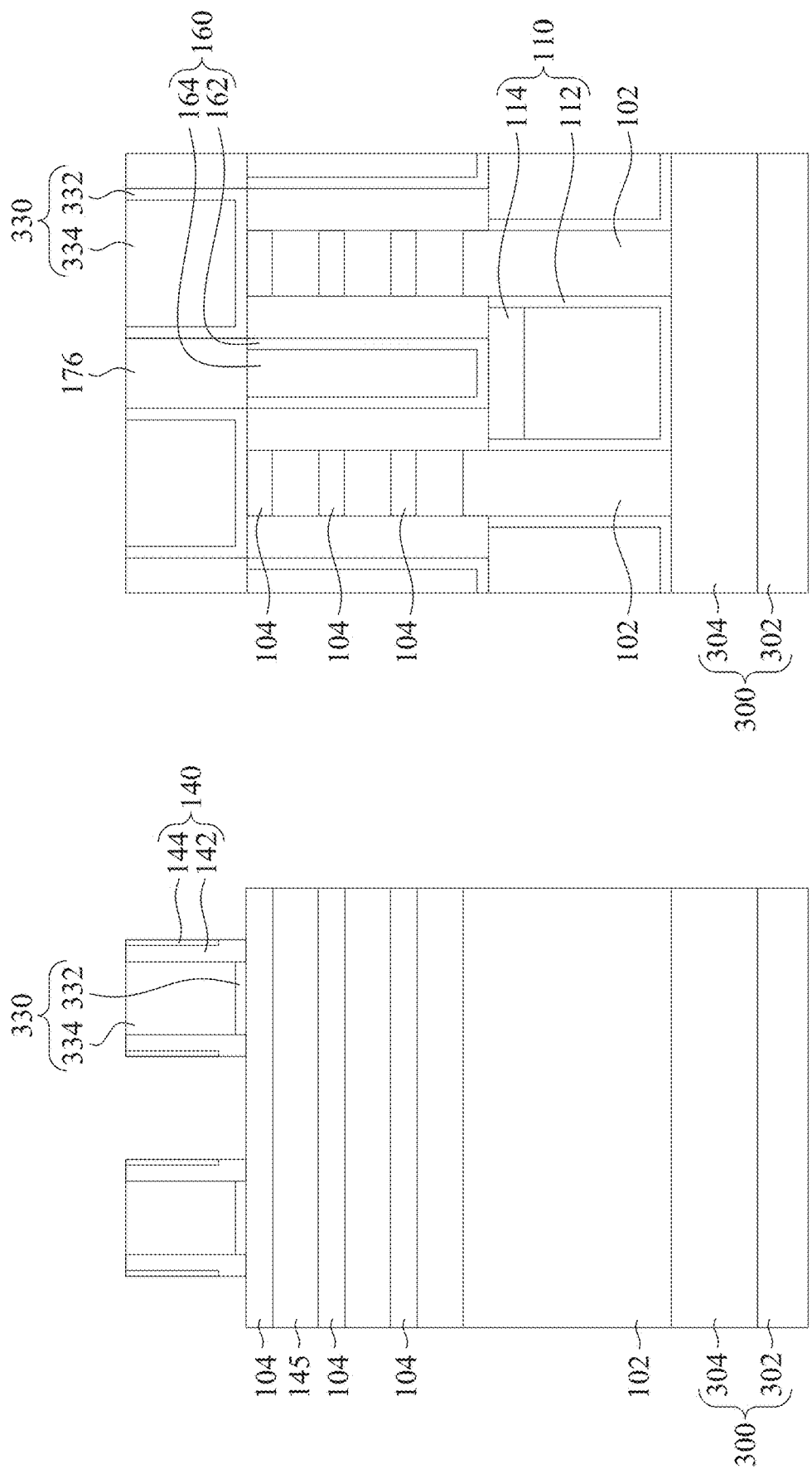
Figure 11C:
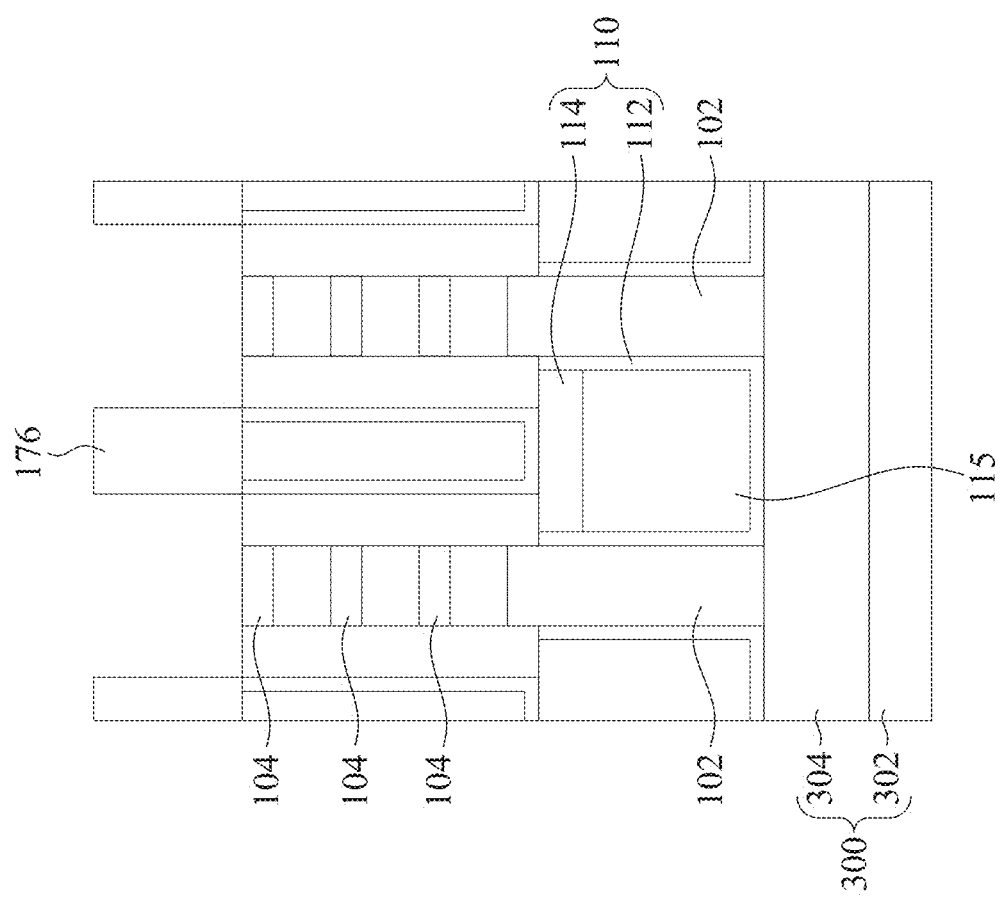

Reference is made to FIGS. 11A to 11C. A dielectric layer 176 is formed over the substrate 100, dummy gate structures 330 are formed over the semiconductor layers 103, 104, and gate spacers 140 are formed on opposite sidewalls of the dummy gate structure 330. In some embodiments, the dielectric layer 176 is formed by, for example, depositing a dielectric material over the substrate 300 and patterning the dielectric material to form the dielectric layer 176. The dielectric layer 176 at least covers the dummy fins 160. In some embodiments, the dummy gate structure 330 is formed by, for example, depositing a gate dielectric layer 332 and a gate electrode 334 over the semiconductor layers 103, 104 and the dielectric layer 176, performing a CMP process until the top surface of the dielectric layer 176 is exposed, and subsequently performing a patterning process. The remaining portions of the gate dielectric layer 332 and the gate electrode 334 are collectively referred to as dummy gate structures 330. In some embodiments, the gate spacers 140 are formed by, for example, depositing a first layer 142 and a second layer 144 blanket over the dummy gate structures 330, and subsequently performing an etching process to remove horizontal portions of the first layer 142 and the second layer 144, such that vertical portions of the first layer 142 and the second layer 144 remain on sidewalls of the dummy gate structures 330.

In some embodiments, the gate dielectric layer 332 includes, for example, silicon oxide, silicon nitride, a combination thereof, or the like, and is deposited or thermally grown according to acceptable techniques. The gate dielectric layer 332 is formed by a suitable process, such as chemical vapor deposition (CVD), physical vapor deposition (PVD), atomic layer deposition (ALD), or any suitable process. The gate electrode 334 includes polycrystalline-silicon (poly-Si) or poly-crystalline silicon-germanium (poly-SiGe). Further, in some embodiments, the gate electrode 334 is doped poly-silicon with uniform or non-uniform doping. The gate electrode 334 is formed by a suitable process, such as chemical vapor deposition (CVD), physical vapor deposition (PVD), atomic layer deposition (ALD), or any suitable process.

Figure 12C:
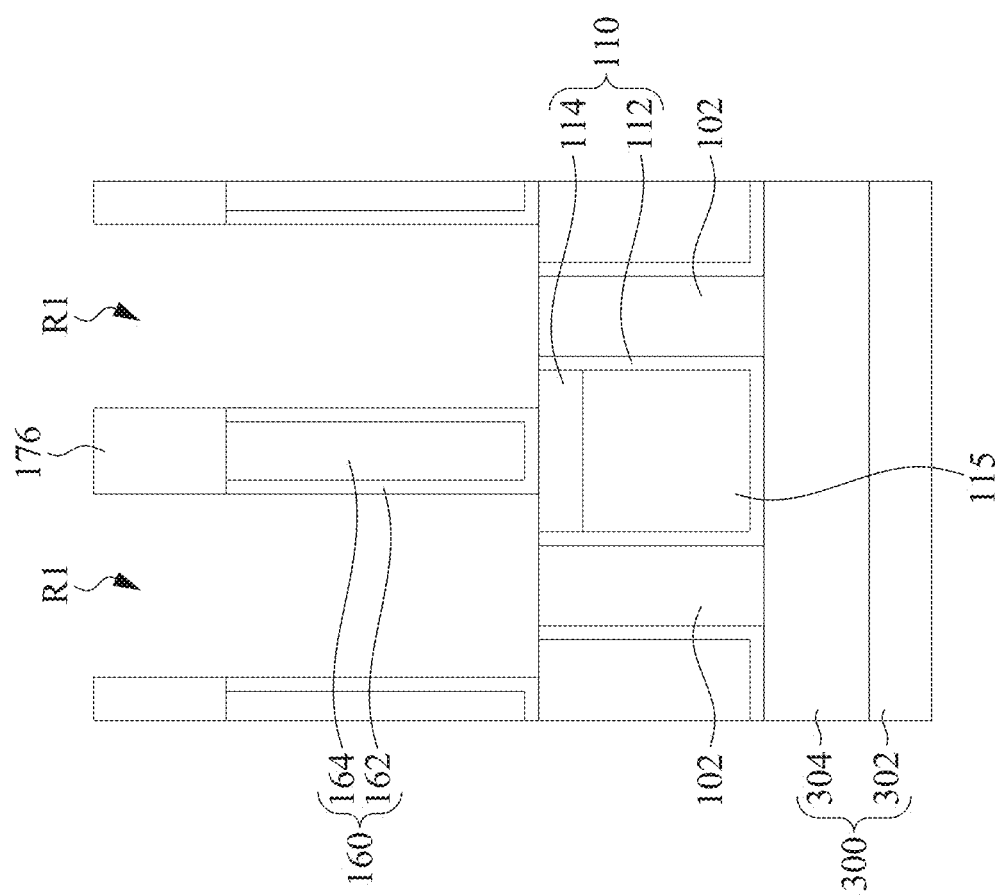

Reference is made to FIGS. 12A to 12C. The semiconductor layers 103, 104 are recessed to form recesses R1, the semiconductor layers 103 are etched, and a plurality of spacer layers 145 are formed between the semiconductor layers 104. In some embodiments, a first etching process is performed to remove portions of the semiconductor layers 103, 104 not covered by the dummy gate structures 330 and the dielectric layer 176 to form the recesses R1. Afterward, a second etch process is performed to laterally shorten the semiconductor layers 103 through the recesses R1, so as to form spaces between two adjacent semiconductor layers 104. Next, spacer layers 145 are formed in the spaces between two adjacent semiconductor layers 104 by a suitable deposition process. For example, the spacer layers 145 is formed by depositing a spacer material blanket over the substrate 300 and subsequently performing a patterning process to remove portions of the spacer material, such that the remaining portions of the spacer material are left in the spaces between two adjacent semiconductor layers 104.

Figure 13C:
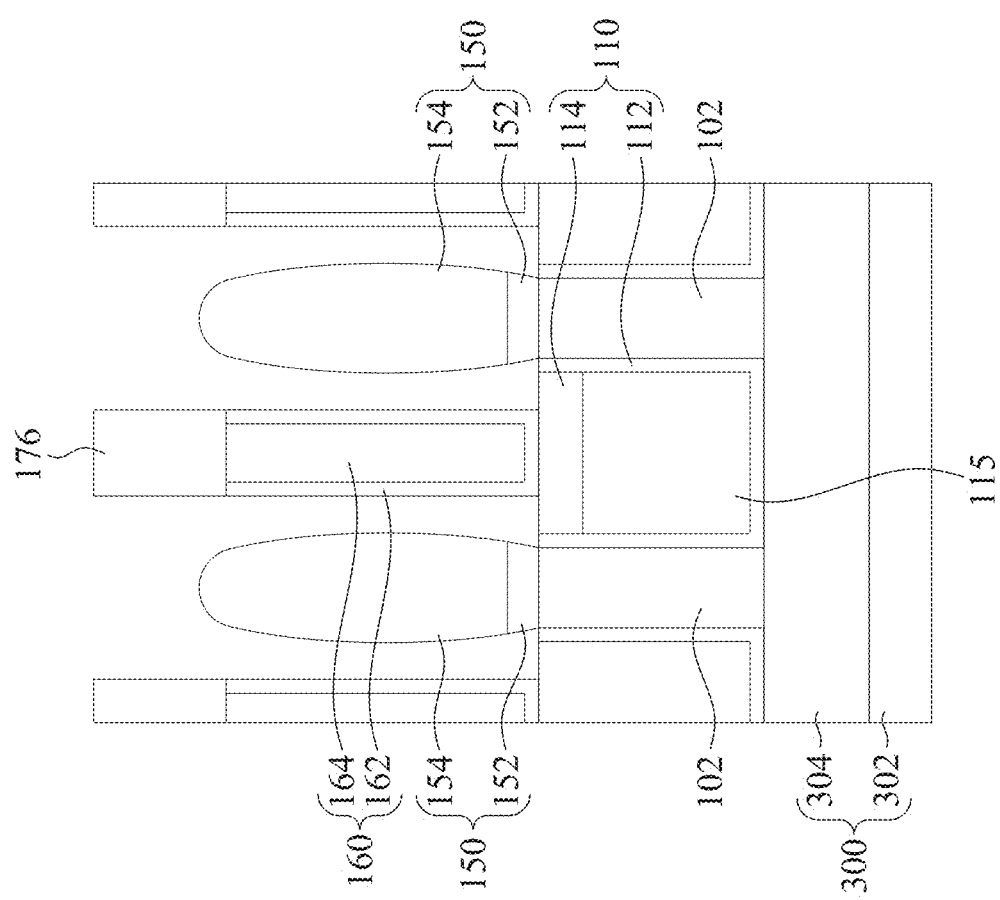

Reference is made to FIGS. 13A to 13C. Epitaxy structures 150 are formed over the semiconductor strips 102 and on opposite sides of the dummy gate structures 330. In some embodiments, each of the epitaxy structures 150 includes a first epitaxial layer 152 and a second epitaxial layer 154 over the first epitaxial layer 152. In some embodiments, the first epitaxial layer 152 and the second epitaxial layer 154 are formed by selective epitaxial growth (SEG).

Figure 14C:
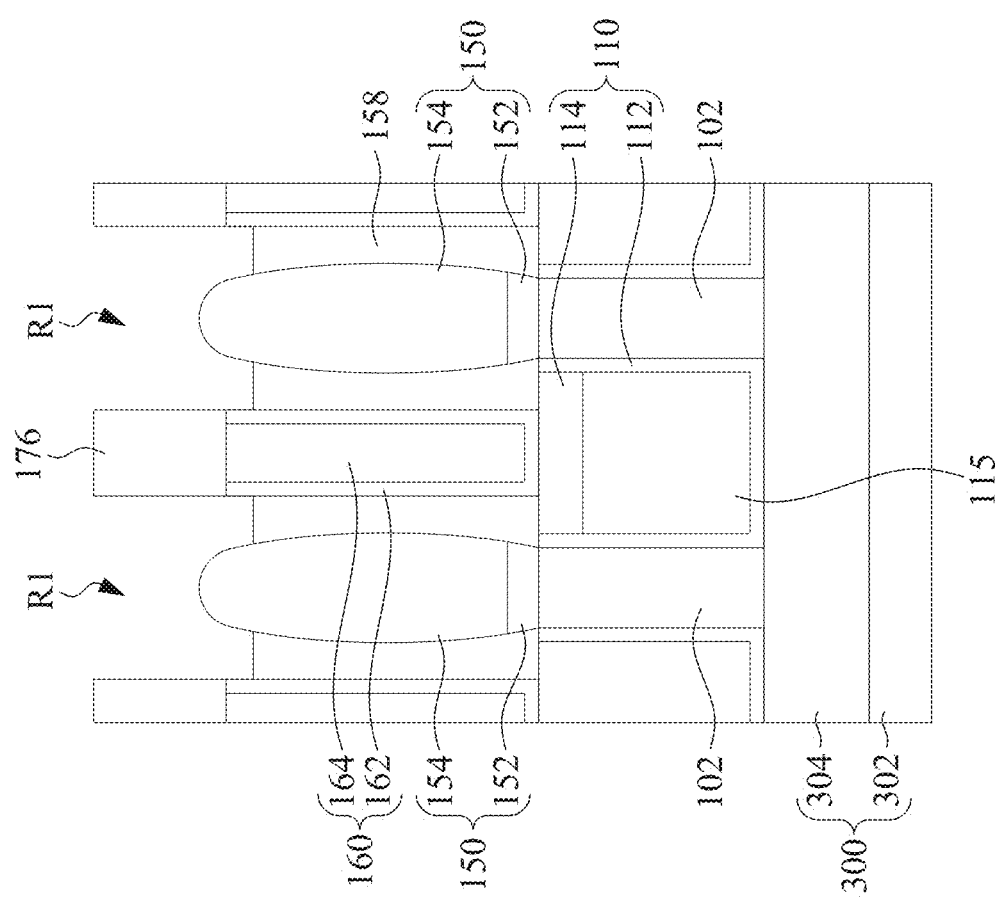

Reference is made to FIGS. 14A to 14C. A dielectric layer 158 is formed at least filling the spaces between the epitaxy structures 150 and the dummy fins 160, as shown in FIG. 14C. In some embodiments, the dielectric layer 158 is formed by, for example, depositing a dielectric material over the substrate 300 and covering the epitaxy structures 150, optionally performing a CMP process to planarize the top surfaces of the dielectric material and the dielectric layer 176, and subsequently performing an etching back process to lower the top surface of the dielectric material. In some embodiments, the top portions of the epitaxy structures 150 protrude from the dielectric layer 176, and sidewalls of the dummy fins 160 are partially exposed by the dielectric layer 176.

Figure 15C:
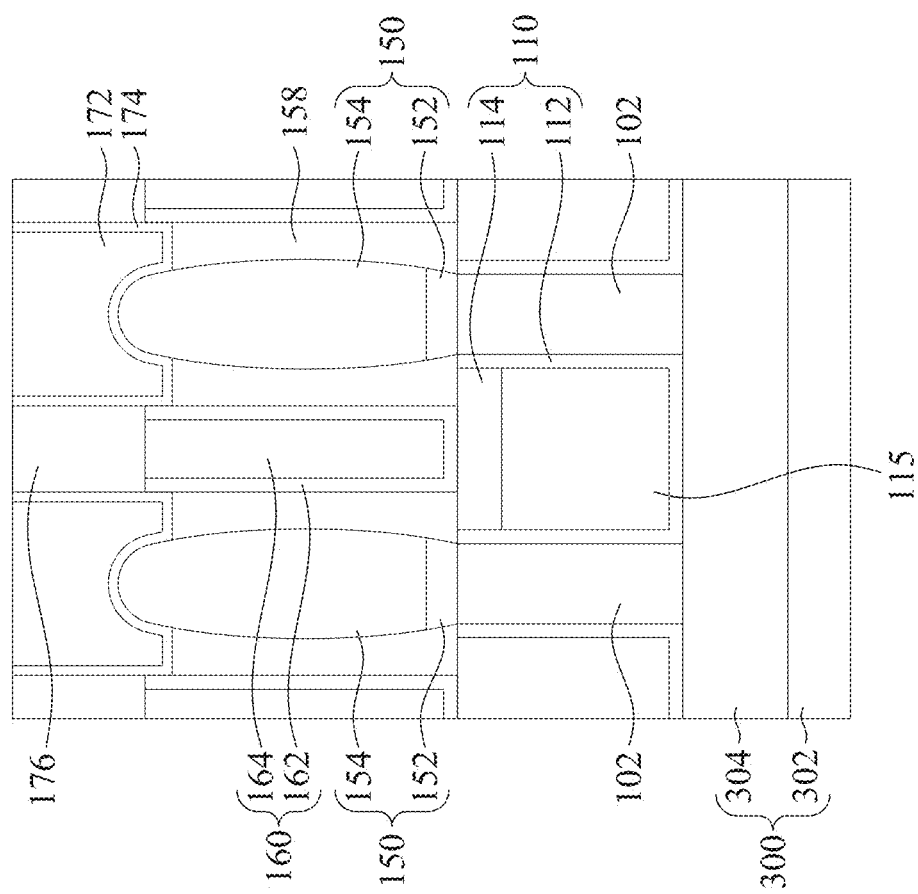

Reference is made to FIGS. 15A to 15C. A contact etch stop layer (CESL) 172 and an interlayer dielectric (ILD) layer 174 are formed over the epitaxy structures 150. In FIG. 15C, the CESL 172 extends from the top surface of the epitaxy structures 150 to the top surface of the dielectric layer 176. In some embodiments, the CESL 172 and the ILD layer 174 are formed by, for example, sequentially depositing a CESL material layer and an ILD material layer over the substrate 300 and subsequently performing a CMP process to remove the excess CESL material layer and ILD material layer until the top surfaces of the dummy gate structures 130 are exposed.

Figure 16B:
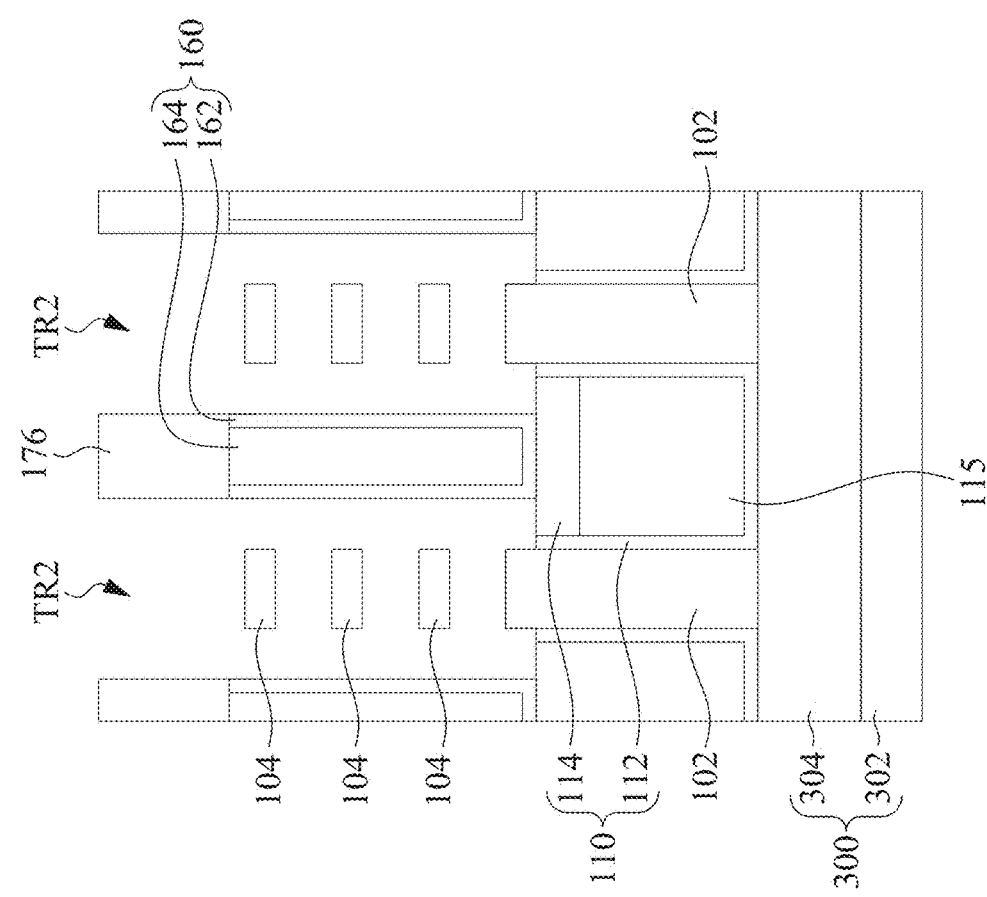
Figure 16A:
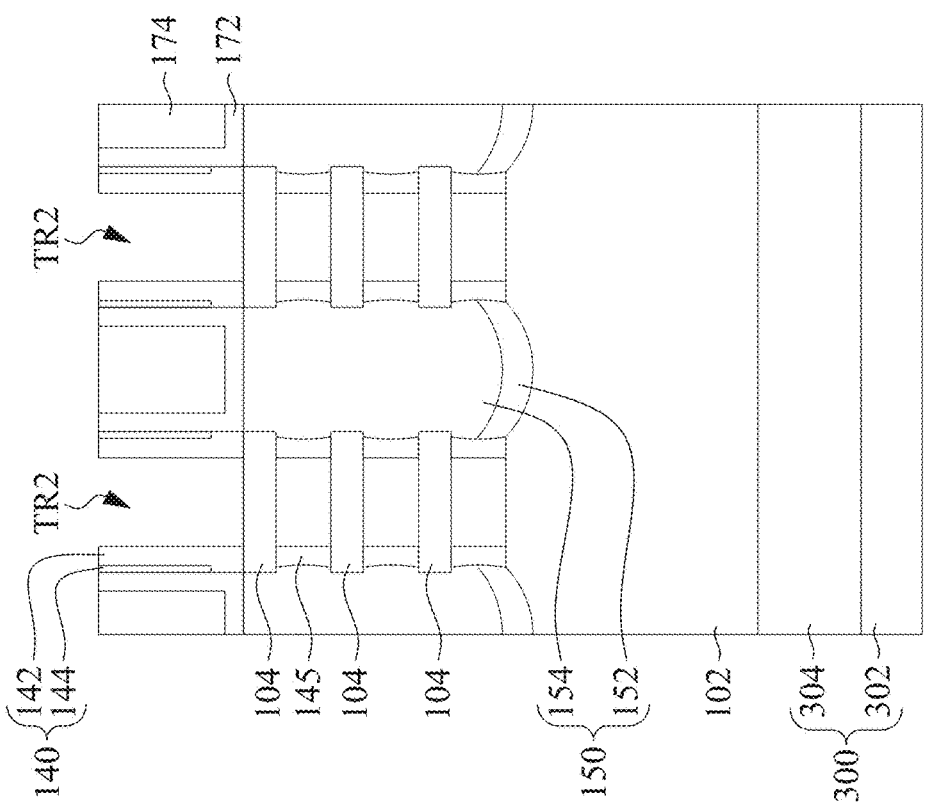
Figure 16C:
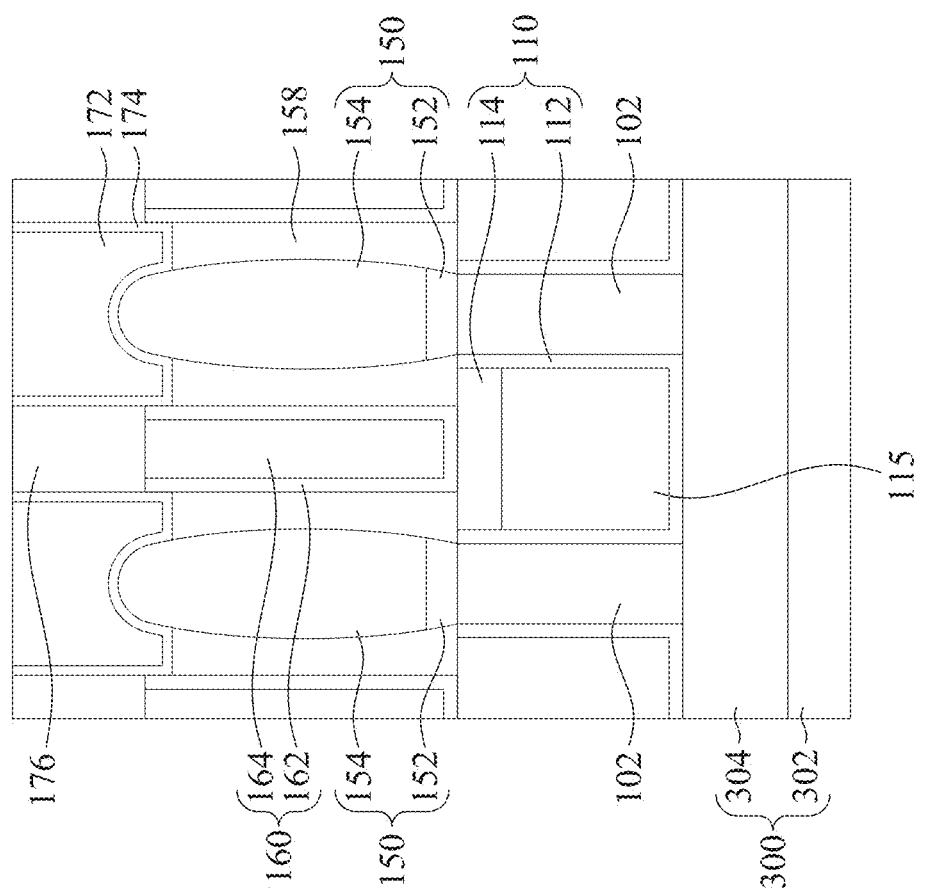

Reference is made to FIGS. 16A to 16C. The dummy gate structures 330, the semiconductor layers 103, and the semiconductor layer 320 are removed to form gate trenches TR2. In FIG. 16A, each gate trench TR2 is between the gate spacers 140. In FIG. 16B, each gate trench TR2 is at least between the dummy fins 160, and the top surfaces of the isolation structures 110 are exposed by the gate trenches TR2. In some embodiments, the gate structures 330 and the semiconductor layers 103 are removed by a suitable process, such as wet etch, dry etch, or combinations thereof.

Figure 17B:
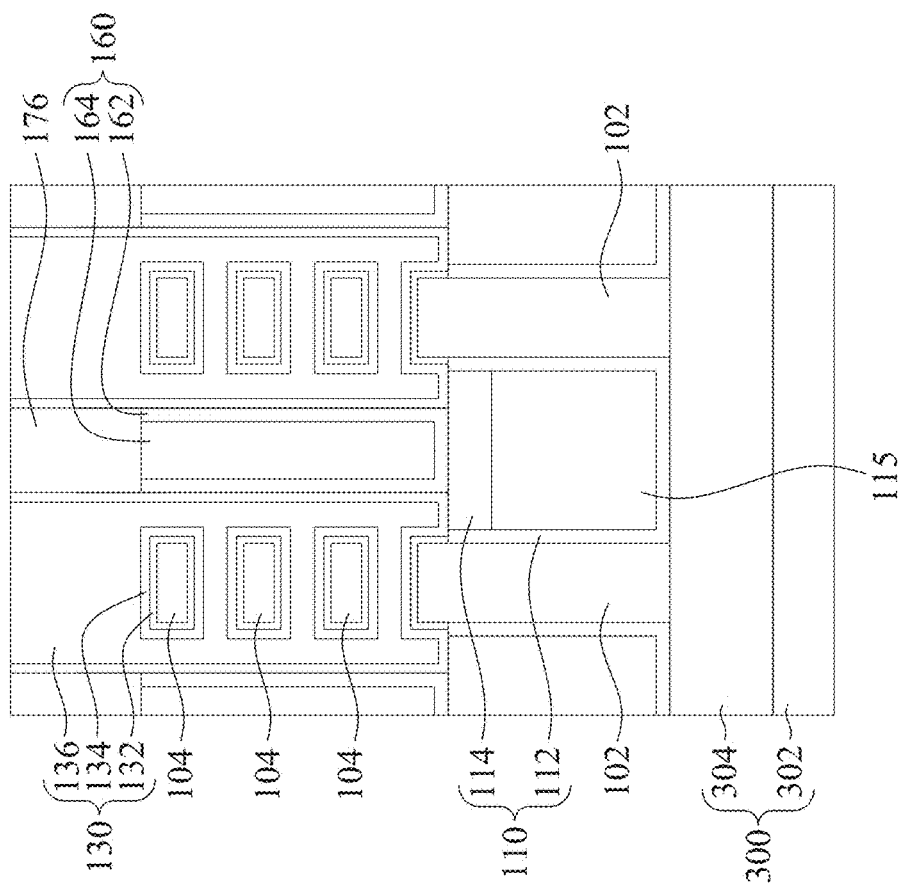
Figure 17A:
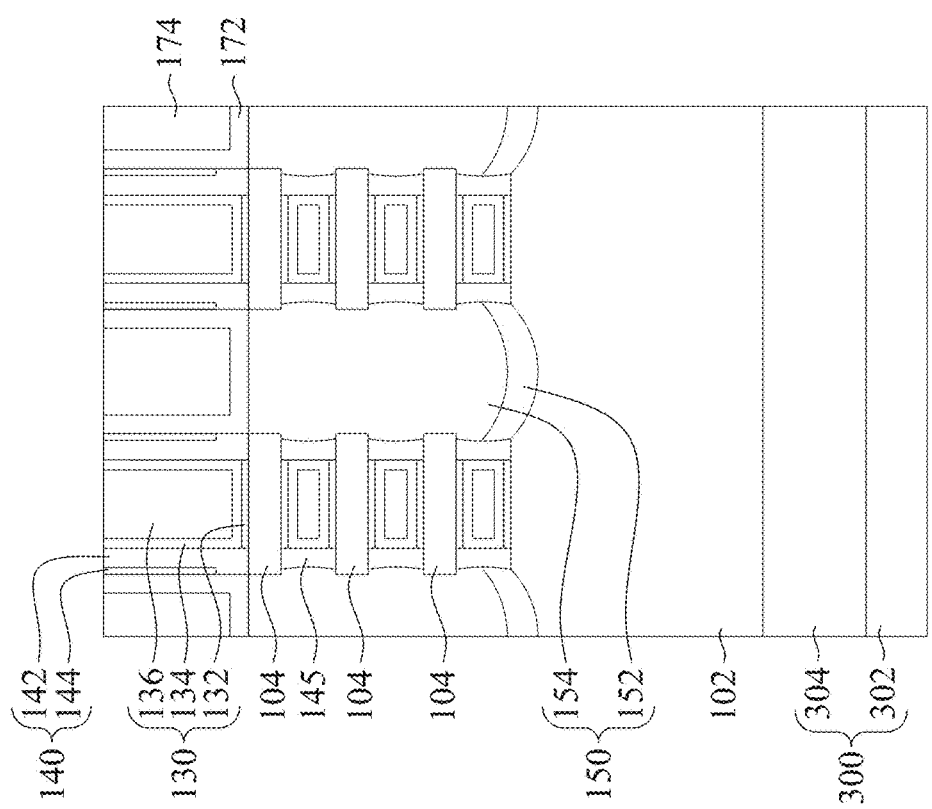

Reference is made to FIGS. 17A to 17C. Metal gate structures 130 are formed in the gate trenches TR2. In some embodiments, the gate structures 130 include an interfacial layer 132, a gate dielectric layer 134 over the interfacial layer 132, and a gate conductive layer 136 over the gate dielectric layer 134. In some embodiments, the gate structures 130 are formed by, for example, forming an interfacial material selectively on the exposed semiconductor layers 104, depositing a gate dielectric material over the interfacial material, depositing a gate conductive material over the gate dielectric material, and subsequently performing a CMP process until the top surface of the ILD layer 174 is exposed. In some embodiments, the interfacial layer 132 is formed by an oxidation process, such as a thermal oxidation process. The gate dielectric layer 134 is formed by PVD, CVD, ALD, or other suitable deposition processes. The gate conductive layer 136 is formed by PVD, CVD, ALD, or other suitable deposition processes.

Figure 18B:
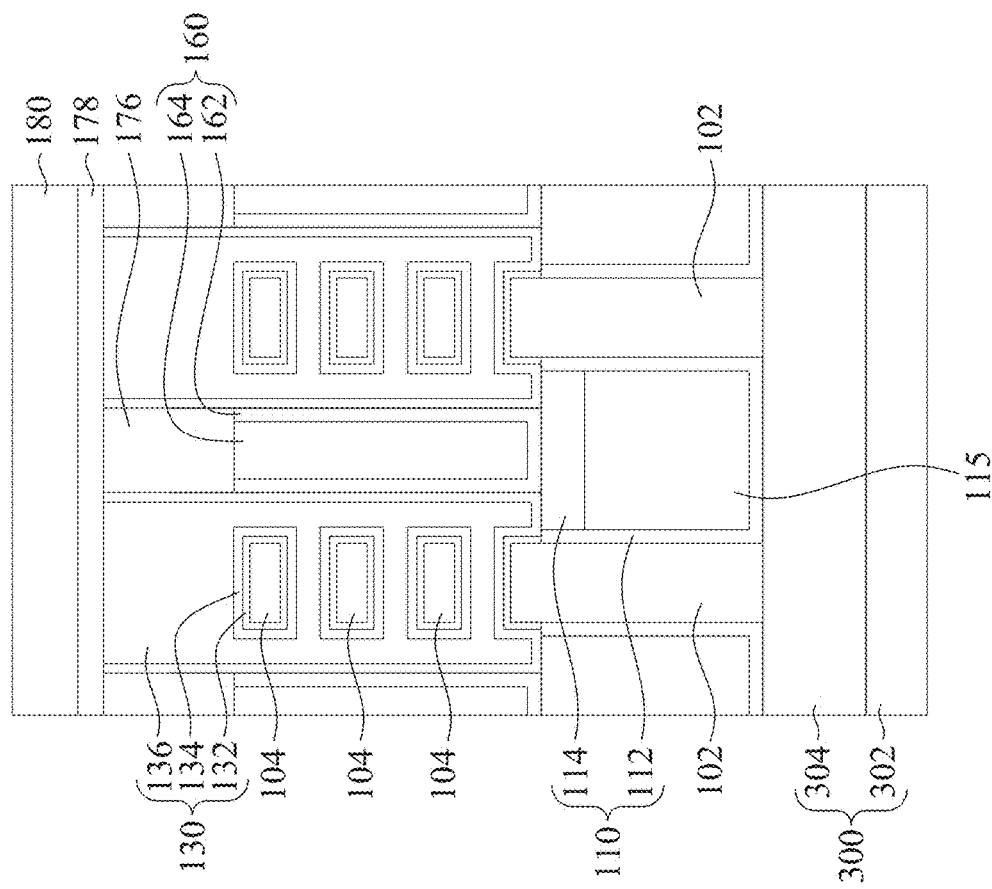
Figure 18A:
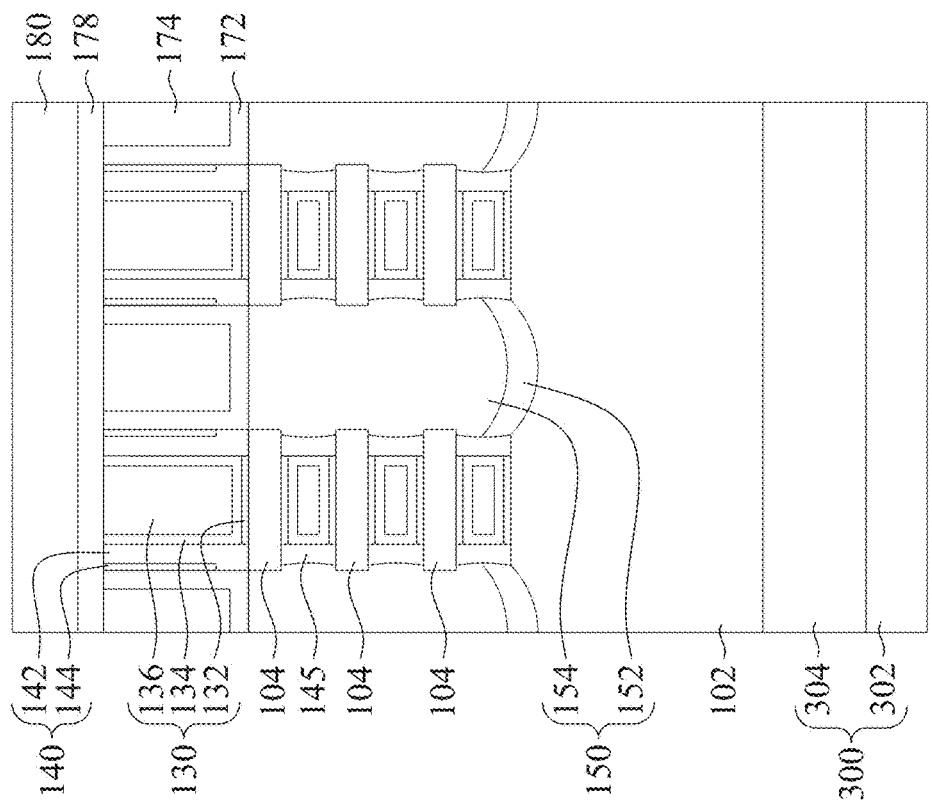
Figure 18C:
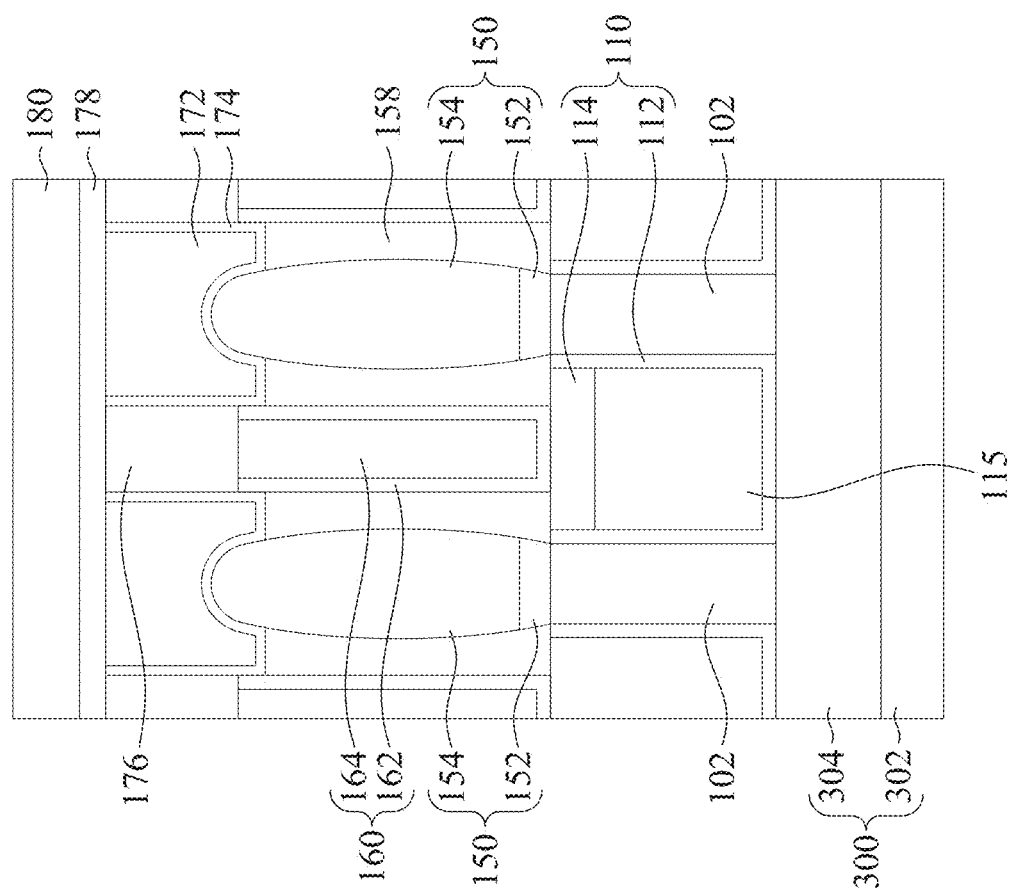

Reference is made to FIGS. 18A to 18C. An etch stop layer (ESL) 178 and an interlayer dielectric (ILD) layer 180 are formed over the substrate 300. In FIG. 18A, the ESL 178 is formed extending along the top surfaces of the gate structures 130, gate spacers 140, and the ILD layer 174. In FIG. 18B, the ESL 178 is formed extending along the top surfaces of the gate structures 130 and the dielectric layer 176. In FIG. 18C, the ESL 178 is formed extending along the top surfaces of the ILD layer 174 and the dielectric layer 176. In some embodiments, the ESL 178 is formed by PVD, CVD, ALD, or other suitable deposition processes. The ILD layer 174 is formed by PVD, CVD, ALD, or other suitable deposition processes.

Figure 19C:
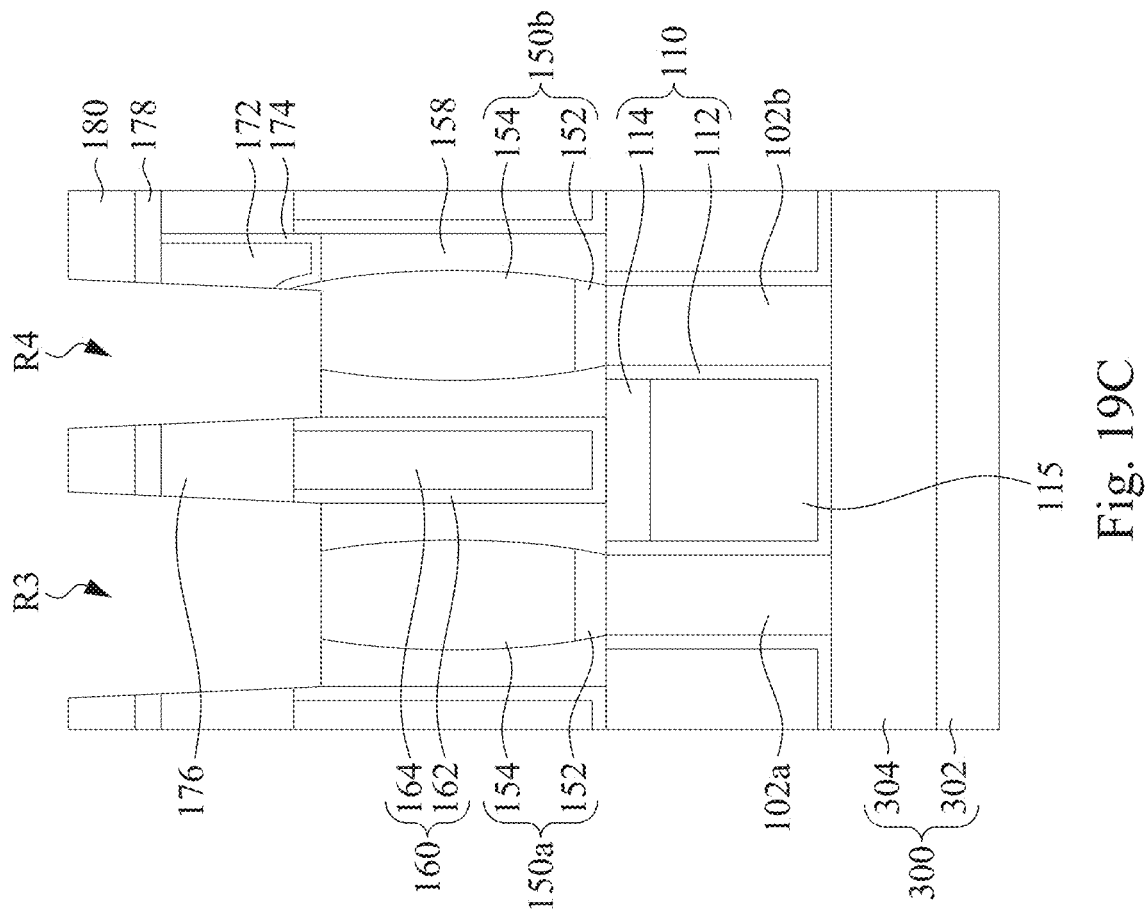

Reference is made to FIGS. 19A to 19C. A plurality of recesses R3 and R4 are formed extending through the ILD layer 174, the ESL 178, and the ILD layer 180. To facilitate the discussion to follow, the semiconductor strips 120 and the epitaxy structures 150 are labeled respectively as semiconductor strips 120a, 120b and epitaxy structures 150a, 150b in FIGS. 19C and 19C. The recesses R3 and R4 are formed by, for example, forming a photoresist layer having openings that define the positions of the recesses R3 and R4 over the ILD layer 174, etching the ILD layer 174 through the openings of the photoresist layer, and removing the photoresist layer. In some embodiments, during etching the ILD layer 174, the exposed portions of the epitaxy structures 150a, 150b are partially removed. In some embodiments, in FIG. 19C, because the recess R4 is narrower than the recess R3, portions of the ILD layer 174 and the CESL 172 over the epitaxy structure 150b are not removed during forming the recesses R3 and R4. Accordingly, at least a portion of the epitaxy structure 150b remains covered by the CESL 172 and the ILD layer 174 after forming the recesses R3 and R4.

Figures 20A, 20B:
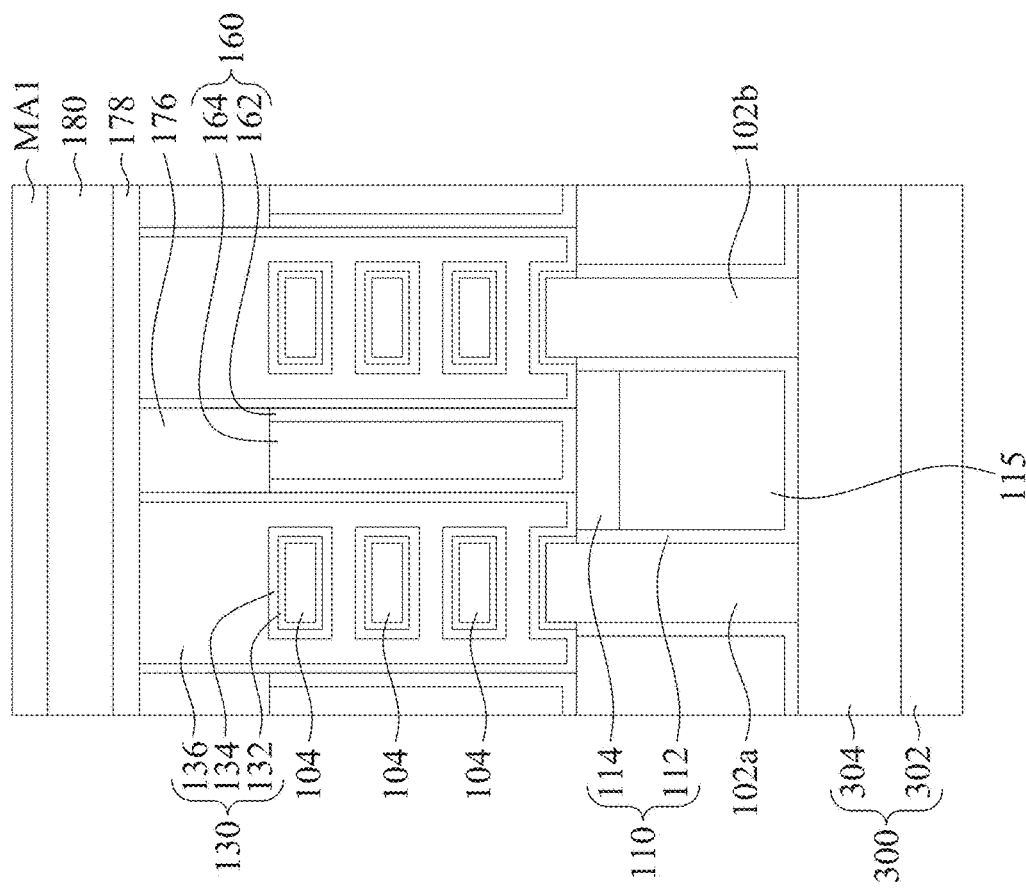
Figure 20C:
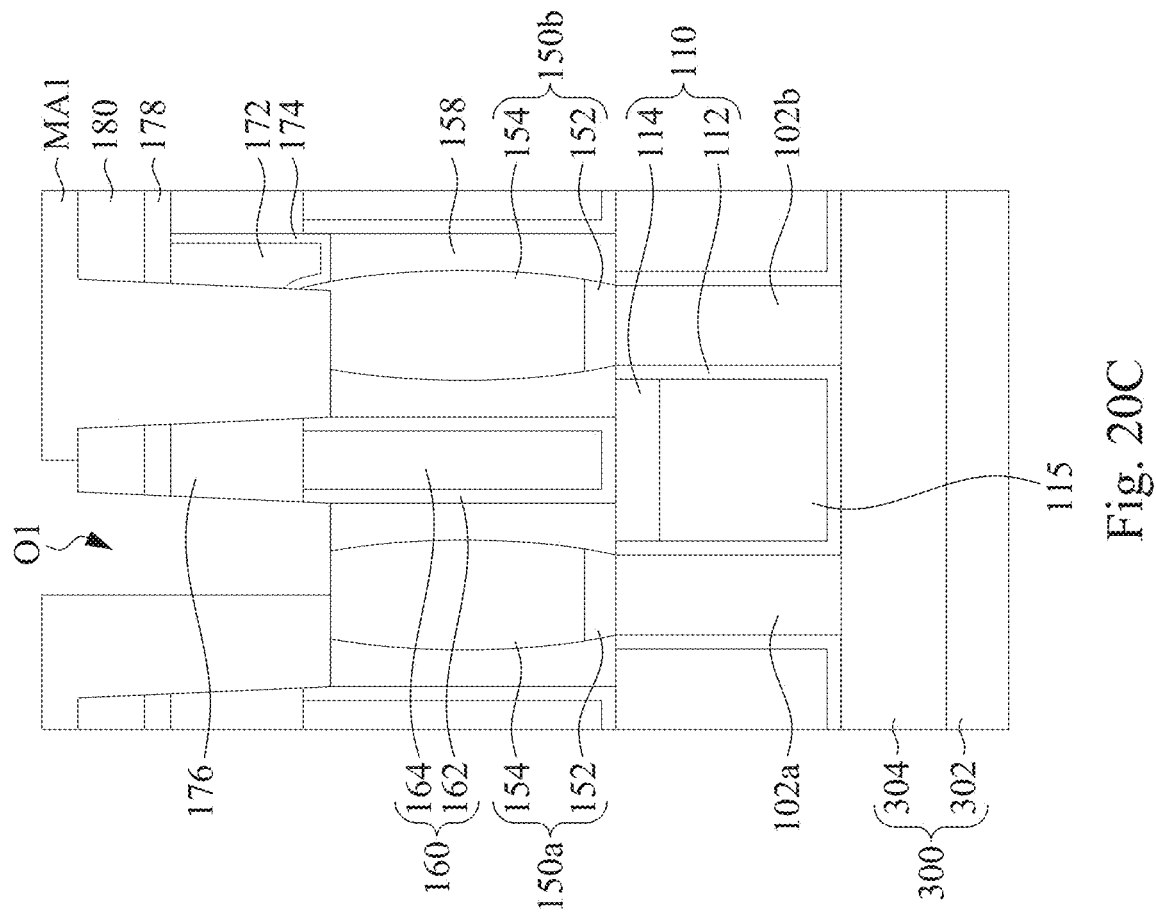

Reference is made to FIGS. 20A to 20C. A patterned mask MA1 having an opening O1 is formed over the substrate 300. As shown in FIG. 20C, the opening O1 of the patterned mask MA1 at least vertically overlaps the dielectric layer 158 between the epitaxy structure 150a and the dummy fin 160, and at least vertically overlaps the backside via 115.

Figure 21B:
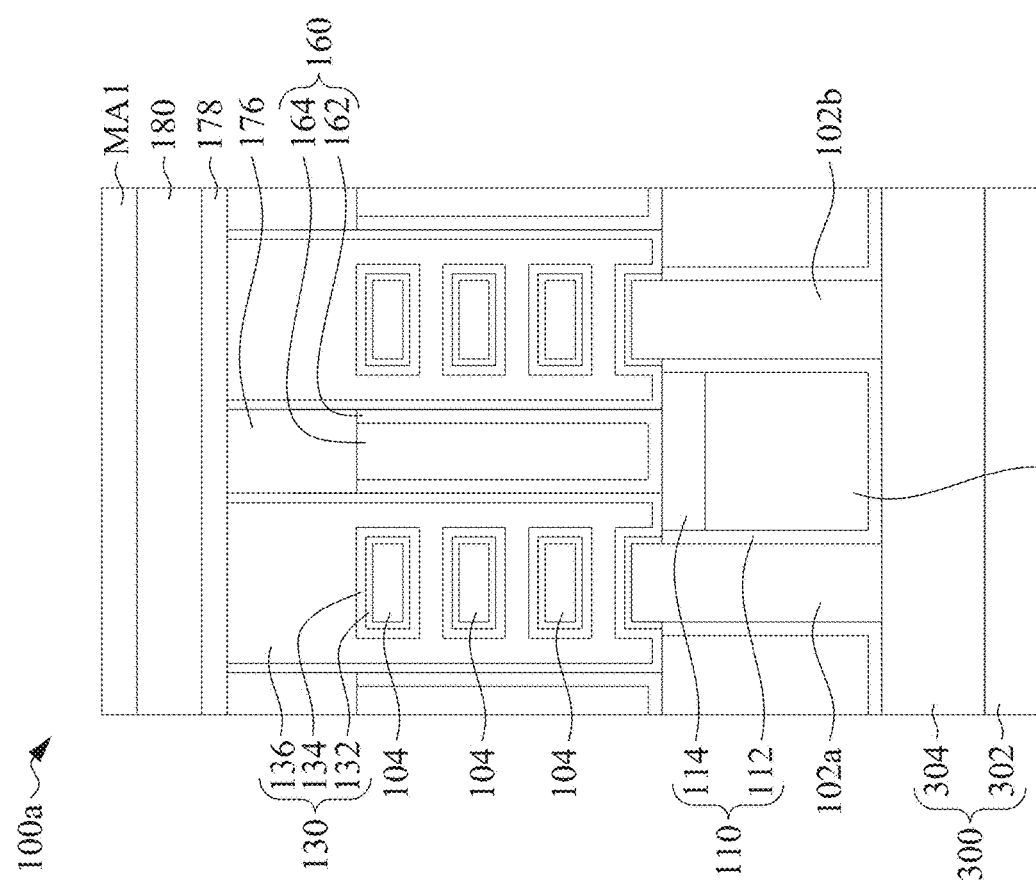
Figure 21A:
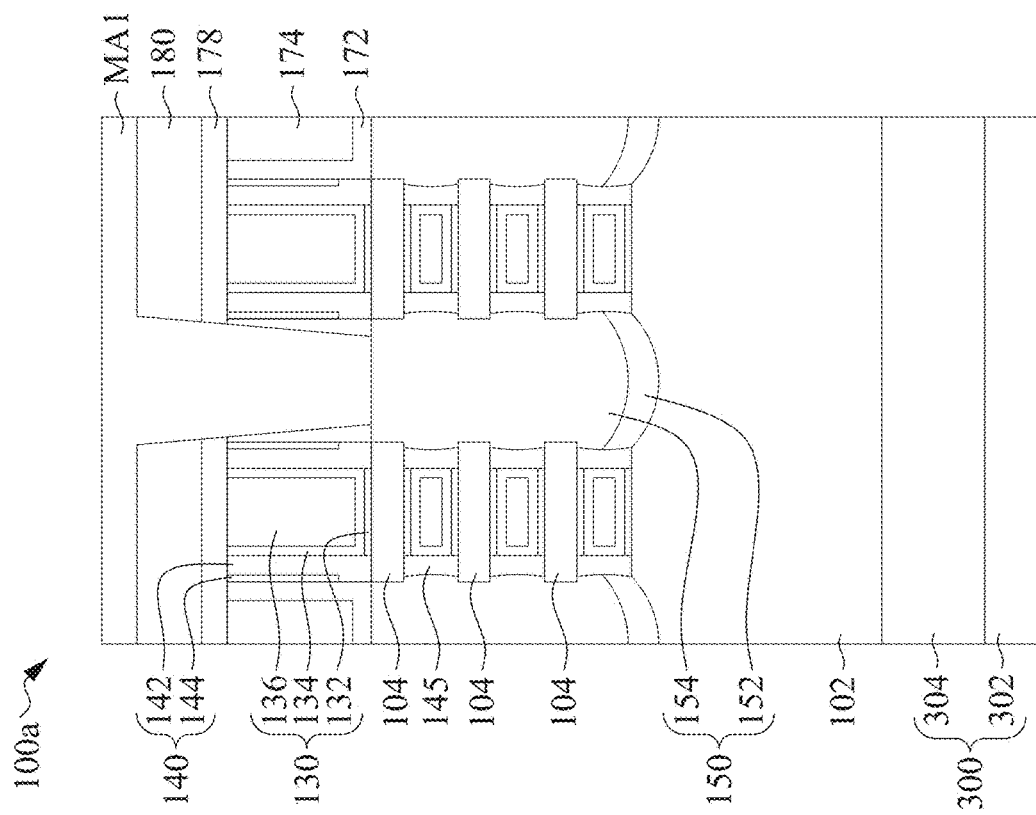
Figure 21C:
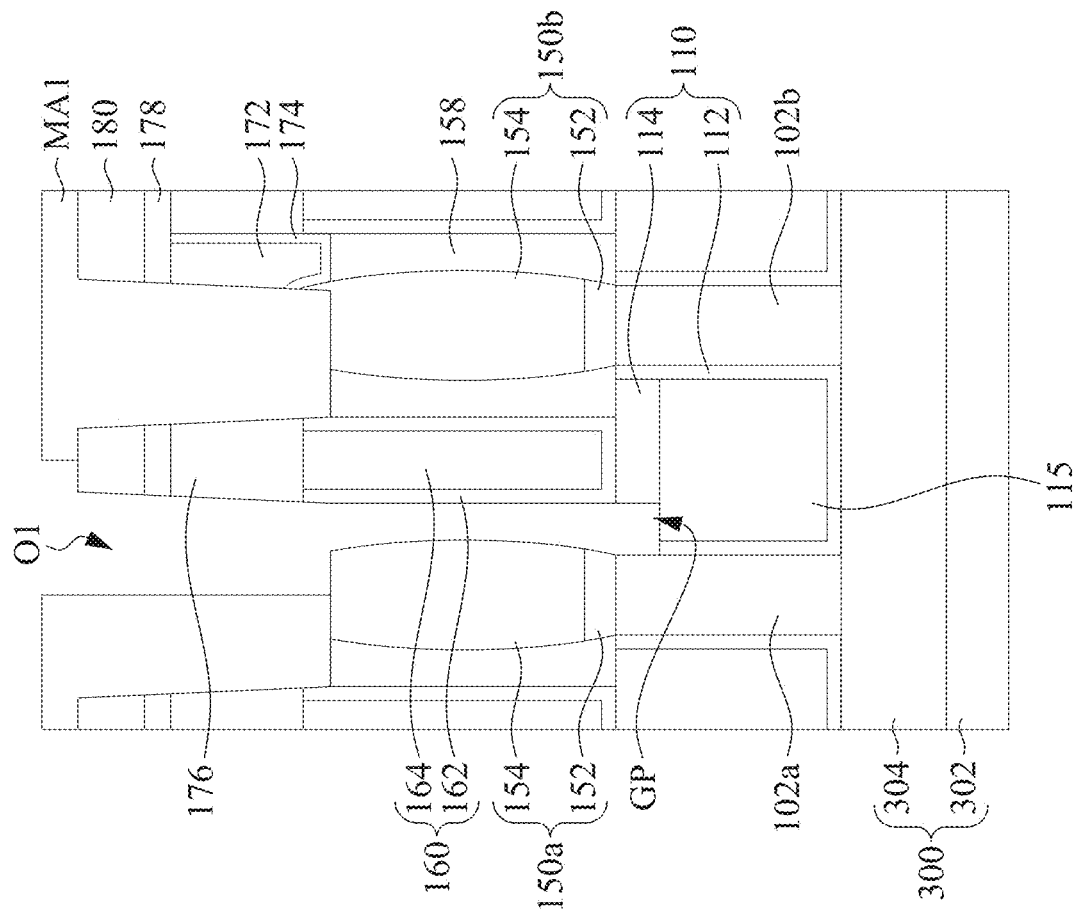

Reference is made to FIGS. 21A to 21C. An etching process is performed to remove portions of the dielectric layer 158 and portions of the isolation structure 110 to expose the backside via 115. In greater detail, the etching process removes portions of the dielectric layer 158 exposed by the opening O1 of the patterned mask MA1, and then removes the underlying isolation structure 110. In some embodiments, after the etching process, a gap GP is formed between the semiconductor strip 102a and the dielectric layer 114 of the isolation structure 110, in which the gap GP exposes the top surface of the backside via 115. In some embodiments, the etching process is wet etching, dry etching, or combinations thereof. In some embodiments, the patterned mask MA1 is a photoresist layer. In some other embodiments, the patterned mask MA1 is a hard mask.

Figure 22A:
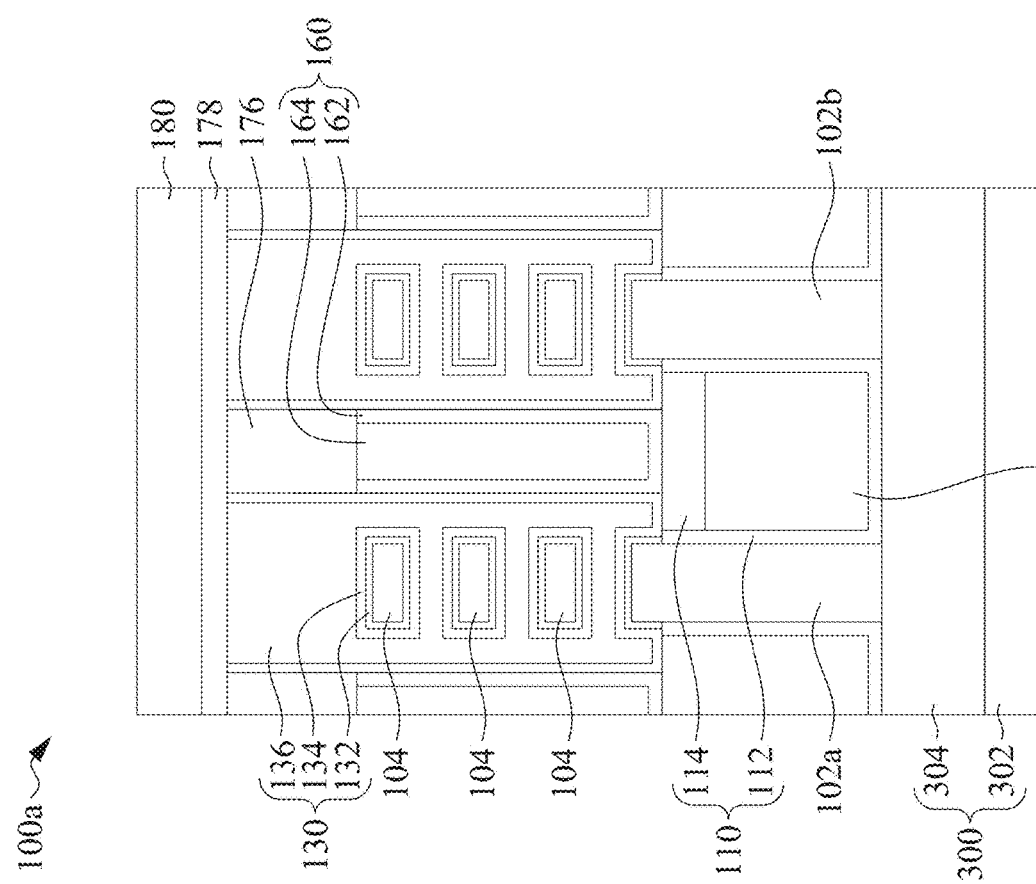
Figure 22B:
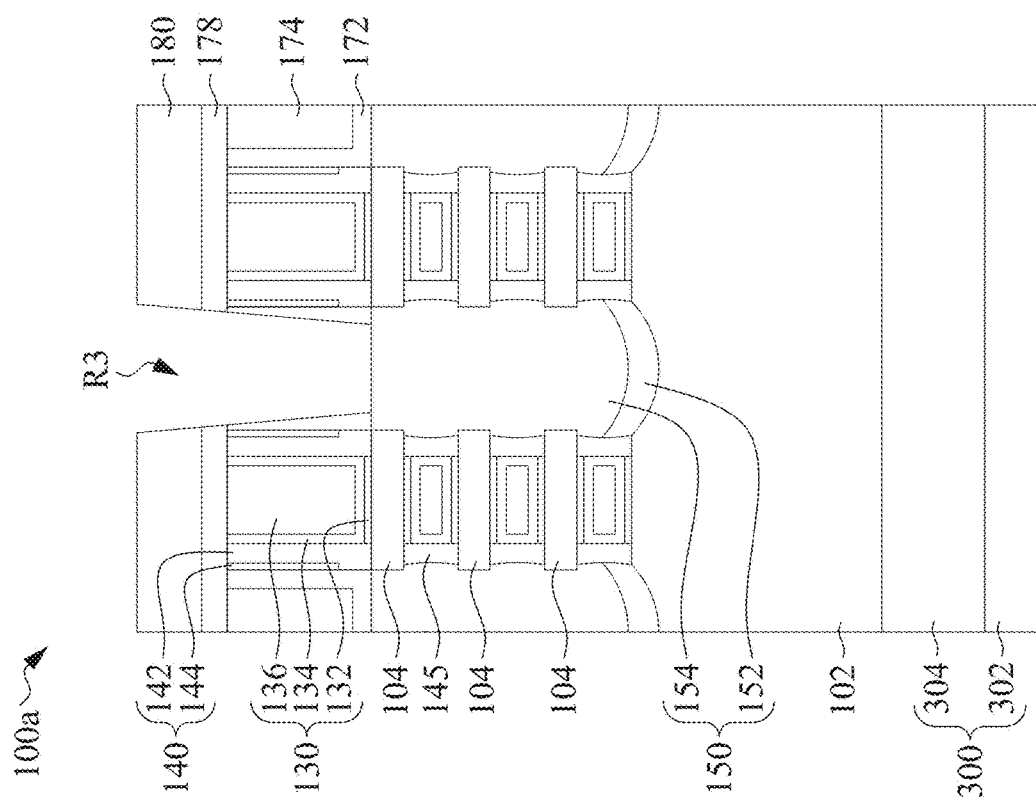
Figure 22C:
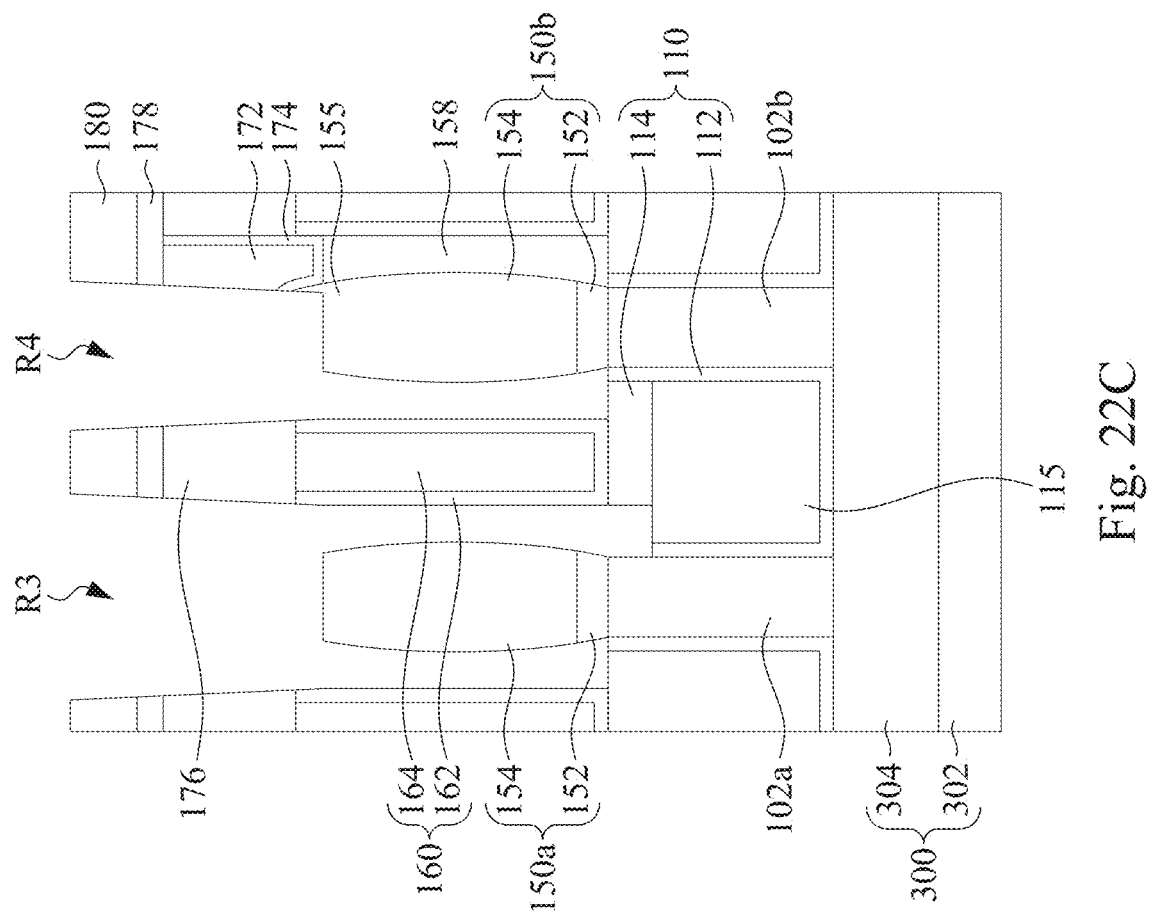

Reference is made to FIGS. 22A to 22C. The patterned mask MA1 is removed. Next, another etching process is performed to remove portions of the dielectric layer 158 exposed by the recesses R3 and R4. In some embodiments, after the portions of the dielectric layer 158 exposed by the recesses R3 and R4 are removed, surfaces of the epitaxy structure 150a, 150b are exposed.

Figures 23A, 23B:
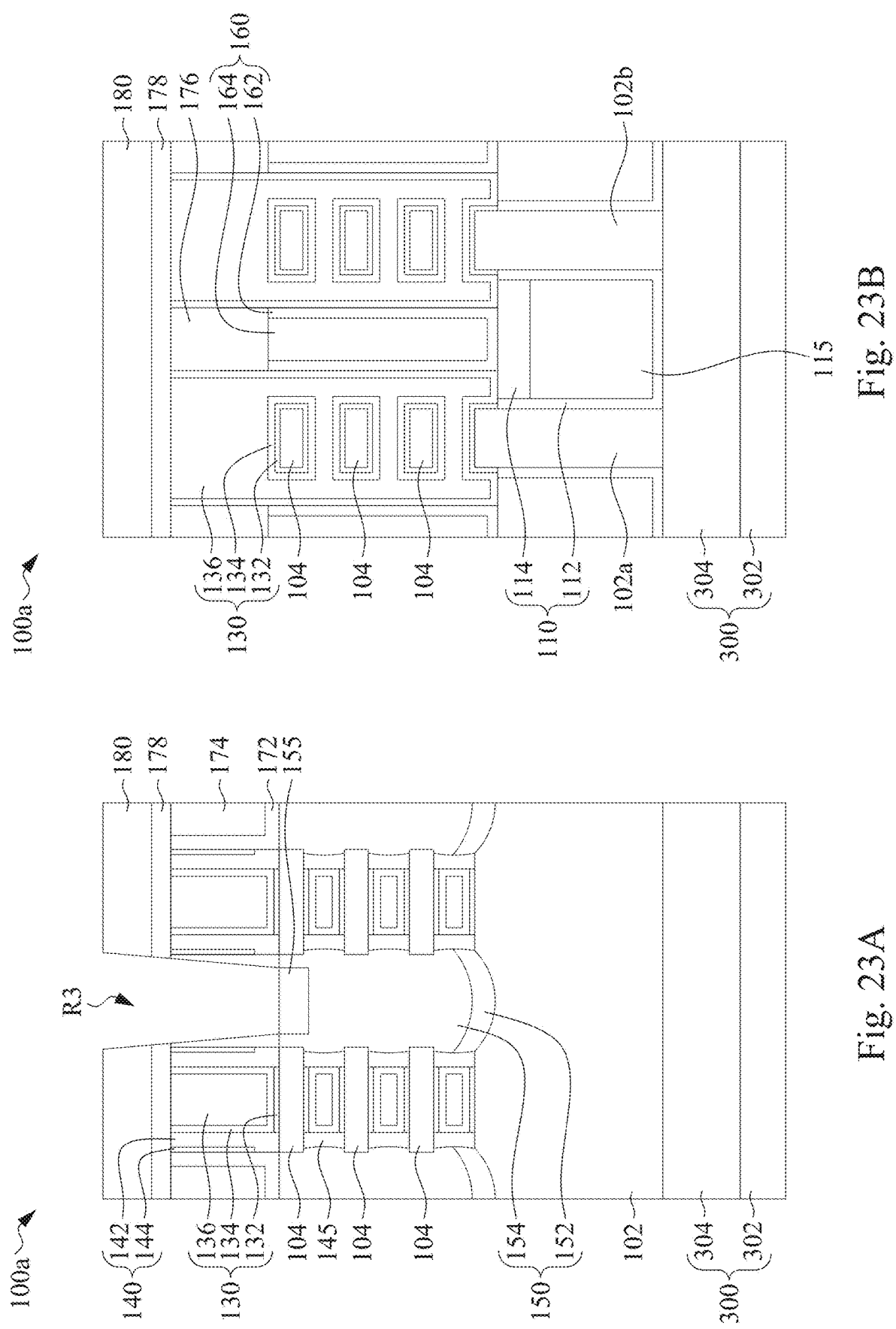
Figure 23C:
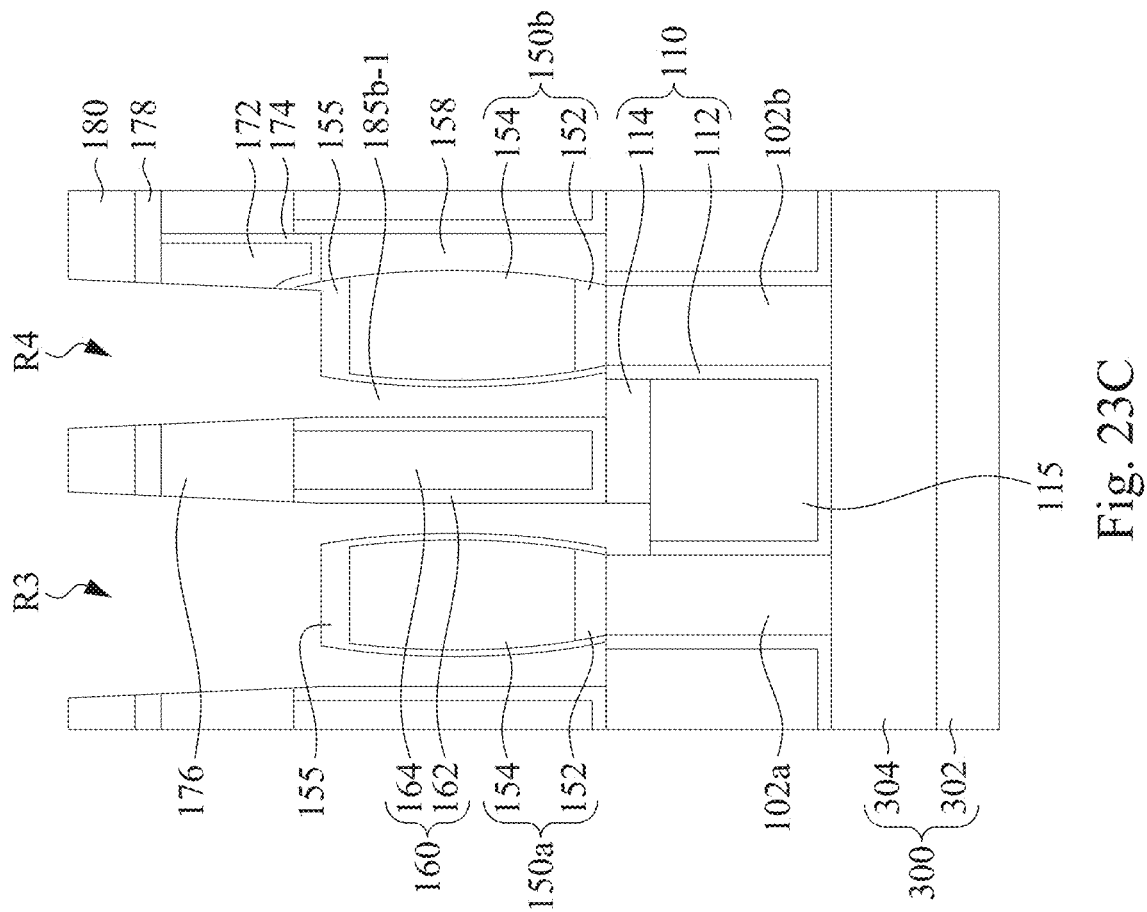

Reference is made to FIGS. 23A to 23C. A plurality of silicide layers 155 are formed on the exposed surfaces of the epitaxy structures 150a, 150b. The formation of the silicide layers 155 includes, for example, depositing a metal layer, such as by sputtering, over the substrate 300 and then performing an annealing process, such as a rapid thermal annealing (RTA) treatment. The metal layer overlying the surfaces of the epitaxy structures 150a, 150b reacts with silicon (Si) of the epitaxy structures 150a, 150b and transformed into metal silicide.

Figure 24C:
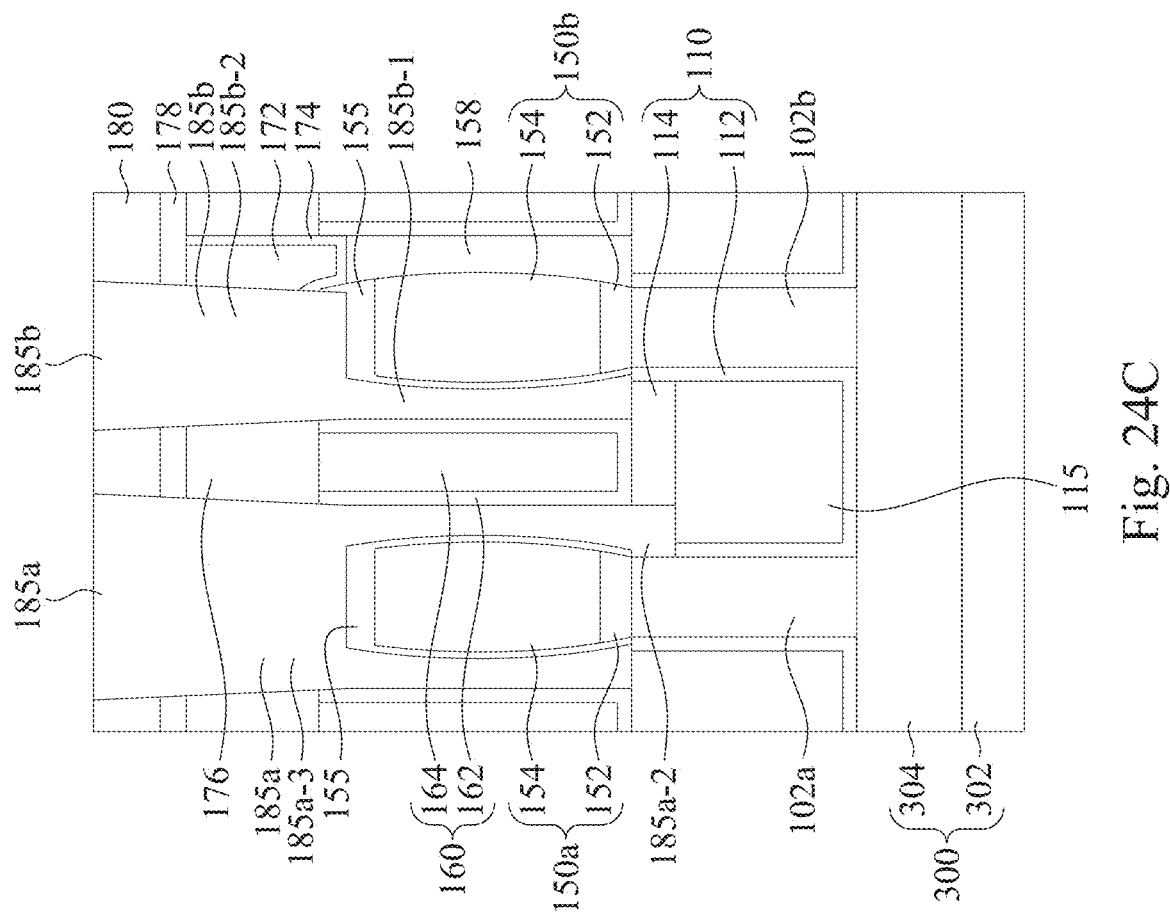

Reference is made to FIGS. 24A to 24C. Source/drain contacts 185a and 185b are formed respectively in the recesses R3 and R4. In some embodiments, the source/drain contacts 185a and 185b are formed by, for example, depositing a conductive material over the substrate 300 and filling the recesses R3 and R4, and subsequently performing a CMP process to remove the excess conductive material until the top surface of the ILD layer 180 is exposed.

Figure 25C:
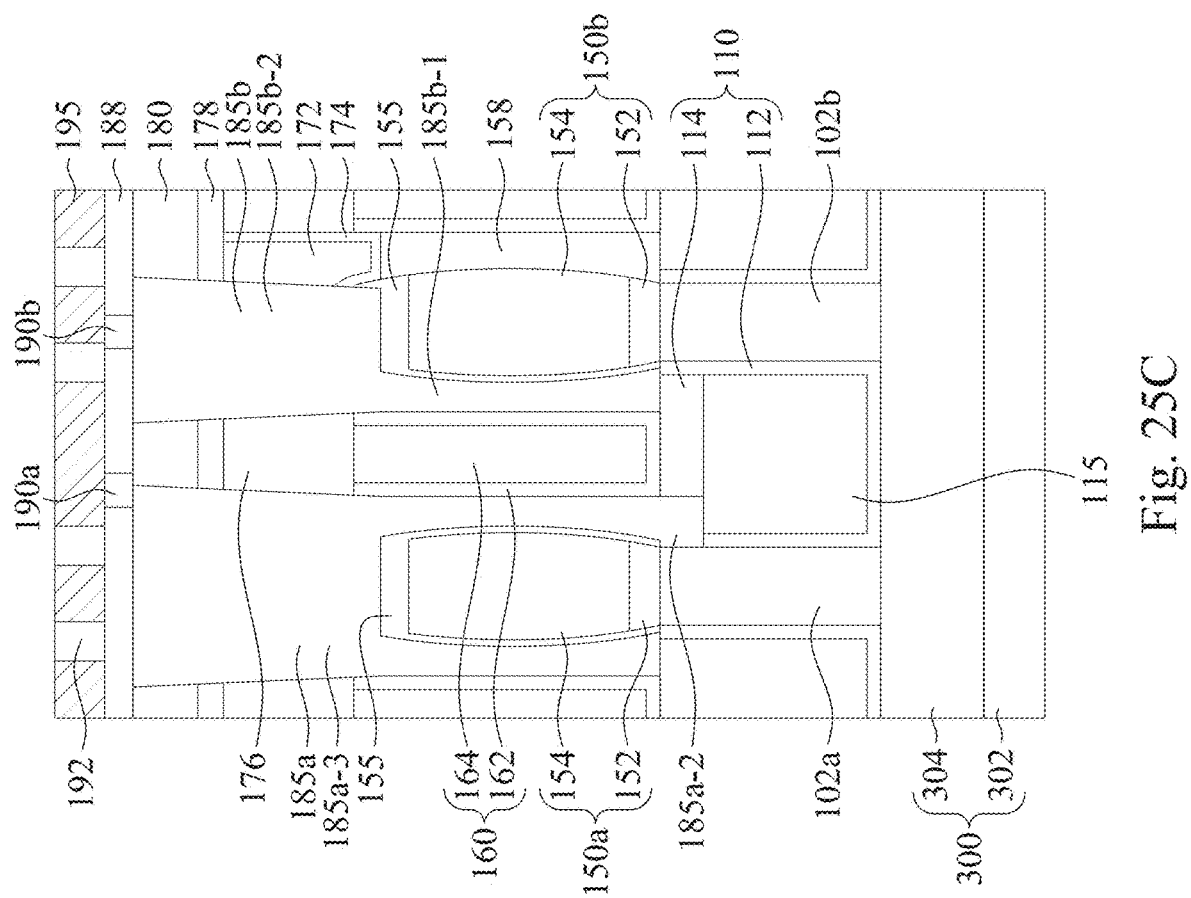

Reference is made to FIGS. 25A to 25C. A dielectric layer 188 is formed over the ILD layer 180, conductive vias 190a and 190b are formed in the dielectric layer 188, a dielectric layer 192 is formed over the dielectric layer 188, and metal lines 195 are formed in the dielectric layer 192. In some embodiments, the dielectric layer 188 is formed by depositing a dielectric material over the ILD layer 180, and the conductive vias 190a and 190b are formed by patterning the dielectric layer 188 to form openings, and filling a conductive material in the openings. On the other hand, the dielectric layer 192 is formed by depositing a dielectric material over the dielectric layer 188, and the metal lines 195 are formed by patterning the dielectric layer 188 to form openings, and filling a conductive material in the openings.

Figure 26C:
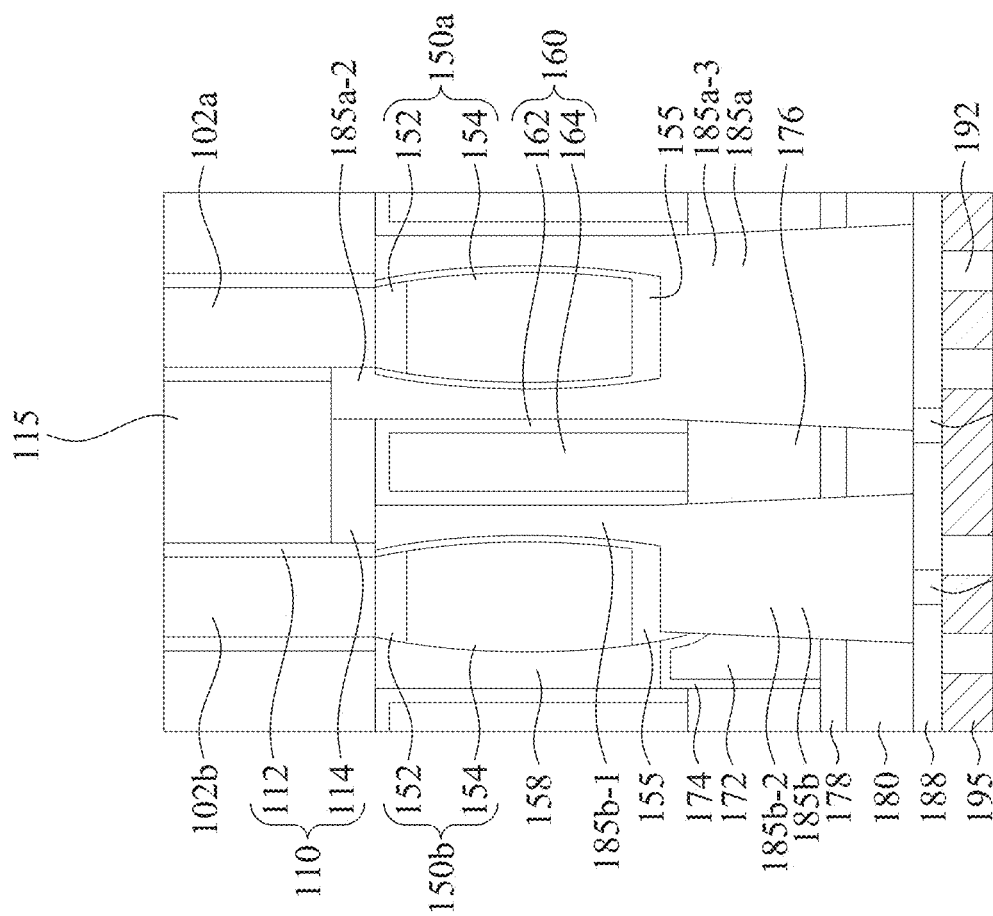

Reference is made to FIGS. 26A to 26C. A CMP process is performed to the backside of the substrate 300 (see FIGS. 25A to 25C) until the semiconductor strips 102a, 102b and the backside via 115 are exposed. In some embodiments, the structure shown in FIGS. 25A to 25C is flipped over so that the backside of the substrate 300 is directed toward the top of the figure. Next, the CMP process is performed to remove the bulk silicon layer 302 and the oxide layer 304 to expose the semiconductor strips 102a, 102b and the backside via 115.

Figures 27A, 27B:
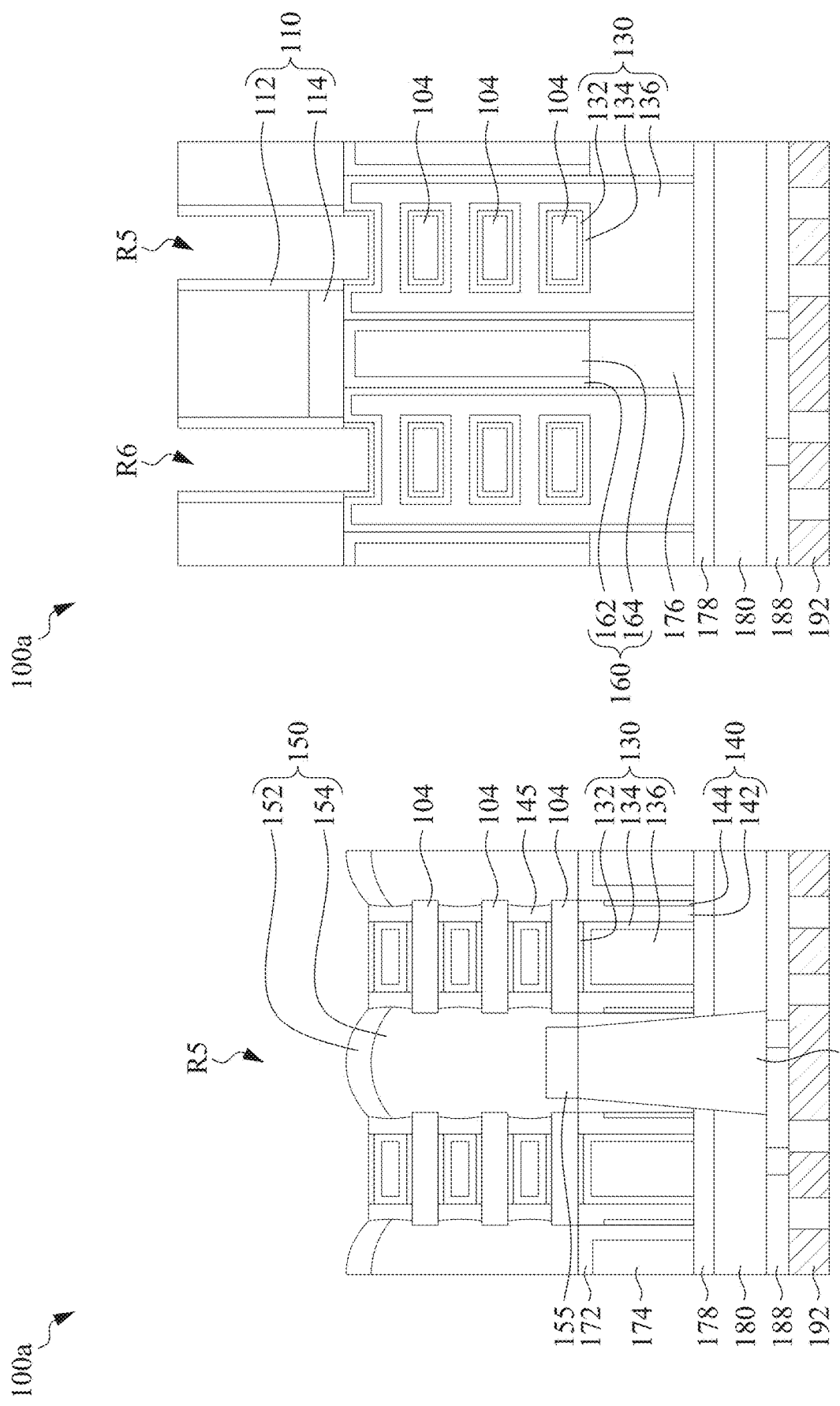
Figure 27C:
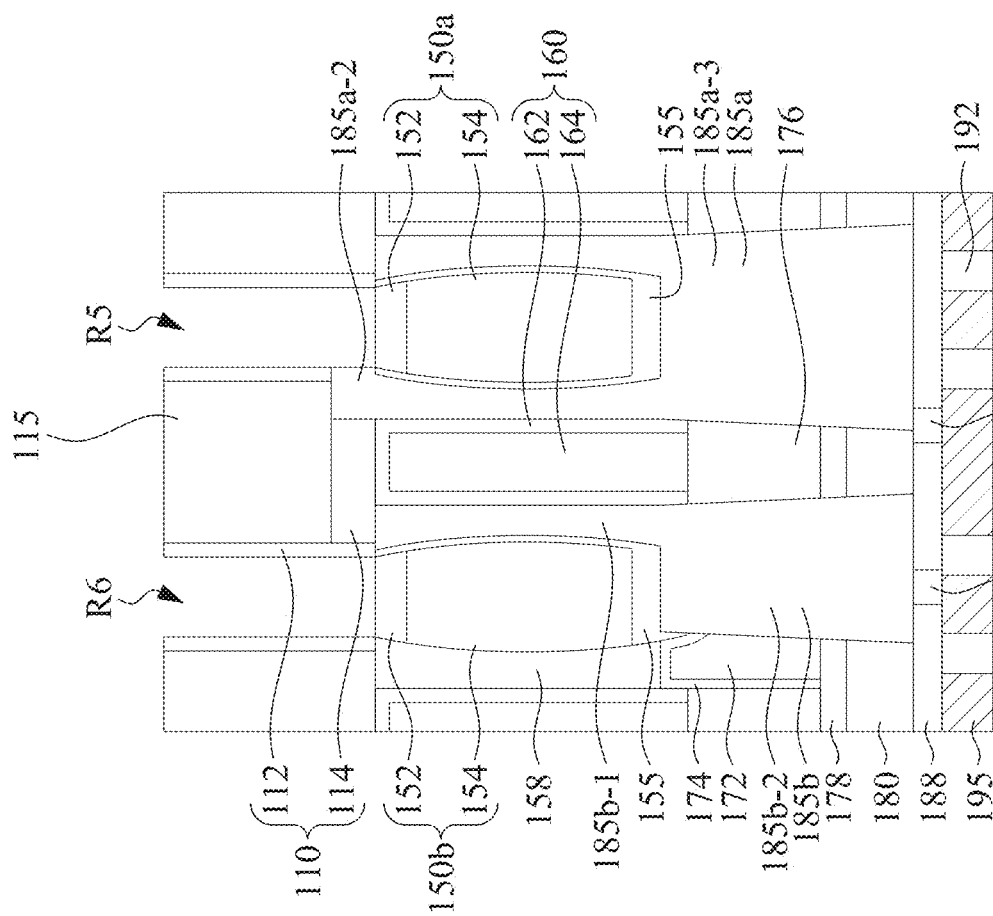

Reference is made to FIGS. 27A to 27C. The semiconductor strips 102a, 102b are removed to form recesses R5 and R6 between the isolation structures 110. In some embodiments, the recesses R5 and R6 at least expose the epitaxy structures 150a, 150b. In some embodiments, the semiconductor strips 102a, 102b are removed by wet etch, dry etch, or combinations thereof.

Figure 28C:
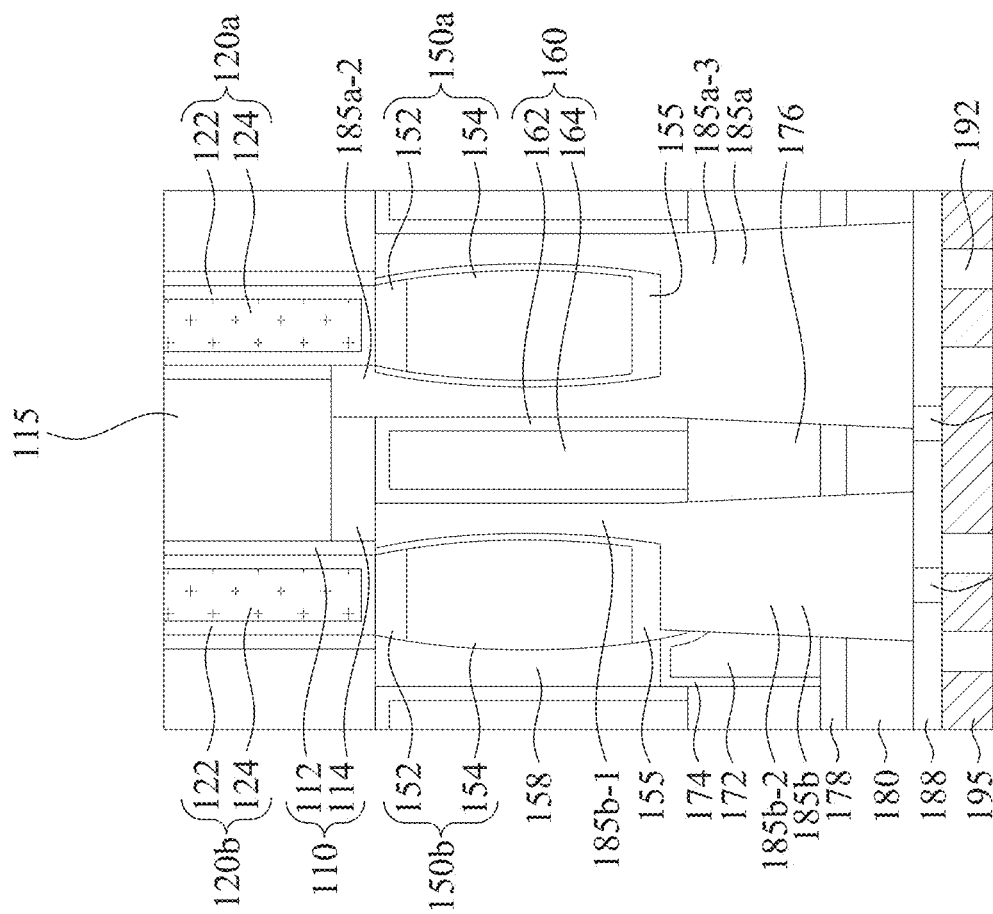

Reference is made to FIGS. 28A to 28C. Dielectric strips 120a, 120b are formed respectively in the recesses R5 and R6. In some embodiments, each of the dielectric strips 120a, 120b includes a dielectric liner 122 and a dielectric material 124. In some embodiments, the dielectric strips 120a, 120b are formed by, for example, sequentially depositing the dielectric liner 122 and the dielectric material 124 in the recesses R5 and R6 and covering the isolation structures 110 and subsequently performing a CMP process until the top surfaces of the isolation structures 110 are exposed. In the cross-section of FIG. 28A, the dielectric liner 122 extends along and in contact with a surface of the epitaxy structure 150, a surface of the spacer layer 145, and a surface of the gate structure 130 (e.g., the interfacial layer 132 of the gate structure 130).

Figures 29A, 29B:
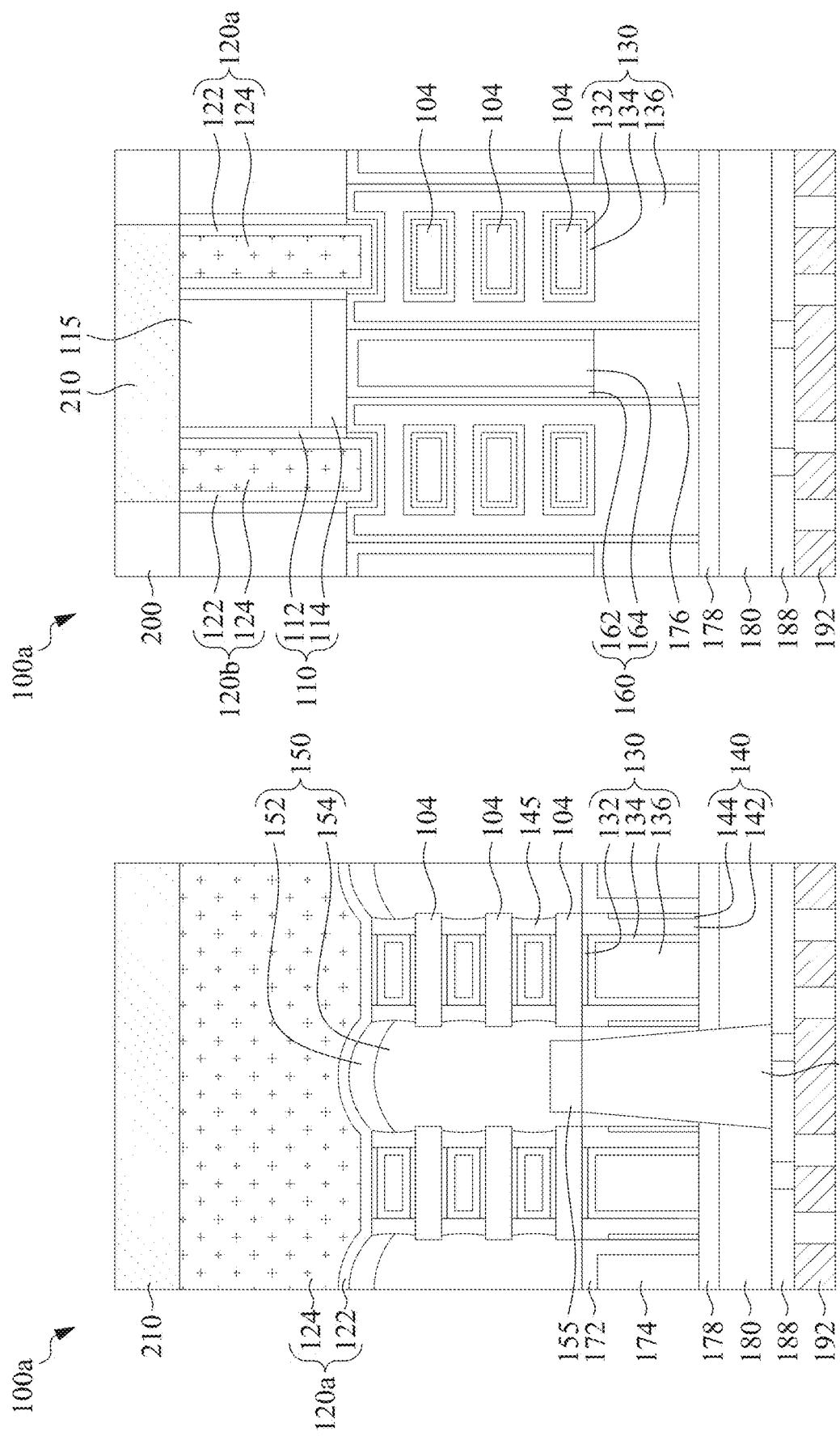
Figure 29C:
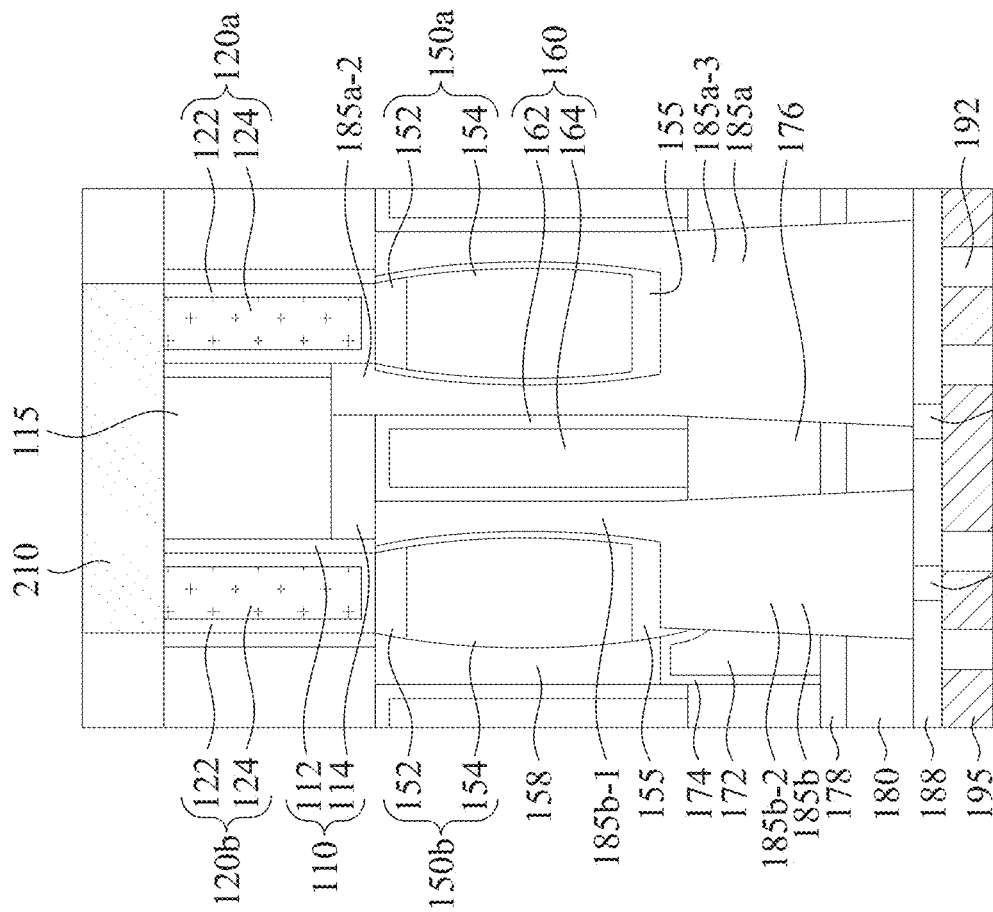

Reference is made to FIGS. 29A to 29C. A dielectric layer 200 is formed over the isolation structures 110 and the dielectric strips 120a, 120b, and a metal line 210 is formed in the dielectric layer 200. In some embodiments, the dielectric layer 200 is deposited by PVD, CVD, ALD, or other suitable deposition processes. The metal line 210 is formed by patterning the dielectric layer 200 to form openings and filling a conductive material in the openings.

Figure 30A:

FIGS. 30A and 30B are flow charts of a method M1 of manufacturing an integrated circuit in accordance with some embodiments of the present disclosure. Although the method M1 is described as a series of acts or events, one of ordinary skill in the art would understand that the method is not limited to the described ordering or acts. Thus, in some embodiments, the acts are carried out in different orders than described, and/or are able to be carried out concurrently. Further, in some embodiments, the acts or events are subdivided into multiple acts or events, which are able to be carried out at separate times or concurrently with other acts or sub-acts. In some embodiments, some acts or events are omitted, and other non-described acts or events are included.

At block S101, first and second semiconductor layers are alternately deposited over a substrate. FIGS. 2A to 2C are views of some embodiments corresponding to the act in block S101.

At block S102, the first and second semiconductor layers and the substrate are patterned to form semiconductor strips over the substrate. FIGS. 3A to 3C are views of some embodiments corresponding to the act in block S102.

At block S103, a first dielectric liner and a conductive material are deposited over the substrate. FIGS. 4A to 4C are views of some embodiments corresponding to the act in block S103.

At block S104, the conductive material is etched back. FIGS. 5A to 5C are views of some embodiments corresponding to the act in block S104.

At block S105, the conductive material is patterned to form a backside via. FIGS. 6A to 6C are views of some embodiments corresponding to the act in block S105.

At block S106, a first dielectric layer is deposited over the first conductive via. FIGS. 7A to 7C are views of some embodiments corresponding to the act in block S106.

At block S107, the first dielectric layer and the first dielectric liner are etched back. FIGS. 8A to 8C are views of some embodiments corresponding to the act in block S107.

At block S108, a third semiconductor layer is formed over the first and second semiconductor layers, a second dielectric liner is formed over the third semiconductor layer, and a first dielectric material is formed over the first dielectric liner. FIGS. 9A to 9C are views of some embodiments corresponding to the act in block S108.

At block S109, a CMP process is performed until the top surfaces of the second semiconductor layers are exposed to form dummy fins between the semiconductor strips. FIGS. 10A to 10C are views of some embodiments corresponding to the act in block S109.

At block S110, a second dielectric layer is formed over the substrate, dummy gate structures are formed over the first and second semiconductor layers, and gate spacers are formed on opposite sidewalls of the dummy gate structures. FIGS. 11A to 11C are views of some embodiments corresponding to the act in block S110.

At block S111, the first and second semiconductor layers are recessed to form recesses, the third semiconductor layer is etched, and spacer layers are formed between the second semiconductor layers. FIGS. 12A to 12C are views of some embodiments corresponding to the act in block S111.

At block S112, epitaxy structures are formed over the semiconductor strips and on opposite sides of the dummy gate structures. FIGS. 13A to 13C are views of some embodiments corresponding to the act in block S112.

At block S113, a second dielectric layer is formed filling the spaces between the epitaxy structures and the dummy fins. FIGS. 14A to 14C are views of some embodiments corresponding to the act in block S113.

At block S114, a CESL and a first ILD layer are formed over the epitaxy structures. FIGS. 15A to 15C are views of some embodiments corresponding to the act in block S114.

At block S115, the dummy structures, the first semiconductor layers, and the third semiconductor layers are removed to form gate trenches. FIGS. 16A to 16C are views of some embodiments corresponding to the act in block S115.

At block S116, metal gate structures are formed in the gate trenches. FIGS. 17A to 17C are views of some embodiments corresponding to the act in block S116.

At block S117, an ESL and a second ILD layer are formed over the substrate. FIGS. 18A to 18C are views of some embodiments corresponding to the act in block S117.

At block S118, first recesses are formed extending through the second ILD layer, the ESL, and the first ILD layer. FIGS. 19A to 19C are views of some embodiments corresponding to the act in block S118.

At block S119, a patterned mask having an opening is formed over the substrate. FIGS. 20A to 20C are views of some embodiments corresponding to the act in block S119.

At block S120, portions of the second dielectric layer and the isolation structures are etched through the opening of the patterned mask to expose the first conductive via. FIGS. 21A to 21C are views of some embodiments corresponding to the act in block S120.

At block S121, the patterned mask is removed, and portions of the second dielectric layer exposed by the first recesses are etched. FIGS. 22A to 22C are views of some embodiments corresponding to the act in block S121.

At block S122, silicide layers are formed over the epitaxy structures. FIGS. 23A to 23C are views of some embodiments corresponding to the act in block S122.

At block S123, source/drain contacts are formed in the first recesses. FIGS. 24A to 24C are views of some embodiments corresponding to the act in block S123.

At block S124, a third dielectric layer is formed over the second ILD layer, conductive vias are formed in the third dielectric layer, a fourth dielectric layer is formed over the third dielectric layer, and first metal lines are formed in the fourth dielectric layer. FIGS. 25A to 25C are views of some embodiments corresponding to the act in block S124.

At block S125, a CMP process is performed to a backside of the substrate until the semiconductor strips and the first conductive via are exposed. FIGS. 26A to 26C are views of some embodiments corresponding to the act in block S125.

At block S126, the semiconductor strips are removed to form second recesses. FIGS. 27A to 27C are views of some embodiments corresponding to the act in block S126.

At block S127, dielectric strips are formed in the second recesses. FIGS. 28A to 28C are views of some embodiments corresponding to the act in block S127.

At block S128, a fifth dielectric layer is formed over the isolation structures and the dielectric strips, and a second metal line is formed in the fifth dielectric layer. FIGS. 29A to 29C are views of some embodiments corresponding to the act in block S128.

FIGS. 31 to 40 are views of an integrated circuit in various stages of fabricating the integrated circuit in accordance with some embodiments of the present disclosure. FIGS. 31 to 40 have the same cross-section as FIGS. 2C to 29C. Also, some elements of FIGS. 31 to 40 are similar to those described in FIGS. 1A to 29C, and thus such elements are labeled the same and relevant details will not be repeated for brevity.

Figure 31:
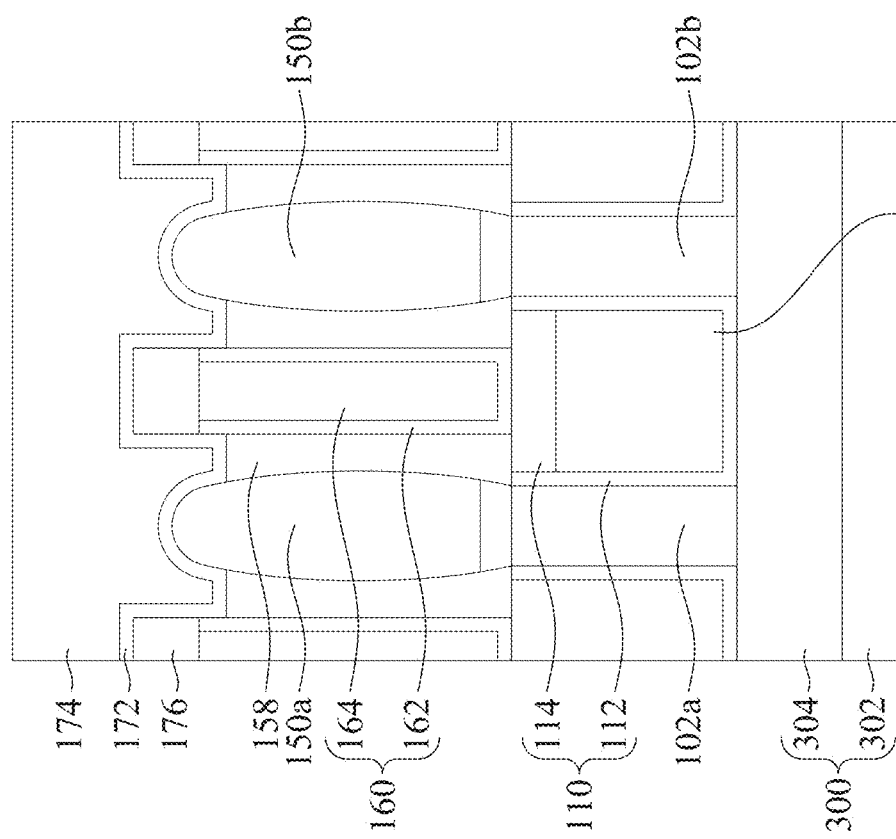

Reference is made to FIG. 31. A dielectric layer 158 is formed to fill the spacers between the epitaxy structures 150a, 150b, and the dummy fins 160, as discussed in FIGS. 14A to 14C. Next, a CESL 172 and an ILD layer 174 are sequentially deposited over the epitaxy structures 150a, 150b.

Figure 32:
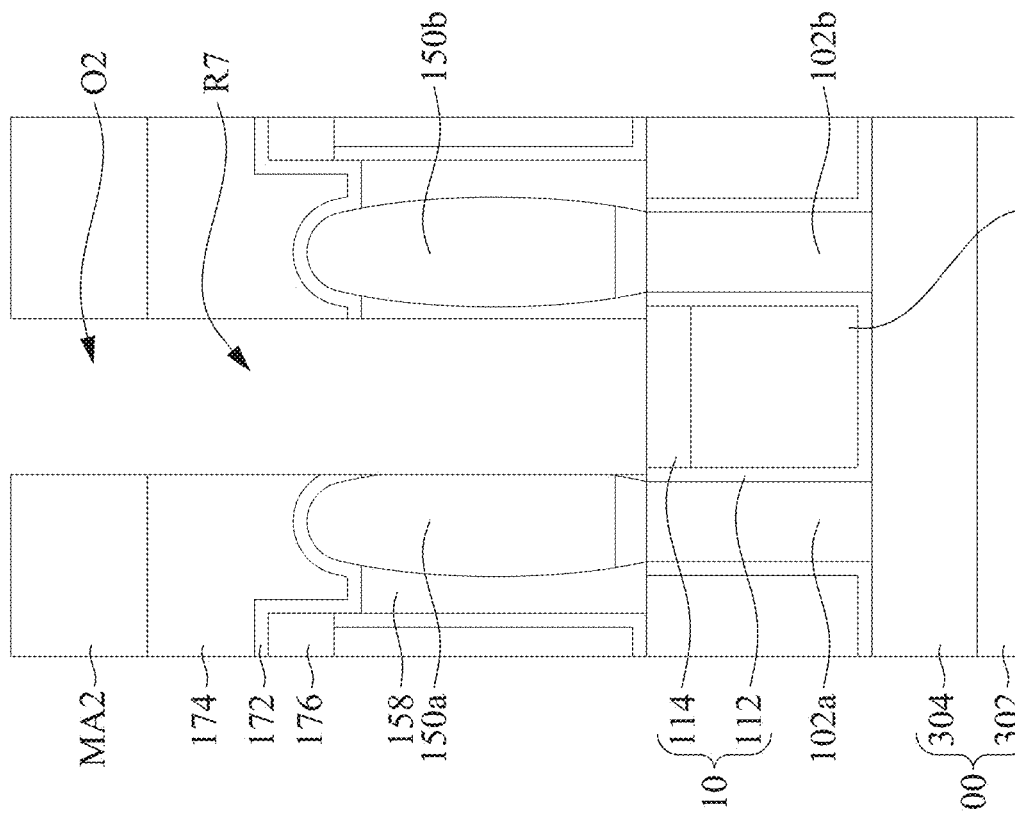

Reference is made to FIG. 32. A patterned mask MA2 having an opening O2 is formed over the ILD layer 174. Next, an etching process is performed to remove portions of the ILD layer 174, the CESL 172, the dielectric layer 158, and the dummy fins 160, such that a recess R7 is formed to expose the isolation structure 110. In greater detail, the dummy fin 160 between the epitaxy structures 150a, 150b is removed during the etching process. In some embodiments, the patterned mask MA2 is a photoresist layer. In some embodiments, the etching process includes wet etch, dry etch, or combinations thereof.

Reference is made to FIG. 33. The patterned mask MA2 is removed. Next, a dielectric layer 400 is formed in the recess R7. The dielectric layer 400 is formed to cover the exposed surface of the isolation structure 110. In some embodiments, the dielectric layer 400 is formed by, for example, depositing a dielectric material in the recess R7, and subsequently performing a CMP process to remove the excess dielectric material until the top surface of the ILD layer 174 is exposed. In some embodiments, the dielectric layer 400 and the ILD layer 174 include the same material.

Reference is made to FIG. 34. A patterned mask MA3 having openings O3 and O4 is formed over the ILD layer 174 and the dielectric layer 400. In some embodiments, the patterned mask MA3 is a photoresist layer.

Reference is made to FIG. 35. An etching process is performed to remove portions of the ILD layer 174, the CESL 172, the dielectric layer 400, and the isolation structures 110. After the etching process, recesses R8 and R9 are formed respectively over the epitaxy structures 150a, 150b. In some embodiments, the recesses R8 and R9 at least extend through the isolation structure 110 and expose the backside via 115. In some embodiments, the etching process includes wet etch, dry etch, or combinations thereof.

Reference is made to FIG. 36. The patterned mask MA3 is removed. In some embodiments, the patterned mask MA3 is removed by a suitable process, such as a strip process.

Reference is made to FIG. 37. Source/drain contacts 185a and 185b are formed respectively in the recesses R8 and R9. Because the dummy fin 160 between the epitaxy structures 150a, 150b is removed (see FIG. 32), this is able to enlarge the window of recess R8, and further increase the exposed area of the backside via 115. Accordingly, the contact area between the source/drain contact 185a and the backside via 115 is increased, which will improve the device performance. The embodiment of FIG. 37 is different from the embodiment of FIGS. 1A to 1D, in that the dummy fin 160 of FIGS. 1A to 1D is removed in the embodiment of FIG. 37, which results in an enlarged deposition window of the source/drain contacts 185a in FIG. 37 and thus an enlarged size of the source/drain contacts 185a, and which in turn will improve the device performance.

The source/drain contacts 185a embedded in the isolation structure 110 has a width W2. In some embodiments, the width W2 is in a range from about 20 nm to about 30 nm. If the width W2 is too small (e.g., much lower than 20 nm), the portion of the source/drain contacts 185a is too thin to provide sufficient electrical connection, in some instances. If the width W2 is too large (e.g., much greater than 30 nm), the portion is too large and could affect the sizes of the adjacent elements (e.g., the dielectric layer 400 or the dielectric strip 120a), in some instances.

Reference is made to FIG. 38. A CMP process is performed to the backside of the substrate 300 until the semiconductor strips 102a, 102b and the backside via 115 are exposed. Reference is made to FIG. 39. The semiconductor strips 102a, 102b are replaced with dielectric strips 120a, 120b. Reference is made to FIG. 40. A dielectric layer 200 is formed over the isolation structures 110 and the dielectric strips 120a, 120b, and a metal line 210 is formed in the dielectric layer 200 to form an integrated circuit 100b.

Figures 41A, 41B:
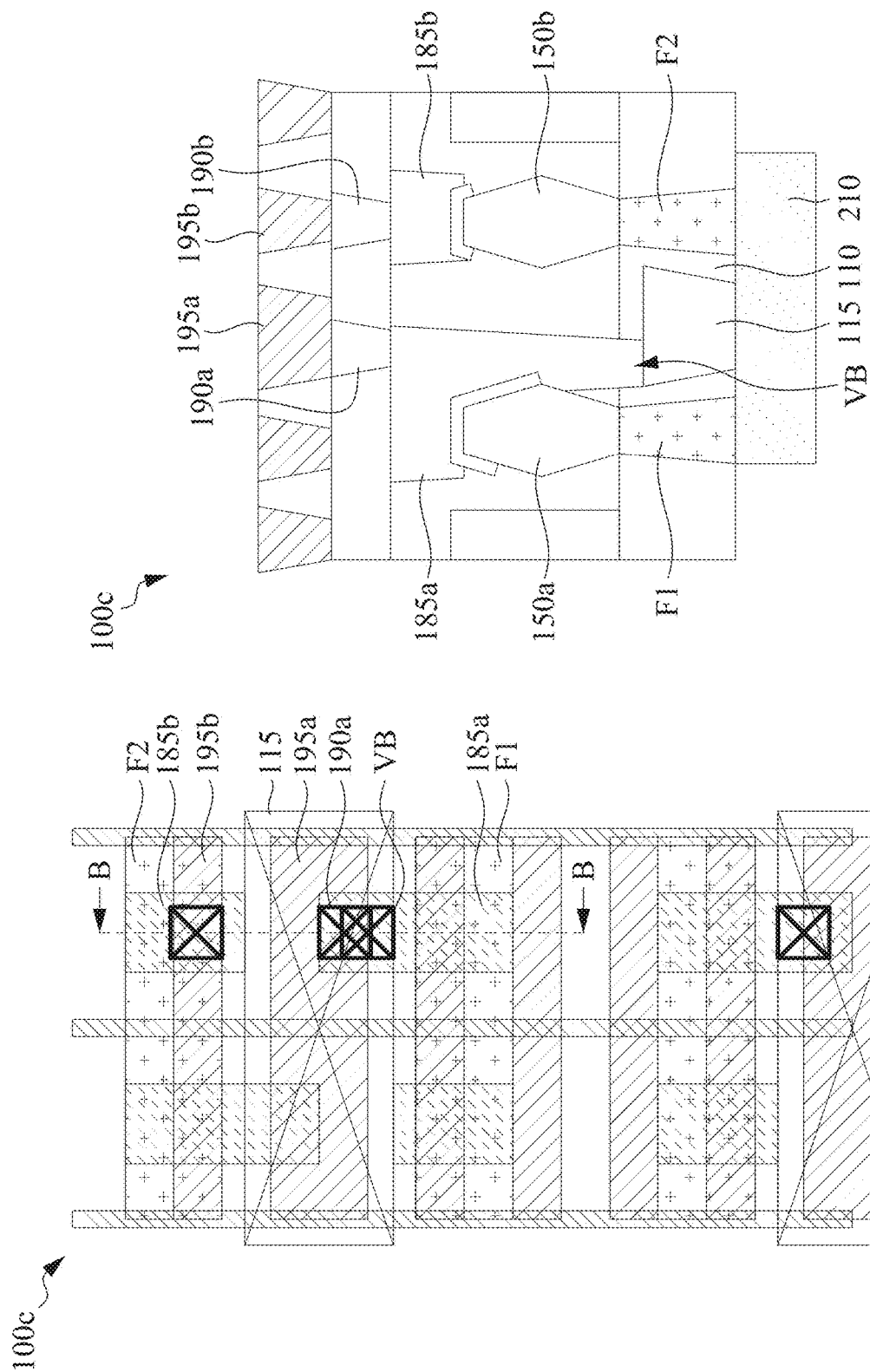
FIG. 41A is a top view and FIG. 41B is a cross-sectional view of an integrated circuit in accordance with some embodiments of the present disclosure.

FIGS. 41A and 41B are views of an integrated circuit in accordance with some embodiments of the present disclosure. FIG. 41A is a top view of an integrated circuit 100c in accordance with some embodiments of the present disclosure, and FIG. 41B is a cross-sectional view along line B-B of FIG. 41A. It is noted that some elements of FIGS. 41A and 41B are similar to those described in FIGS. 1A to 1D, and such elements are labeled the same and relevant details will not be repeated for brevity.

Strip structures F1 and F2 are shown extending along a first direction (e.g., lateral direction in FIG. 41A). In some embodiments, the strip structures F1 and F2 are semiconductor fins and include a suitable semiconductor material. In some other embodiments, the strip structures F1 and F2 are a dielectric material, such as the dielectric strips 120a, 120b as described in FIGS. 1A to 1D. At least one gate structure 130 extends along a second direction perpendicular to the first direction and disposed over the strip structures F1 and F2.

Isolation structures 110 are disposed adjacent to the strip structures F1 and F2, in which at least one of the isolation structures 110 is between the strip structures F1 and F2. A backside via 115 is disposed in the isolation structure 110 between the strip structures F1 and F2, as shown in FIG. 41B. An epitaxy structure 150a and an epitaxy structure 150b are disposed respectively over the strip structures F1 and F2. Source/drain contacts 185a and 185b are disposed over and are electrically connected to the epitaxy structures 150a and 150b, respectively. Conductive vias 190a and 190b are disposed over and are electrically connected to the source/drain contacts 185a and 185b, respectively. Metal lines 195a and 195b are disposed over and are in contact with the conductive vias 190a and 190b, respectively, in which the metal lines 195a and 195b are similar to the metal lines 195 discussed in FIGS. 1A to 1D. A metal line 210 is disposed on backsides of the strip structures F1 and F2 and is electrically connected to the backside via 115. In FIG. 41A, there is shown a conductive via VB electrically connected to the backside via 115. The conductive via VB is referred to as the portion of the source/drain contact 185a that is embedded in the isolation structure 110, as shown in FIG. 41B.

In some embodiments of FIG. 41A, the metal line 195a vertically overlaps the backside via 115. In some embodiments, along a lengthwise direction of the gate structure 130 (see FIG. 41A), the entire metal line 195a vertically overlaps the backside via 115. On the other hand, the metal line 195b does not vertically overlap the backside via 115.

FIGS. 42A and 42B are views of an integrated circuit in accordance with some embodiments of the present disclosure. FIG. 42A is a top view of an integrated circuit 100d in accordance with some embodiments of the present disclosure, and FIG. 42B is a cross-sectional view along line B-B of FIG. 42A. Some elements of FIGS. 42A and 42B are similar to those described in FIGS. 41A and 41B, and such elements are labeled the same and relevant details will not be repeated for brevity.

FIGS. 42A and 42B are different from FIGS. 41A and 41B, in that metal lines 195c and 195d are disposed over and are in contact with the conductive vias 190a and 190b, respectively. Along a lengthwise direction of the gate structure 130 (see FIG. 42A), a space SP is between the metal lines 195c and 195d and vertically overlaps the backside via 115. In some embodiments, along the lengthwise direction of the gate structure 130 (see FIG. 42A), the entire space SP vertically overlaps the backside via 115. On the other hand, the metal lines 195c and 195d only partially overlap the backside via 115.

Figure 43A:
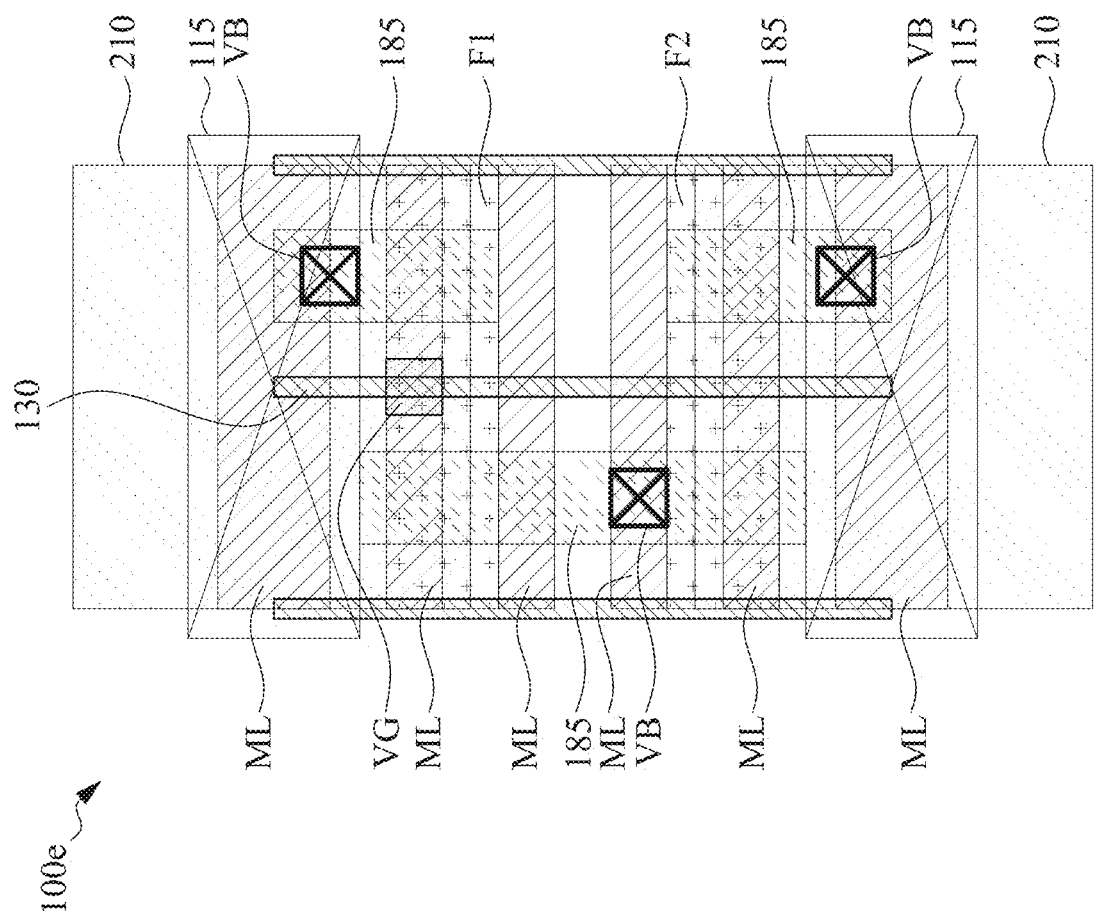
FIGS. 43A to 43C are top views of integrated circuits in accordance with some embodiments of the present disclosure.
Figure 43B:
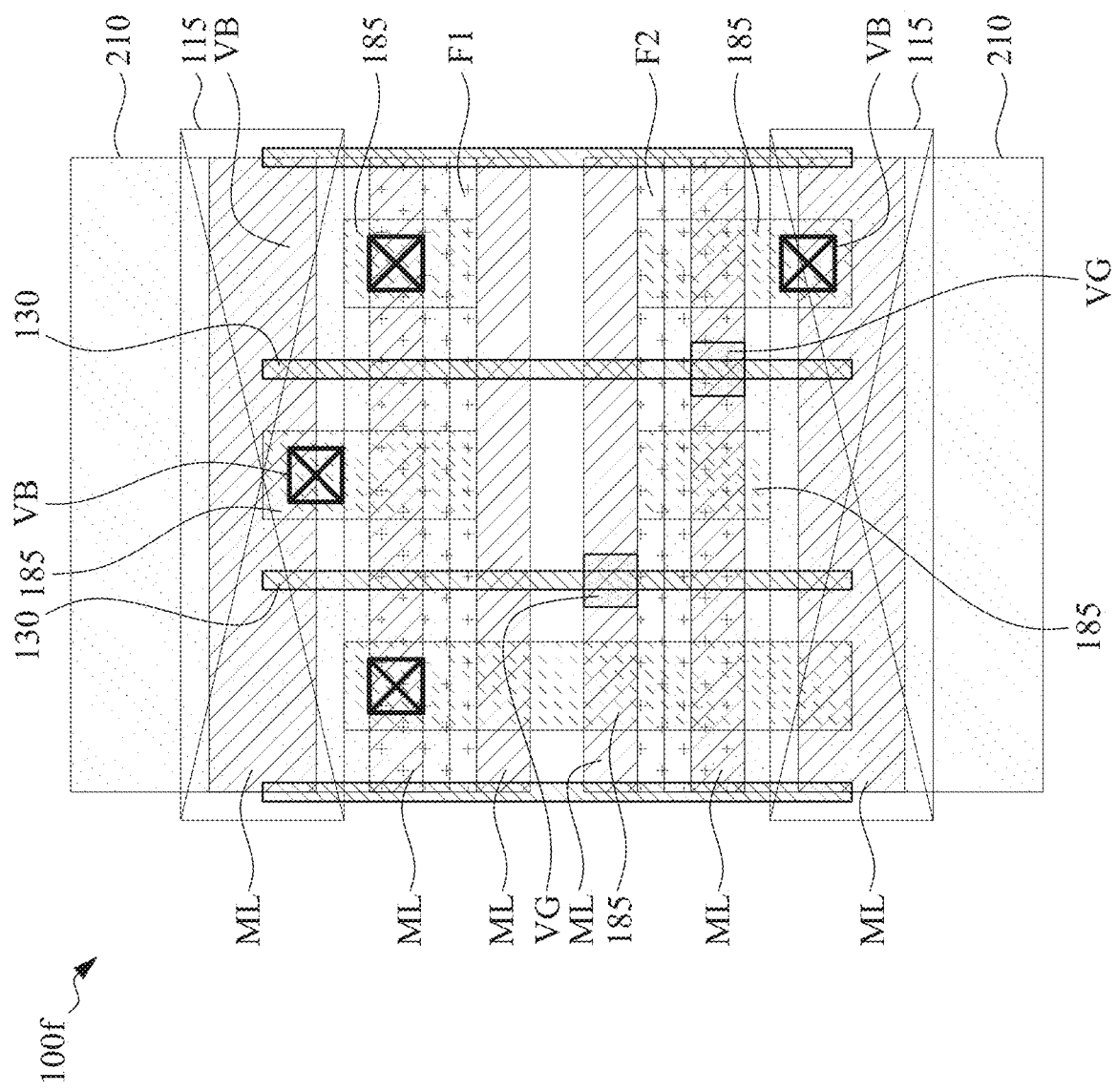
Figure 43C:
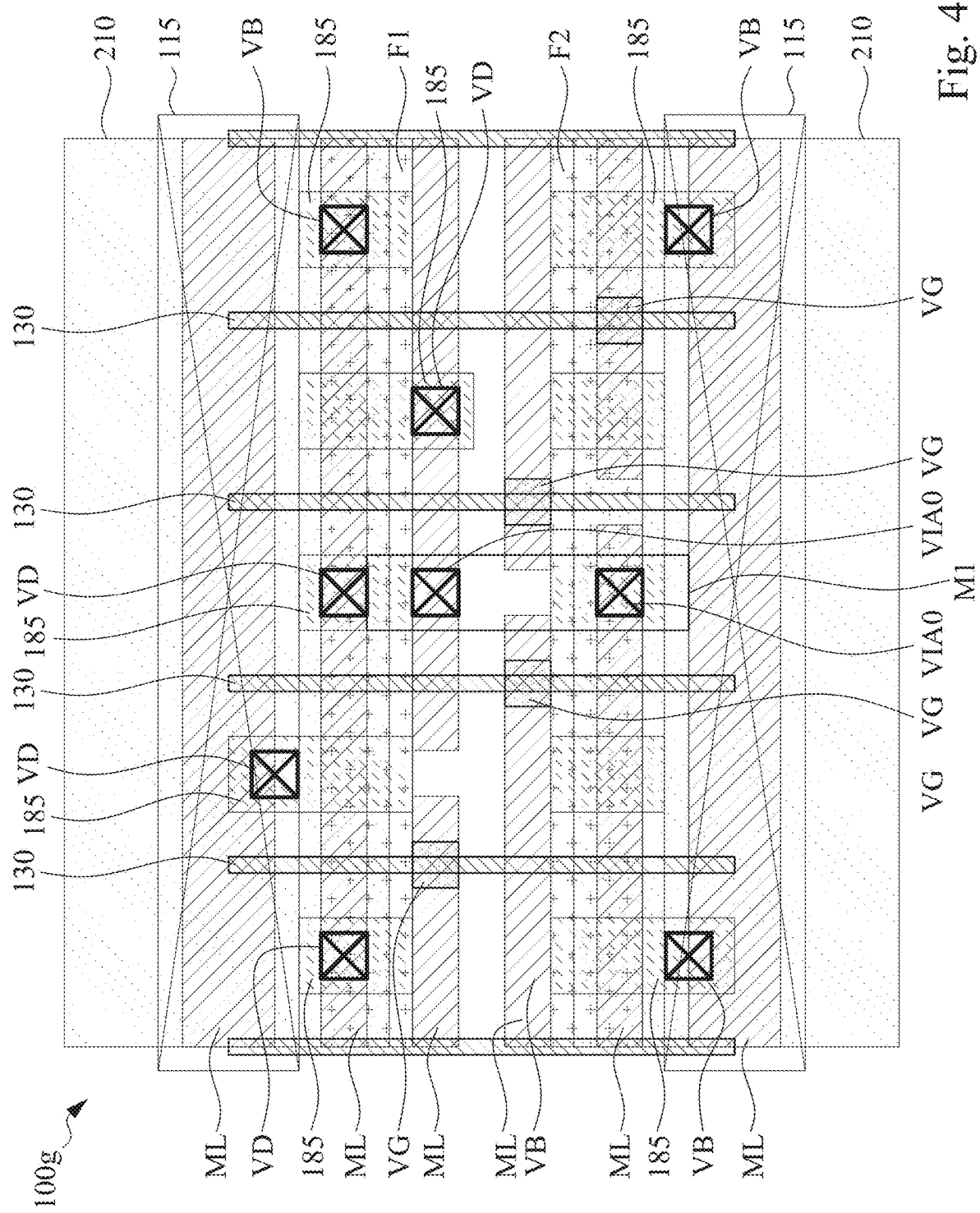

FIGS. 43A to 43C are views of integrated circuits in accordance with some embodiments of the present disclosure. FIGS. 43A, 43B, and 43C include integrated circuits 100e, 100f, and 100g, respectively. Some elements of FIGS. 43A, 43B, and 43C are similar to those described above, and thus relevant details will not be repeated.

The integrated circuits 100e, 100f, and 100g include strip structures F1 and F2. Gate structures 130 are disposed over the strip structures F1 and F2. Backside vias 115 are adjacent to the strip structures F1 and F2. Metal lines 210 are disposed on backsides of the strip structures F1 and F2, and are electrically connected to the backside vias 115, respectively. Source/drain contacts 185 are disposed over the strip structures F1 and F2. A plurality of conductive vias VB are over and electrically connected to the backside vias 115. In some embodiments, the conductive vias VB are portions of the source/drain contacts 185, as discussed above. A plurality of metal lines ML are disposed over the source/drain contacts 185 and the gate structures 130. Conductive vias VG are disposed between the gate structures 130 and the metal lines ML. Conductive vias VD are disposed between the source/drain contacts 185 and the metal lines ML. Moreover, the integrated circuit 100g of FIG. 43C further includes a metal line M1 over the metal lines ML, and further includes conductive vias VIA0 between the metal lines ML and the metal line M1.

The integrated circuits 100e, 100f, and 100g of FIGS. 43A, 43B, and 43C are similar to the integrated circuit 100c of FIGS. 41A and 41B. For example, portions of the metal lines ML vertically overlap the backside via 115. In some embodiments, each of the metal lines ML directly over the backside vias 115 entirely overlaps the corresponding backside via 115.

Figure 44B:
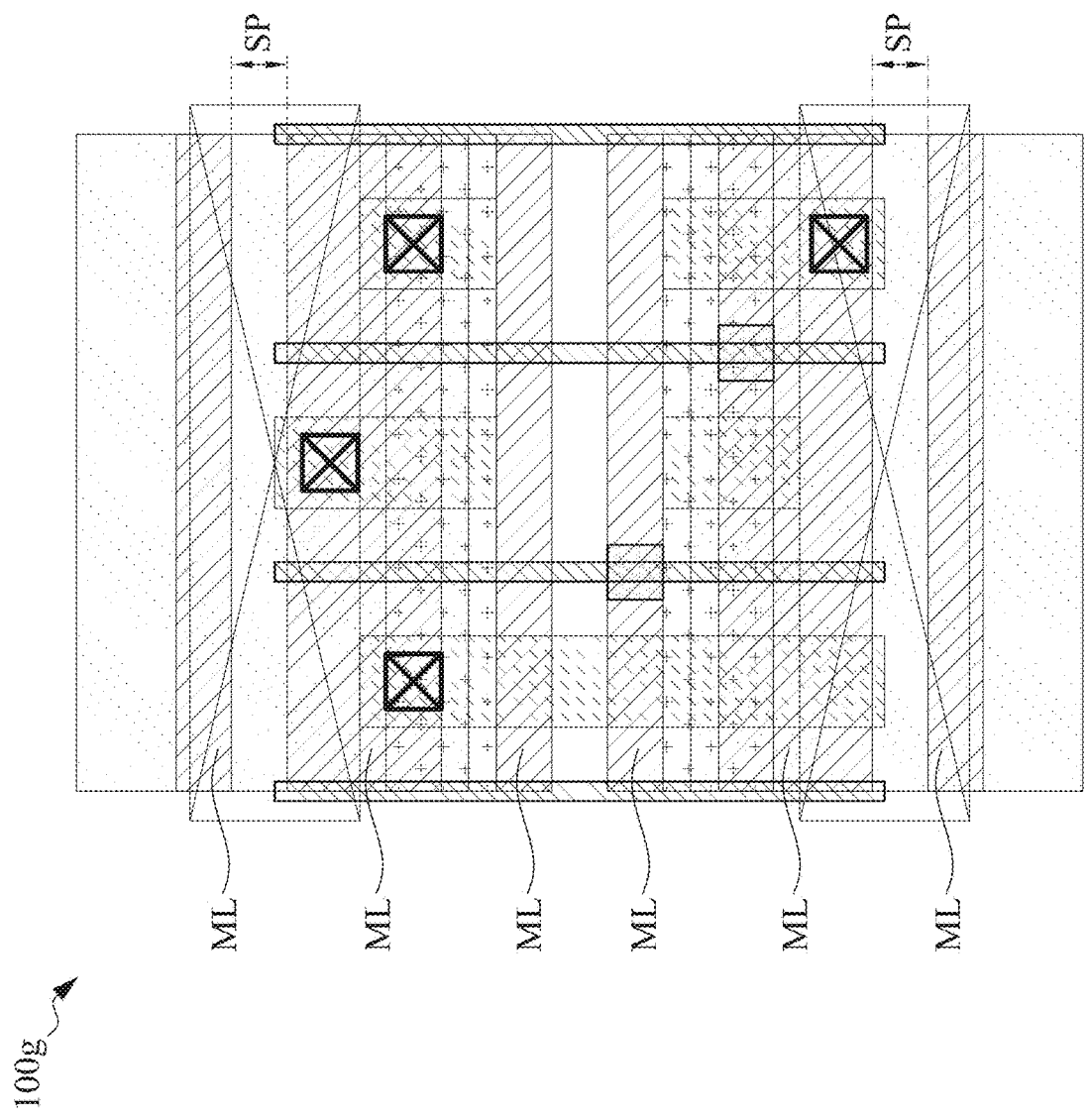
Figure 44C:
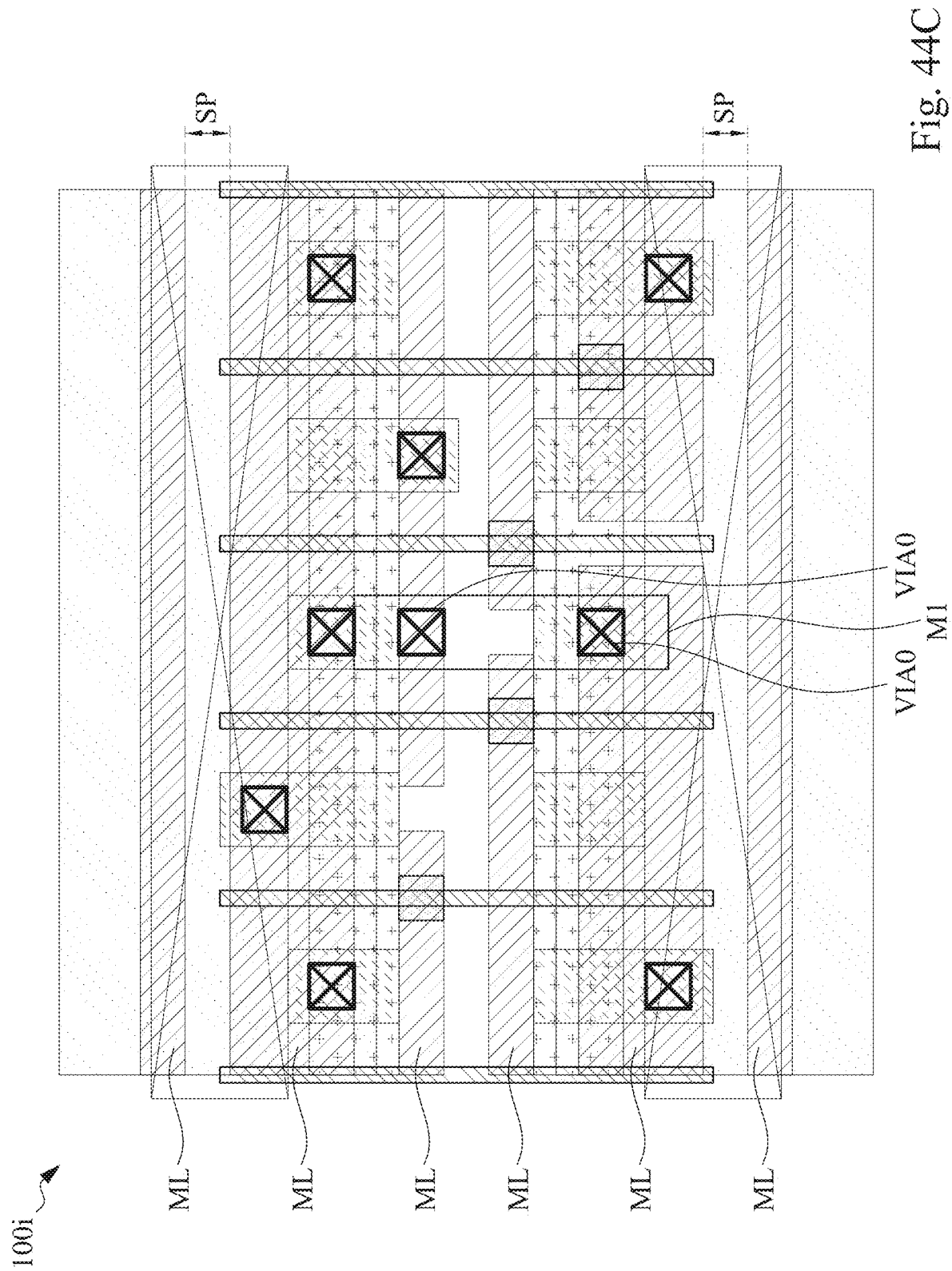

FIGS. 44A to 44C are views of integrated circuits in accordance with some embodiments of the present disclosure. FIGS. 44A, 44B, and 44C illustrate integrated circuits 100h, 100i, and 100j, respectively. Some elements of FIGS. 44A to 44C are similar to those described in FIGS. 43A to 43C above, and thus relevant details will not be repeated.

The integrated circuits 100h, 100i, and 100j of FIGS. 44A, 44B, and 44C are similar to the integrated circuit 100c of FIGS. 41A and 41B. For example, spaces SP between the metal lines ML vertically overlap the backside vias 115. In some embodiments, along the lengthwise direction of the gate structure 130, each of the spaces SP between the metal lines ML and directly over the backside vias 115 entirely overlaps the corresponding backside via 115. On the other hand, the metal lines ML only partially overlap the backside vias 115.

Figure 45B:
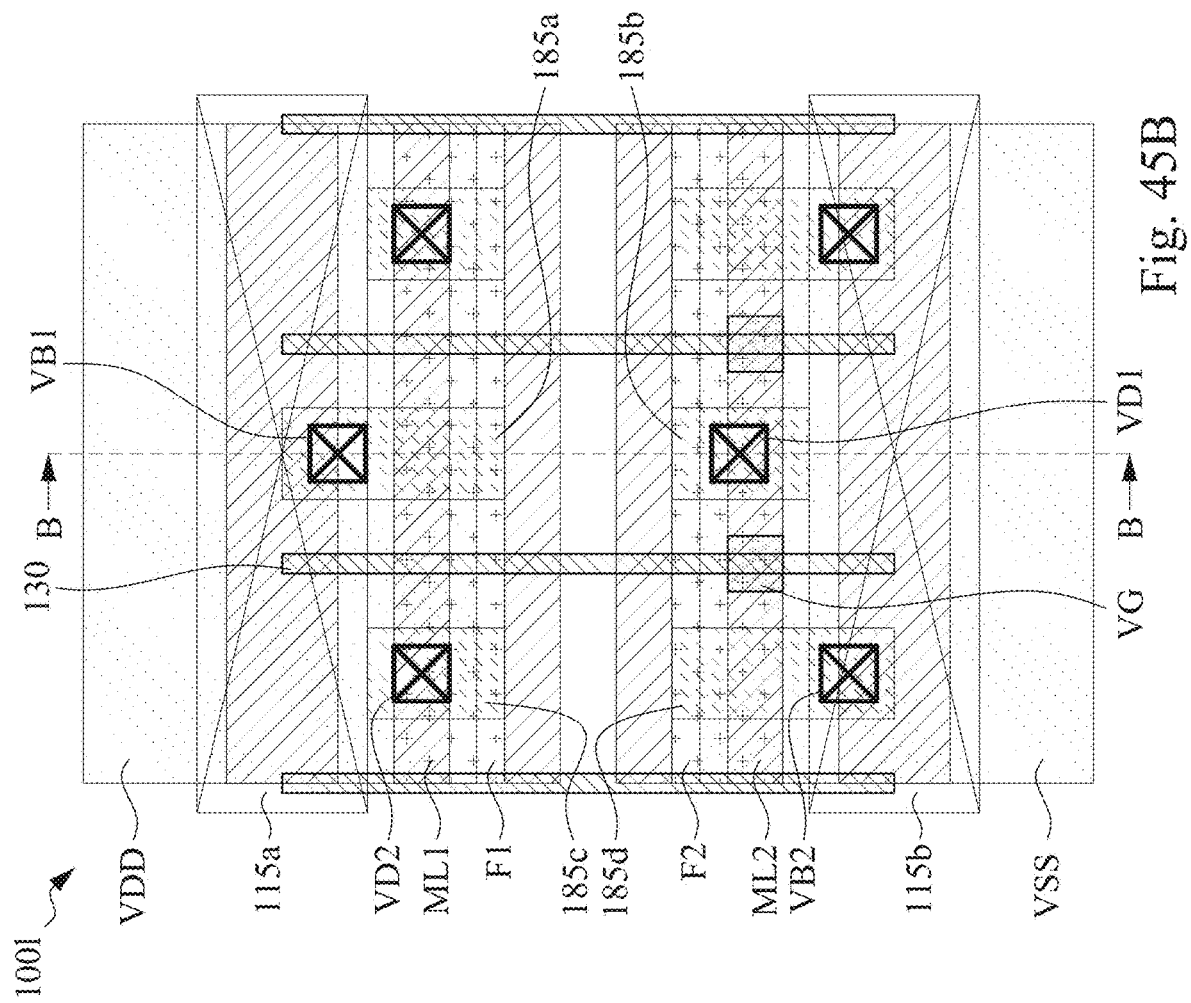
FIG. 45B is a top view and FIG. 45C is a cross-sectional view of an integrated circuit in accordance with some embodiments of the present disclosure.
Figure 45A:
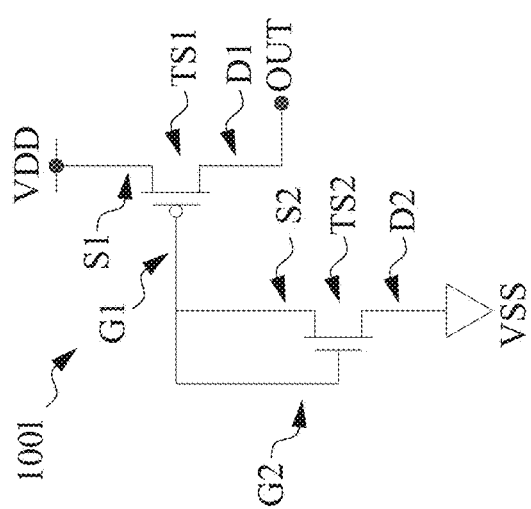
FIG. 45A is a schematic view.
Figure 45C:
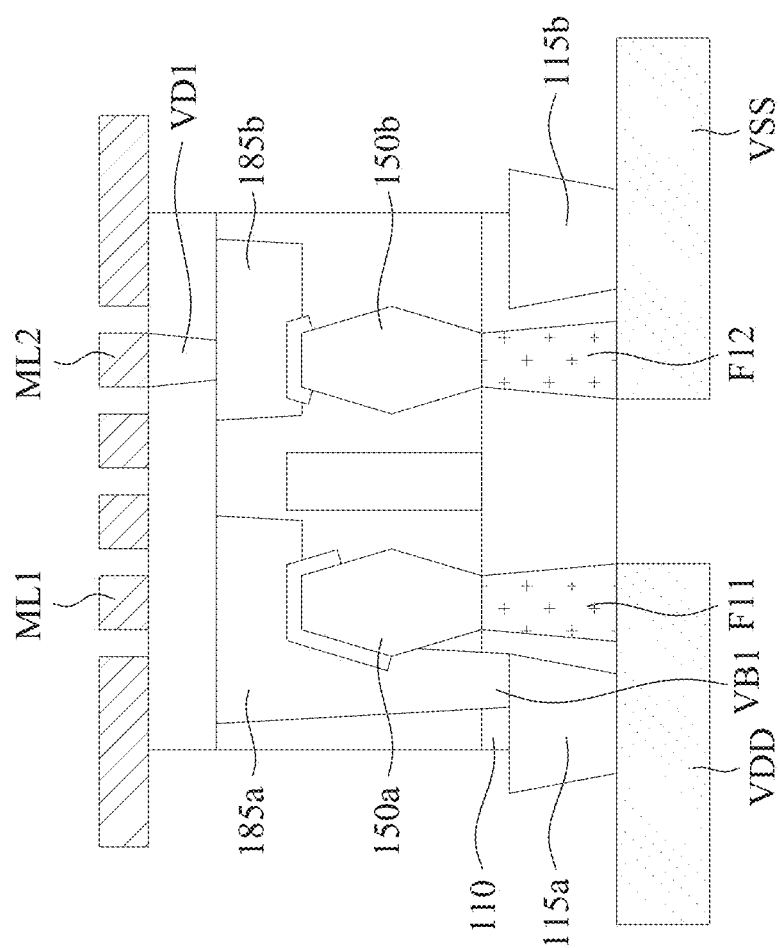

FIGS. 45A to 45C are views of an integrated circuit in accordance with some embodiments of the present disclosure, in which FIG. 45A is an equivalent circuit diagram of the integrated circuit, FIG. 45B is a top view of the integrated circuit, and FIG. 45C is a cross-sectional view along line B-B of FIG. 45B. Some elements of FIGS. 45A to 45C are similar to those described in FIGS. 1A to 1D, and such elements are labeled the same and relevant details will not be repeated for brevity.

An integrated circuit 1001 is shown. The integrated circuit 1001 includes a transistor TS1 and a transistor TS2. In some embodiments, the transistor TS1 is a p-type transistor, such as a PMOS, and the transistor TS2 is an n-type transistor, such as an NMOS. In some embodiments, the transistor TS1 includes a source S1, a drain D1, and a gate G1. Moreover, the transistor TS2 includes a source S2, a drain D2, and a gate G2. As shown in FIG. 45A, the source S1 of the transistor TS1 is electrically connected to a power line VDD, and the source S2 of the transistor TS2 is electrically connected to a power line VSS. The drain D1 of the transistor TS1 is electrically connected to an output terminal OUT. The gate G1 of the transistor TS1, the drain D2 of the transistor TS2, and the gate G2 of the transistor TS2 are electrically connected to each other. In some embodiments, when in operation of the integrated circuit 1001, a high level voltage (e.g., a positive voltage) is applied to the power line VDD, and a low level voltage (e.g., a ground voltage or a negative voltage) is applied to the power line VSS. In some embodiments where a ground voltage is applied to the power line VSS, the power line VSS is labeled as GND.

In FIGS. 45B and 45C, the integrated circuit 1001 includes strip structures F1 and F2 extending along a first direction (e.g., lateral direction in FIG. 45B). In some embodiments, the strip structures F1 and F2 include semiconductor fins, and include a suitable semiconductor material. In some other embodiments, the strip structures F1 and F2 include the dielectric strips 120a, 120b, as described in FIGS. 1A to 1D. At least one gate structure 130 extends along a second direction perpendicular to the first direction and disposed over the strip structures F1 and F2. In some embodiments, source/drain regions are formed on the strip structures F1 and F2 and on opposite sides of the gate structure 130 to form transistors TS1 and TS2 as described in FIG. 45A. For example, portions of the gate structure 130 over the strip structure F1 and the source/drain regions over the strip structure F1 form the transistor TS1 of FIG. 45A. On the other hand, portions of the gate structure 130 over the strip structure F2 and the source/drain regions over the strip structure F2 form the transistor TS2 of FIG. 45A. In some embodiments, the source/drain regions are epitaxy structures, such as epitaxy structures 150a, 150b as shown in FIG. 45C.

The integrated circuit 1001 includes isolation structures 110 adjacent to the strip structures F1 and F2, and backside vias 115a and 115b in the isolation structures 110. In some embodiments, the backside via 115a is adjacent to the strip structure F1, and the backside via 115b is adjacent to the strip structure F2.

The integrated circuit 1001 includes a power line VDD and a power line VSS disposed on backsides of the strip structures F1 and F2. In some embodiments, the power line VDD is electrically connected to and is in contact with the backside vias 115a, and the power line VSS is electrically connected to and is in contact with the backside vias 115b.

The integrated circuit 1001 further includes source/drain contacts 185a, 185b, 185c, and 185d. In some embodiments, the source/drain contacts 185a and 185c are disposed over the strip structure F1 and on opposite sides of the gate structure 130, in which the source/drain contact 185a is electrically connected to a source region over the strip structure F1, and the source/drain contact 185c is electrically connected to a drain region over the strip structure F1. On the other hand, the source/drain contacts 185b and 185d are disposed over the strip structure F2 and on opposite sides of the gate structure 130, in which the source/drain contact 185b is electrically connected to a drain region over the strip structure F2, and the source/drain contact 185d is electrically connected to a source region over the strip structure F2. As an example, in the cross-section of FIG. 45C, the source/drain contact 185a is electrically connected to the epitaxy structure 150a, and the source/drain contact 185b is electrically connected to the epitaxy structure 150b.

The integrated circuit 1001 further includes conductive vias VB1 and VB2. The conductive vias VB1 and VB2 are electrically connected to the backside vias 115a and 115b, respectively. For example, as shown in FIG. 45C, the portion of the source/drain contact 185a embedded in the isolation structure 110 is referred to as the conductive via VB1, in which the conductive via VB1 is in contact with the top surface of the backside via 115a. As a result, the source/drain contact 185a is therefore electrically connected to the power line VDD. Similarly, the source/drain contact 185d is electrically connected to the power line VSS through the conductive via VB2.

The integrated circuit 1001 further includes conductive vias VD1, VD2, and VG. The conductive vias VD1 and VD2 are over and are electrically connected to the source/drain contacts 185b and 185c, respectively. The conductive via VG is over and is electrically connected to the gate structure 130.

The integrated circuit 1001 further includes metal lines ML1 and ML2. The metal line ML1 is over and is electrically connected to the conductive via VD2. The metal line ML2 is over and is electrically connected to the conductive vias VD1 and VG. In some embodiments, the metal line ML1 acts as the output terminal OUT as discussed in FIG. 45A.

Figure 46C:
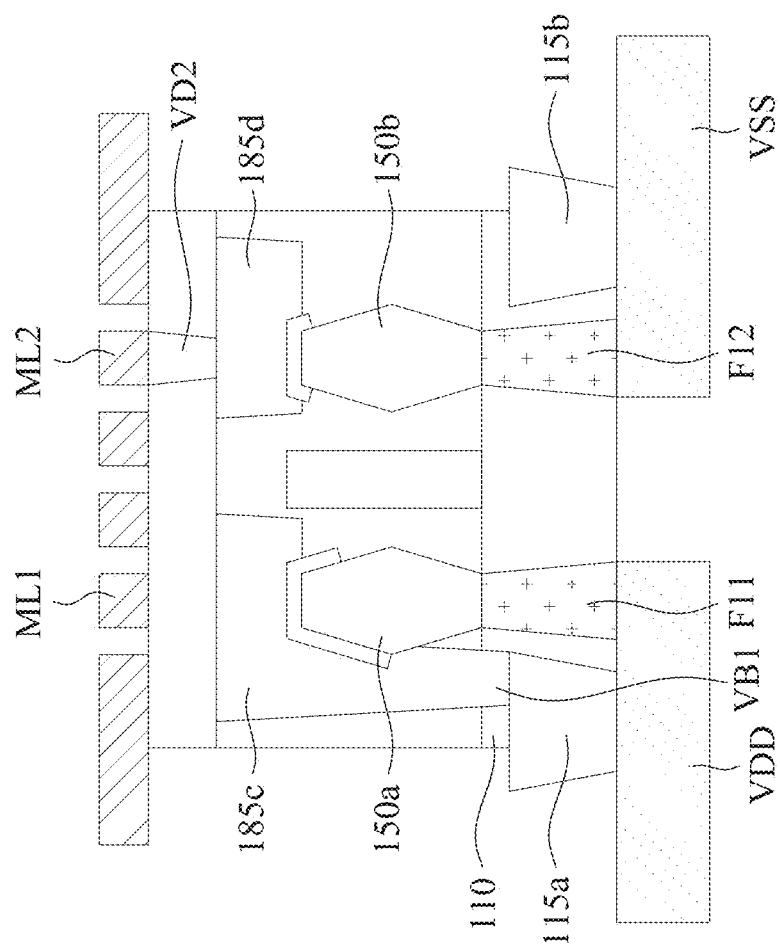

FIGS. 46A to 46C are views of an integrated circuit in accordance with some embodiments of the present disclosure, in which FIG. 46A is an equivalent circuit diagram of the integrated circuit, FIG. 46B is a top view of the integrated circuit, and FIG. 46C is a cross-sectional view along line B-B of FIG. 46B. Some elements of FIGS. 46A to 46C are similar to those described in FIGS. 1A to 1D and 45A to 45C, and such elements are labeled the same and relevant details will not be repeated for brevity.

An integrated circuit 100m is shown. The integrated circuit 100m includes a transistor TS1 and a transistor TS2. In some embodiments, the transistor TS1 is a p-type transistor, such as a PMOS, and the transistor TS2 is an n-type transistor, such as an NMOS. In some embodiments, the transistor TS1 includes a source S1, a drain D1, and a gate G1. Moreover, the transistor TS2 includes a source S2, a drain D2, and a gate G2. As shown in FIG. 46A, the source S1 of the transistor TS1 is electrically connected to a power line VDD, and the source S2 of the transistor TS2 is electrically connected to a power line VSS. The drain D2 of the transistor TS2 is electrically connected to an output terminal OUT. The gate G1 of the transistor TS1, the drain D1 of the transistor TS1, and the gate G2 of the transistor TS2 are electrically connected to each other. In some embodiments, when in operation of the integrated circuit 100m, a high level voltage (e.g., positive voltage) is applied to the power line VDD, and a low level voltage (e.g., ground voltage or negative voltage) is applied to the power line VSS. In some embodiments where a ground voltage is applied to the power line VSS, the power line VSS is labeled as GND.

In FIGS. 46B and 46C, the integrated circuit 100m includes strip structures F1 and F2. At least one gate structure 130 is disposed over the strip structures F1 and F2. In some embodiments, source/drain regions are formed on the strip structures F1 and F2 and on opposite sides of the gate structure 130 to form transistor TS1 and TS2 as described in FIG. 45A. For example, portions of the gate structure 130 over the strip structure F1 and the source/drain regions over the strip structure F1 form the transistor TS1 of FIG. 46A. On the other hand, portions of the gate structure 130 over the strip structure F2 and the source/drain regions over the strip structure F2 form the transistor TS2 of FIG. 46A. In some embodiments, the source/drain regions are epitaxy structures, such as epitaxy structures 150a, 150b as shown in FIG. 46C.

The integrated circuit 100m further includes conductive vias VB1 and VB2. The conductive vias VB1 and VB2 are electrically connected to the backside vias 115a and 115b, respectively. For example, as shown in FIG. 46C, the portion of the source/drain contact 185c embedded in the isolation structure 110 is referred to as the conductive via VB1, in which the conductive via VB1 is in contact with the top surface of the backside via 115a. As a result, the source/drain contact 185c is therefore electrically connected to the power line VDD. Similarly, the source/drain contact 185b is electrically connected to the power line VSS through the conductive via VB2.

The integrated circuit 100m further includes conductive vias VD1, VD2, and VG. The conductive vias VD1 and VD2 are over and are electrically connected to the source/drain contacts 185a and 185d, respectively. The conductive via VG is over and is electrically connected to the gate structure 130.

The integrated circuit 100m further includes metal lines ML1 and ML2. The metal line ML1 is over and is electrically connected to the conductive vias VD1 and VG. The metal line ML2 is over and is electrically connected to the conductive via VD2. In some embodiments, the metal line ML2 acts as the output terminal OUT as discussed in FIG. 46A.

Figure 47A:
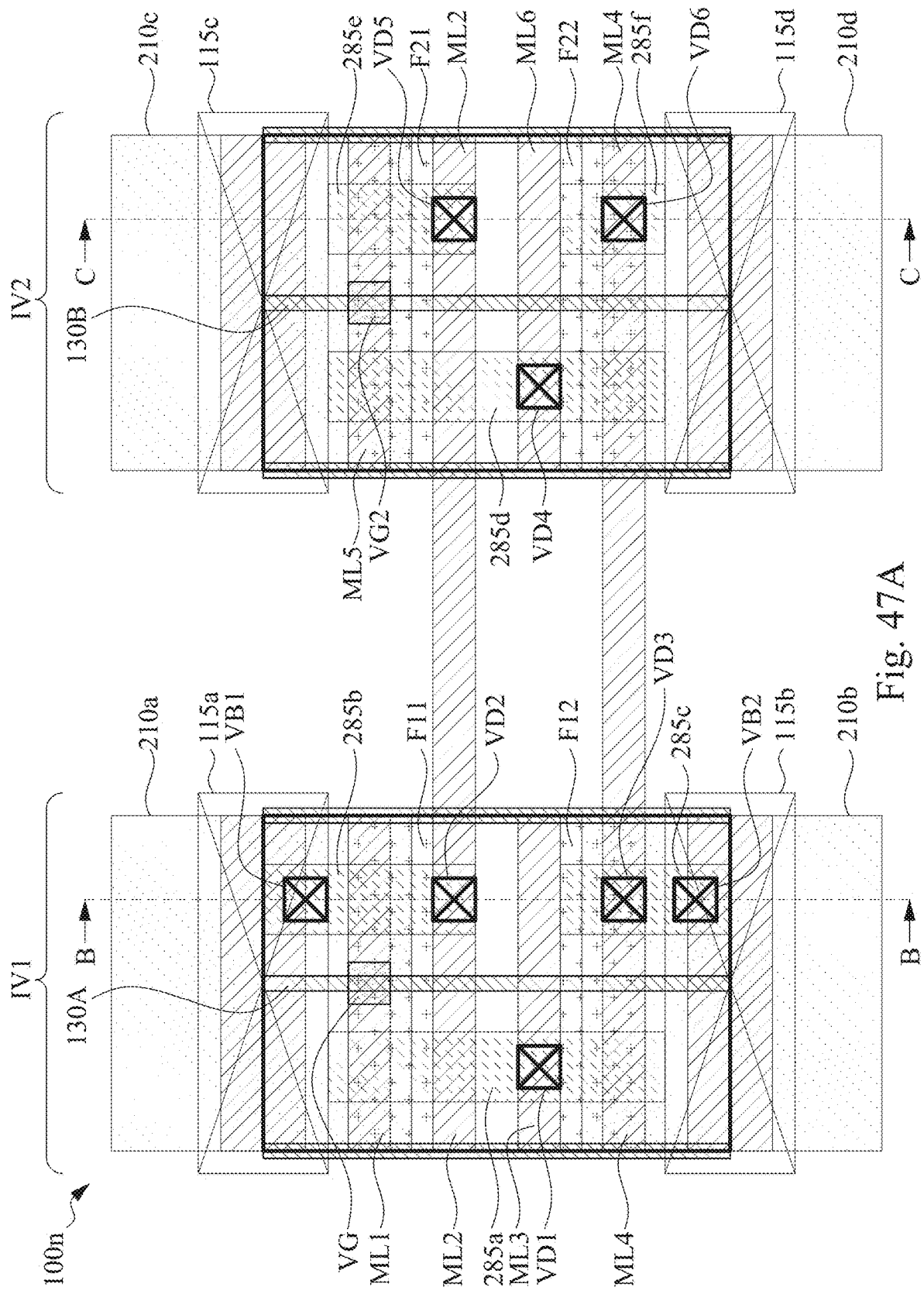
FIG. 47A is a top view and FIGS. 47B and 47C are cross-sectional views of an integrated circuit in accordance with some embodiments of the present disclosure.
Figure 47B:
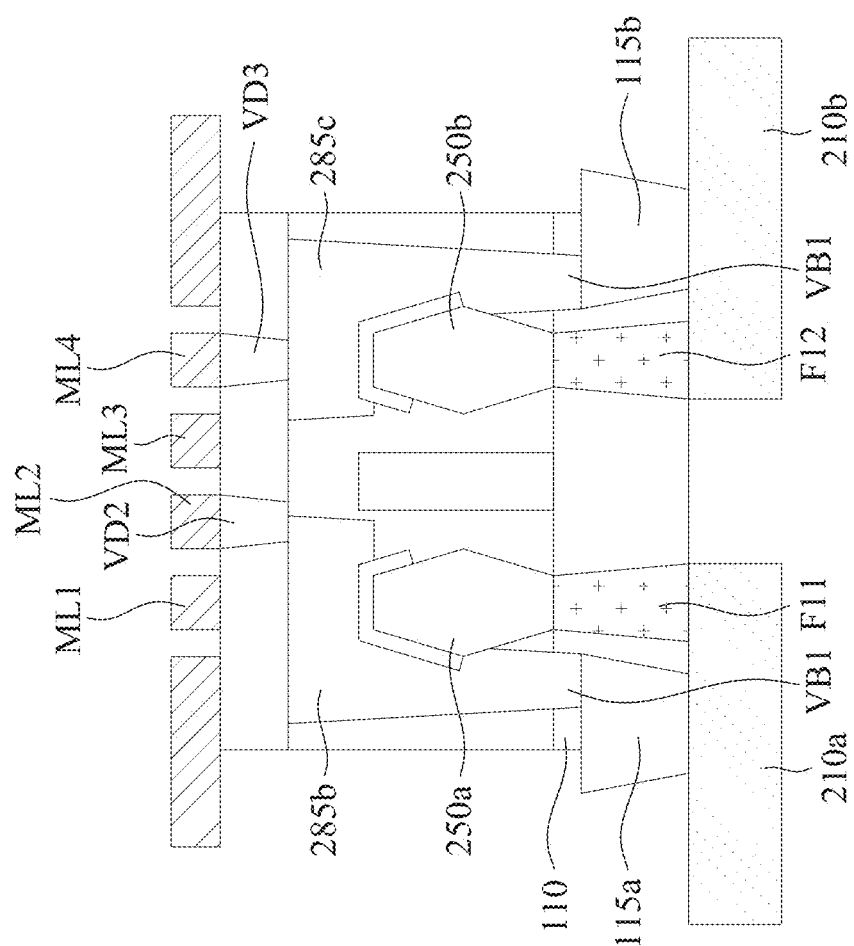
Figure 47C:
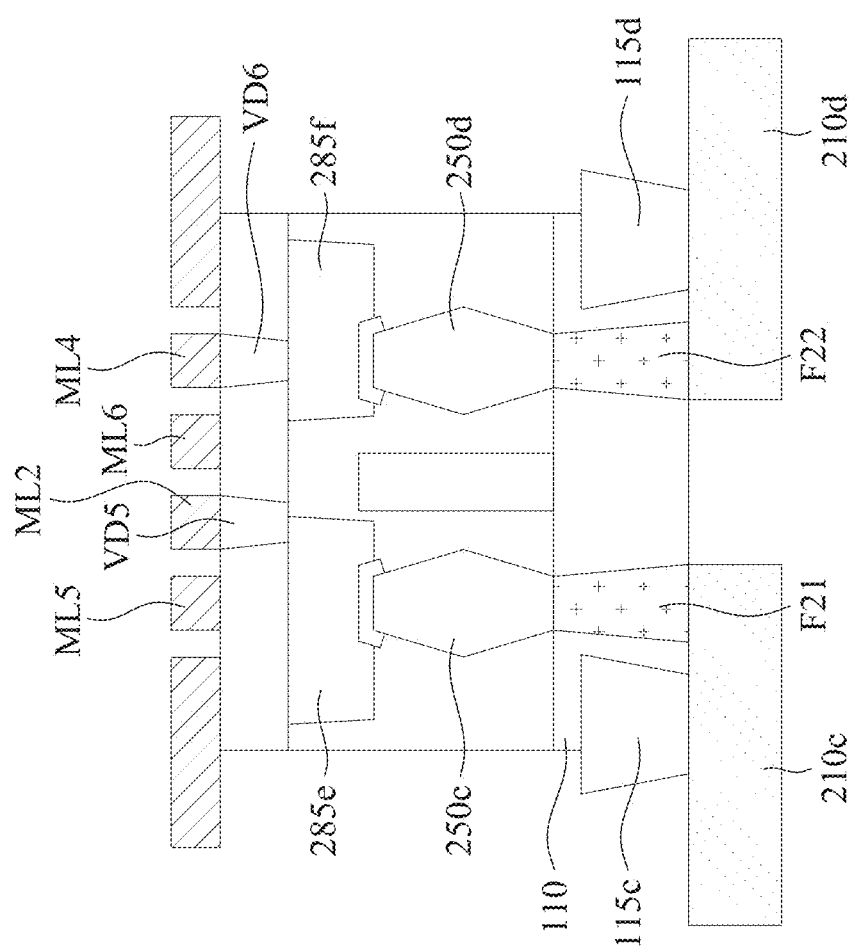

FIGS. 47A to 47C are views of an integrated circuit in accordance with some embodiments of the present disclosure, in which FIG. 47A is a top view of an integrated circuit, and FIG. 47B is a cross-sectional view along line B-B of FIG. 47A, and FIG. 47A is a cross-sectional view along line C-C of FIG. 47A. An integrated circuit 100m is shown. Some elements of FIGS. 47B and 47C are not shown in FIG. 47A for simplicity. The integrated circuit 100m includes a first inverter IV1 and a second inverter IV2, in which FIG. 47B is a cross-sectional view cut along the first inverter IV1, and FIG. 47C is a cross-sectional view cut along the second inverter IV2.

With respect to the first inverter IV1, the first inverter IV1 includes strip structures F11 and F12, and at least one gate structure 130A is disposed over the strip structures F11 and F12. Isolation structures 110 are disposed adjacent to the strip structures F11 and F12 (see FIG. 47B). Backside vias 115a and 115b are disposed in the isolation structures 110, in which the backside via 115a is disposed close to the strip structure F11, and the backside via 115b is disposed close to the strip structure F12. Metal lines 210a and 210b are disposed on backsides of the strip structures F11 and F12, in which the metal line 210a is in contact with the backside via 115a, and the metal line 210b is in contact with the backside via 115b. In some embodiments, the metal lines 210a and 210b act as power rails of the inverter IV1. For example, the metal line 210a is a power rail VDD, and the metal line 210b is a power rail VSS. When in operation of the first inverter IV1, a high level voltage (e.g., positive voltage) is applied to the power line VDD, and a low level voltage (e.g., ground voltage or negative voltage) is applied to the power line VSS.

Epitaxy structures are formed over the strip structures F11 and F12. For example, in FIG. 47B, the epitaxy structure 250a is disposed on the strip structure F11, and the epitaxy structure 250b is disposed on the strip structure F12. Source/drain contacts 285a, 285b, and 285c are formed over the strip structures F11 and F12. For example, in FIG. 47B, the source/drain contact 285b is disposed over the epitaxy structure 250a, and the source/drain contact 285c is disposed over the epitaxy structure 250b. In some embodiments, the source/drain contacts 285b and 285c extend into the isolation structures 110 to the backside vias 115a and 115b, respectively. For example, in FIG. 47B, the source/drain contact 285b extends into the isolation structures 110 and contacts the backside via 115a, and the source/drain contact 285c extends into the isolation structures 110 and contacts the backside via 115b. The portion of the source/drain contact 285b embedded in the isolation structures 110 is regarded as a conductive via VB1, and the portion of the source/drain contact 285c embedded in the isolation structures 110 is regarded as a conductive via VB2. Accordingly, the metal lines 210a and 210b (or power rails 210a and 210b) are electrically connected to the source/drain regions (e.g., the epitaxy structures 250a and 250b) formed on the backsides of the strip structures F11 and F12.

Metal lines ML1, ML2, ML3, and ML4 are disposed over the source/drain contacts 285a, 285b, 285c. A conductive via VG1 is disposed between the gate structure 130A and the metal line ML1, a conductive via VD1 is disposed between the source/drain contact 285a and the metal line ML3, a conductive via VD2 is disposed between the source/drain contact 285b and the metal line ML2, and a conductive via VD3 is disposed between the source/drain contact 285c and the metal line ML4.

With respect to the second inverter IV2, the second inverter IV2 includes strip structures F21 and F22, and at least one gate structure 130b is disposed over the strip structures F21 and F22. Isolation structures 110 are disposed adjacent to the strip structures F21 and F22 (see FIG. 47C). Backside vias 115c and 115d are disposed in the isolation structures 110, in which the backside via 115c is disposed close to the strip structure F21, and the backside via 115d is disposed close to the strip structure F22. Metal lines 210c and 210d are disposed on backsides of the strip structures F21 and F22, in which the metal line 210c is in contact with the backside via 115c, and the metal line 210d is in contact with the backside via 115d.

Epitaxy structures are formed over the strip structures F21 and F22. For example, in FIG. 47C, the epitaxy structure 250c is disposed on the strip structure F21, and the epitaxy structure 250d is disposed on the strip structure F22. Source/drain contacts 285d, 285e, and 285f are formed over the strip structures F21 and F22. For example, in FIG. 47C, source/drain contact 285e is disposed over the epitaxy structure 250C, and the source/drain contact 285f is disposed over the epitaxy structure 250d.

Metal lines ML2, ML4, ML5, and ML6 are disposed over the source/drain contacts 285d, 285e, 285f. The metal lines ML2 and ML4 extend from above the first inverter IV1 to above the second inverter IV2. That is, the first inverter IV1 and the second inverter IV2 share the metal lines ML2 and ML4. A conductive via VG2 is disposed between the gate structure 130b and the metal line ML5, a conductive via VD4 is disposed between the source/drain contact 285d and the metal line ML6, a conductive via VD5 is disposed between the source/drain contact 285e and the metal line ML2, and a conductive via VD6 is disposed between the source/drain contact 285f and the metal line ML4.

The second inverter IV2 is different from the first inverter IV1, in that the source/drain contacts 285e and 285c of the second inverter IV2 do not have a portion extending into the isolation structures 110 to touch the backside vias 115c and 115d. However, as discussed above, the metal line 210a underlying the first inverter IV1 is electrically connected to the metal line ML2 through the backside via 115a, the source/drain contact 285b, and the conductive via VD2. Because the metal line ML2 also extends above the second inverter IV2, and is further electrically connected to the epitaxy structure 250c through the source/drain contact 285e and the conductive via VD5, the metal line 210a is therefore electrically connected to the epitaxy structure 250c, and acts as a power rail (e.g., VDD) of the second inverter IV2. Similarly, the metal line 210b underlying the first inverter IV1 is electrically connected to the epitaxy structure 250d through the metal line ML4, and acts as a power rail (e.g., VSS) of the second inverter IV2. That is, the second inverter IV2 does not use the source/drain contacts (e.g., source/ drain contacts 285e and 285f in FIG. 47C) to connect the metal lines 210c and 210d directly underlying the second inverter IV2.

Based on the above discussion, the present disclosure offers advantages. One of ordinary skill in the art, however, that other embodiments offer additional advantages, and not all advantages are necessarily disclosed herein, and further that no particular advantage is required for all embodiments. One advantage is that a backside via is formed in an STI structure, and the source/drain contact 185 has a portion extending into the STI structure and touching the backside via, such that the metal line at the back side of the device is electrically connected to the metal lines at the front side of the device. That is, a conductive path between the metal line at the back side and the metal lines at the front side is able to bypass the epitaxy structure with higher resistance, and the resistance between the metal line at the back side and the metal lines at the front side is able to be reduced. This will further improve the device performance and provide routing flexibility.

An aspect of this description relates to an integrated circuit. The integrated circuit includes a strip structure having a front side and a back side. The integrated circuit includes a gate structure on the front side of the strip structure. The integrated circuit includes an isolation structure surrounding the strip structure. The integrated circuit includes a backside via in the isolation structure. The integrated circuit includes a contact over the strip structure, wherein a first portion of the contact extends into the isolation structure and contacts the backside via. The integrated circuit includes a backside power rail on the back side of the strip structure and in contact with the backside via. In some embodiments, the strip structure comprises a dielectric material. In some embodiments, the gate structure comprises a gate all around (GAA) structure. In some embodiments, a bottommost surface of the gate structure is below a topmost surface of the strip structure. In some embodiments, the integrated circuit further includes an epitaxial structure over the strip structure. In some embodiments, the contact is electrically connected to the epitaxial structure. In some embodiments, the contact physically contacts multiple sidewalls of the epitaxial structure. In some embodiments, the integrated circuit further includes a second contact on the front side of the strip structure; and an epitaxial structure on the first side of the strip structure, wherein the second contact is electrically connected to the epitaxial structure. In some embodiments, the integrated circuit further includes a dielectric layer, wherein the epitaxial structure directly contacts the dielectric layer. In some embodiments, the epitaxial structure is between the second contact and the dielectric layer in a direction parallel to a top surface of the strip structure.

An aspect of this description relates to an integrated circuit. The integrated circuit includes a first strip structure. The integrated circuit includes an isolation structure adjacent to the first strip structure. The integrated circuit includes a backside via in the isolation structure. The integrated circuit includes a first epitaxy structure over the first strip structure. The integrated circuit includes a first contact over the first epitaxy structure, wherein a first portion of the first contact extends along a sidewall of the first epitaxy structure. In some embodiments, the integrated circuit further includes a second strip structure, wherein the backside via is between the first strip structure and the second strip structure. In some embodiments, the integrated circuit further includes a second epitaxy structure over the second strip structure; and a second contact over the second epitaxy structure, wherein the second contact extends along a sidewall of the second epitaxy structure. In some embodiments, the first contact electrically connects to the backside via, and the second contact is electrically separated from the backside via. In some embodiments, the integrated circuit further includes a dummy fin between the first epitaxy structure and the second epitaxy structure. In some embodiments, a bottommost surface of the first contact structure is below a bottommost surface of the first epitaxy structure.

An aspect of this description relates to a method. The method includes patterning a substrate to define a semiconductor strip over the substrate. The method includes forming a backside via adjacent to the semiconductor strip. The method includes depositing a dielectric material over the conductive material and the dielectric liner. The method includes etching the dielectric material and the dielectric liner to define an isolation structure having a top surface lower than a top surface of the semiconductor strip. The method includes forming a source/drain structure over the semiconductor strip. The method includes forming an interlayer dielectric layer over the source/drain structure. The method includes etching the interlayer dielectric layer and the isolation structure to define an opening exposing the backside via. The method includes forming a source/drain contact in the opening. In some embodiments, etching the interlayer dielectric layer comprises defining the opening extending through the isolation structure. In some embodiments, forming the source/drain structure comprises epitaxially growing the source/drain structure. In some embodiments, the method includes removing the semiconductor strip to define a strip opening; and depositing a dielectric material into the strip opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a strip structure having a front side and a back side, wherein the strip structure comprises a dielectric material;
   a gate structure on the front side of the strip structure, wherein a bottommost surface of the gate structure is below a topmost surface of the strip structure;
   an isolation structure surrounding the strip structure;
   a backside via in the isolation structure;
   a contact over the strip structure, wherein a first portion of the contact extends into the isolation structure and contacts the backside via; and
   a backside power rail on the back side of the strip structure and in contact with the backside via.

2. The integrated circuit of claim 1, wherein the strip structure comprises a plurality of dielectric layers.

3. The integrated circuit of claim 1, wherein the gate structure comprises a gate all around (GAA) structure.

4. The integrated circuit of claim 1, wherein the bottommost surface of the gate structure is below the topmost surface of the strip structure.

5. The integrated circuit of claim 1, further comprising an epitaxial structure over the strip structure.

6. The integrated circuit of claim 5, wherein the contact is electrically connected to the epitaxial structure.

7. The integrated circuit of claim 5, wherein the contact physically contacts multiple sidewalls of the epitaxial structure.

8. The integrated circuit of claim 1, further comprising:
   a second contact on the front side of the strip structure; and
   an epitaxial structure on the first side of the strip structure, wherein the second contact is electrically connected to the epitaxial structure.

9. The integrated circuit of claim 8, further comprising a dielectric layer, wherein the epitaxial structure directly contacts the dielectric layer.

10. The integrated circuit of claim 9, wherein the epitaxial structure is between the second contact and the dielectric layer in a direction parallel to a top surface of the strip structure.

11. An integrated circuit, comprising:
    a first strip structure;
    an isolation structure adjacent to the first strip structure;
    a backside via in the isolation structure;
    a first epitaxy structure over the first strip structure; and
    a first contact over the first epitaxy structure, wherein a first portion of the first contact extends along an entirety of an outermost sidewall, in a direction parallel to a top surface of the isolation structure, of the first epitaxy structure.

12. The integrated circuit of claim 11, further comprising a second strip structure, wherein the backside via is between the first strip structure and the second strip structure.

13. The integrated circuit of claim 12, further comprising:
    a second epitaxy structure over the second strip structure; and
    a second contact over the second epitaxy structure, wherein the second contact extends along a sidewall of the second epitaxy structure.

14. The integrated circuit of claim 13, wherein the first contact electrically connects to the backside via, and the second contact is electrically separated from the backside via.

15. The integrated circuit of claim 13, further comprising a dummy fin between the first epitaxy structure and the second epitaxy structure.

16. The integrated circuit of claim 11, wherein a bottommost surface of the first contact structure is below a bottommost surface of the first epitaxy structure.

17. A method, comprising:
    patterning a substrate to define a semiconductor strip over the substrate;
    forming a backside via adjacent to the semiconductor strip;
    depositing a dielectric material over a conductive material and a dielectric liner;
    etching the dielectric material and the dielectric liner to define an isolation structure having a top surface lower than a top surface of the semiconductor strip;
    forming a source/drain structure over the semiconductor strip;
    forming an interlayer dielectric layer over the source/drain structure;
    etching the interlayer dielectric layer and the isolation structure to define an opening exposing the backside via; and
    forming a source/drain contact in the opening.

18. The method of claim 17, wherein etching the interlayer dielectric layer comprises defining the opening extending through the isolation structure.

19. The method of claim 17, wherein forming the source/drain structure comprises epitaxially growing the source/drain structure.

20. The method of claim 17, further comprising:
- removing the semiconductor strip to define a strip opening; and
- depositing a dielectric material into the strip opening.

* * * * *